United States Patent
Yamazaki

(10) Patent No.: US 9,882,062 B2
(45) Date of Patent: Jan. 30, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/922,862

(22) Filed: Oct. 26, 2015

(65) Prior Publication Data

US 2016/0049519 A1 Feb. 18, 2016

Related U.S. Application Data

(63) Continuation of application No. 14/296,837, filed on Jun. 5, 2014, now Pat. No. 9,349,752, which is a
(Continued)

(30) Foreign Application Priority Data

Jan. 12, 2011 (JP) ................. 2011-004423

(51) Int. Cl.
*H01L 29/786* (2006.01)
*H01L 27/32* (2006.01)
(Continued)

(52) U.S. Cl.
CPC ...... *H01L 29/78693* (2013.01); *H01L 27/124* (2013.01); *H01L 27/1214* (2013.01);
(Continued)

(58) Field of Classification Search
CPC ............. H01L 29/786; H01L 29/78687; H01L 29/7869; H01L 29/78693; H01L 29/78696
See application file for complete search history.

(56) References Cited

U.S. PATENT DOCUMENTS 3,520,051 A 7/1970 Topferm et al.
5,528,032 A 6/1996 Uchiyama
(Continued)

FOREIGN PATENT DOCUMENTS

EP 1737044 A 12/2006
EP 2144294 A 1/2010
(Continued)

OTHER PUBLICATIONS

Taiwanese Office Action (Application No. 101100293) Dated Jan. 25, 2016.
(Continued)

*Primary Examiner* — Eduardo A Rodela
(74) *Attorney, Agent, or Firm* — Robinson Intellectual Property Law Office; Eric J. Robinson

(57) ABSTRACT

A first oxide insulating film is formed over a substrate. After a first oxide semiconductor film is formed over the first oxide insulating film, heat treatment is performed, so that hydrogen contained in the first oxide semiconductor film is released and part of oxygen contained in the first oxide insulating film is diffused into the first oxide semiconductor film. Thus, a second oxide semiconductor film with reduced hydrogen concentration and reduced oxygen defect is formed. Then, the second oxide semiconductor film is selectively etched to form a third oxide semiconductor film, and a second oxide insulating film is formed. The second oxide insulating film is selectively etched and a protective film covering an end portion of the third oxide semiconductor film is formed. Then, a pair of electrodes, a gate insulating film, and a gate electrode are formed over the third oxide semiconductor film and the protective film.

20 Claims, 28 Drawing Sheets

Related U.S. Application Data continuation of application No. 13/345,940, filed on Jan. 9, 2012, now Pat. No. 8,785,266.

(51) Int. Cl.
  *H01L 27/12* (2006.01)
  *H01L 29/66* (2006.01)
  *H01L 29/04* (2006.01)
  *H01L 29/08* (2006.01)
  *H01L 29/10* (2006.01)
  *H01L 29/24* (2006.01)
  *H01L 29/423* (2006.01)

(52) U.S. Cl.
  CPC ...... *H01L 27/1225* (2013.01); *H01L 27/1237* (2013.01); *H01L 27/1248* (2013.01); *H01L 27/1251* (2013.01); *H01L 27/3262* (2013.01); *H01L 27/3265* (2013.01); *H01L 29/045* (2013.01); *H01L 29/0847* (2013.01); *H01L 29/1033* (2013.01); *H01L 29/24* (2013.01); *H01L 29/42384* (2013.01); *H01L 29/66969* (2013.01); *H01L 29/7869* (2013.01); *H01L 29/78609* (2013.01); *H01L 29/78687* (2013.01); *H01L 29/78696* (2013.01)

(56) References Cited

U.S. PATENT DOCUMENTS

| | | | |
|---|---|---|---|
| 5,559,344 A | 9/1996 | Kawachi | |
| 5,731,856 A | 3/1998 | Kim et al. | |
| 5,744,864 A | 4/1998 | Cillessen et al. | |
| 5,980,763 A | 11/1999 | Young | |
| 6,291,255 B1 * | 9/2001 | Huang | H01L 27/1214 438/151 |
| 6,294,274 B1 | 9/2001 | Kawazoe et al. | |
| 6,563,174 B2 | 5/2003 | Kawasaki et al. | |
| 6,596,571 B2 | 7/2003 | Arao et al. | |
| 6,727,522 B1 | 4/2004 | Kawasaki et al. | |
| 6,933,184 B2 | 8/2005 | Arao et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Lwasakit | |
| 7,462,862 B2 | 12/2008 | Hoffman et al. | |
| 7,468,304 B2 | 12/2008 | Kaji et al. | |
| 7,488,982 B2 | 2/2009 | So et al. | |
| 7,501,293 B2 | 3/2009 | Ito et al. | |
| 7,656,087 B2 * | 2/2010 | Kim | H01L 21/76804 313/504 |
| 7,674,650 B2 | 3/2010 | Akimoto et al. | |
| 7,727,823 B2 | 6/2010 | Jeong et al. | |
| 7,732,819 B2 | 6/2010 | Akimoto et al. | |
| 7,821,002 B2 | 10/2010 | Yamazaki et al. | |
| 7,910,490 B2 | 3/2011 | Akimoto et al. | |
| 7,932,521 B2 | 4/2011 | Akimoto et al. | |
| 8,102,034 B2 | 1/2012 | Oikawa et al. | |
| 8,110,436 B2 | 2/2012 | Hayashi et al. | |
| 8,143,115 B2 | 3/2012 | Omura et al. | |
| 8,148,721 B2 | 4/2012 | Hayashi et al. | |
| 8,178,884 B2 | 5/2012 | Ha et al. | |
| 8,193,045 B2 | 6/2012 | Omura et al. | |
| 8,193,535 B2 | 6/2012 | Ha et al. | |
| 8,198,666 B2 | 6/2012 | Asami et al. | |
| 8,202,365 B2 | 6/2012 | Umeda et al. | |
| 8,207,756 B2 | 6/2012 | Shionoiri et al. | |
| 8,293,595 B2 | 10/2012 | Yamazaki et al. | |
| 8,461,594 B2 | 6/2013 | Morosawa et al. | |
| 8,728,862 B2 | 5/2014 | Ha et al. | |
| 8,742,418 B2 | 6/2014 | Morosawa et al. | |
| 8,803,298 B2 | 8/2014 | Oikawa et al. | |
| 8,841,710 B2 | 9/2014 | Yamazaki et al. | |
| 9,082,857 B2 | 7/2015 | Yamazaki et al. | |
| 9,196,633 B2 | 11/2015 | Yamazaki et al. | |
| 9,412,798 B2 | 8/2016 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0020118 A1 | 1/2003 | Kajiwara et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0285197 A1 | 12/2005 | Park | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishilh | |
| 2006/0292777 A1 | 12/2006 | Dunbar | |
| 2007/0007524 A1 * | 1/2007 | You | H01L 27/1255 257/59 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0172999 A1 | 7/2007 | Kim et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0210313 A1 | 9/2007 | Park | |
| 2007/0252928 A1 | 11/2007 | Ito et al. | |
| 2007/0272922 A1 | 11/2007 | Kim et al. | |
| 2007/0287221 A1 * | 12/2007 | Ong | H01L 21/02554 438/104 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0044958 A1 * | 2/2008 | Hwang | H01L 27/1214 438/154 |
| 2008/0050595 A1 | 2/2008 | Nakagawara et al. | |
| 2008/0073653 A1 | 3/2008 | Lwasakit | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |

(56) References Cited

U.S. PATENT DOCUMENTS

| | | | |
|---|---|---|---|
| 2008/0258141 A1* | 10/2008 | Park | H01L 29/78618 257/43 |
| 2008/0258143 A1 | 10/2008 | Kim et al. | |
| 2008/0258423 A1 | 10/2008 | Huang | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0189160 A1* | 7/2009 | Ahn | H01L 21/02532 257/66 |
| 2009/0278122 A1 | 11/2009 | Hosono et al. | |
| 2009/0280600 A1 | 11/2009 | Hosono et al. | |
| 2009/0283763 A1* | 11/2009 | Park | H01L 29/78621 257/43 |
| 2009/0305461 A1 | 12/2009 | Akimoto et al. | |
| 2009/0315026 A1* | 12/2009 | Jeong | H01L 29/7869 257/43 |
| 2010/0051936 A1 | 3/2010 | Hayashi et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117071 A1 | 5/2010 | Inoue et al. | |
| 2010/0136743 A1 | 6/2010 | Akimoto et al. | |
| 2010/0159639 A1 | 6/2010 | Sakata | |
| 2010/0207120 A1* | 8/2010 | Kimura | H01L 29/105 257/57 |
| 2010/0244036 A1 | 9/2010 | Park et al. | |
| 2011/0006299 A1 | 1/2011 | Abe et al. | |
| 2011/0024740 A1 | 2/2011 | Yamazaki et al. | |
| 2011/0024750 A1 | 2/2011 | Yamazaki et al. | |
| 2011/0024751 A1 | 2/2011 | Yamazaki et al. | |
| 2011/0027980 A1 | 2/2011 | Yamazaki et al. | |
| 2011/0031491 A1 | 2/2011 | Yamazaki et al. | |
| 2011/0037068 A1 | 2/2011 | Yamazaki et al. | |
| 2011/0104851 A1 | 5/2011 | Akimoto et al. | |
| 2011/0108835 A1 | 5/2011 | Kim et al. | |
| 2011/0117697 A1 | 5/2011 | Akimoto et al. | |
| 2011/0121290 A1 | 5/2011 | Akimoto et al. | |
| 2011/0127537 A1 | 6/2011 | Matsumuro | |
| 2011/0163311 A1 | 7/2011 | Akimoto et al. | |
| 2012/0168748 A1 | 7/2012 | Yano et al. | |
| 2012/0168750 A1 | 7/2012 | Hayashi et al. | |
| 2012/0175608 A1 | 7/2012 | Yamazaki | |
| 2012/0175610 A1 | 7/2012 | Yamazaki | |
| 2012/0175625 A1 | 7/2012 | Yamazaki | |
| 2012/0178224 A1 | 7/2012 | Yamazaki | |
| 2012/0178249 A1 | 7/2012 | Yamazaki | |
| 2012/0300150 A1 | 11/2012 | Yamazaki et al. | |
| 2013/0009151 A1 | 1/2013 | Lee et al. | |
| 2015/0060850 A1 | 3/2015 | Yamazaki et al. | |
| 2015/0084048 A1 | 3/2015 | Hayashi et al. | |
| 2015/0236054 A1 | 8/2015 | Yamazaki et al. | |
| 2015/0303280 A1 | 10/2015 | Yamazaki et al. | |

FOREIGN PATENT DOCUMENTS

| | | |
|---|---|---|
| EP | 2159845 A | 3/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-079283 A | 3/2005 |
| JP | 2007-096055 A | 4/2007 |
| JP | 2007-123861 A | 5/2007 |
| JP | 2008-103666 A | 5/2008 |
| JP | 2008-166716 A | 7/2008 |
| JP | 2009-010362 A | 1/2009 |
| JP | 2009-099953 A | 5/2009 |
| JP | 2009-135380 A | 6/2009 |
| JP | 2009-167087 A | 7/2009 |
| JP | 2009-224479 A | 10/2009 |
| JP | 2010-021520 A | 1/2010 |
| JP | 2010-056546 A | 3/2010 |
| JP | 2010-080952 A | 4/2010 |
| JP | 2010-097204 A | 4/2010 |
| JP | 2010-114413 A | 5/2010 |
| JP | 2010-219511 A | 9/2010 |
| TW | 201027710 | 7/2010 |
| TW | 201029184 | 8/2010 |
| WO | WO-2004/114391 | 12/2004 |
| WO | WO-2008/069056 | 6/2008 |
| WO | WO-2008/069255 | 6/2008 |
| WO | WO-2008/149873 | 12/2008 |
| WO | WO-2009/041713 | 4/2009 |
| WO | WO-2010/032619 | 3/2010 |
| WO | WO-2010/035627 | 4/2010 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3—A2O3—BO Systems [A; FE, GA, OR AL; B: MG, MN, FE, NI, CU,or ZN] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Shcmietry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meetings, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZNO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM—FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous Display Workshops, In—Ga—Zn—Oxide TFTs", IDW '09 : Proceedings of the 16th 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based This-Film Transistors by DC Sputtering", SID Digest '09 : SID International Symposium Digest of Technical Papers, May 31, 2009, pp. 191-193.
Cho.D et al., "21.2:AL and SN-Doped Zinc Indium Oxide Thin Film Transistors for AMOLED Back-plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 IN. QVGA Amoled Display Using In—Ga—Zn—Oxide TFTS With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 46, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Applicaiton of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crstalline InGaO3(ZnO)5 films", Appl. Phys. Lett. (Applied Physics Letters), Sep. 13, 2004, vol. 85, No. 11, pp. 1993-1995.

\* cited by examiner

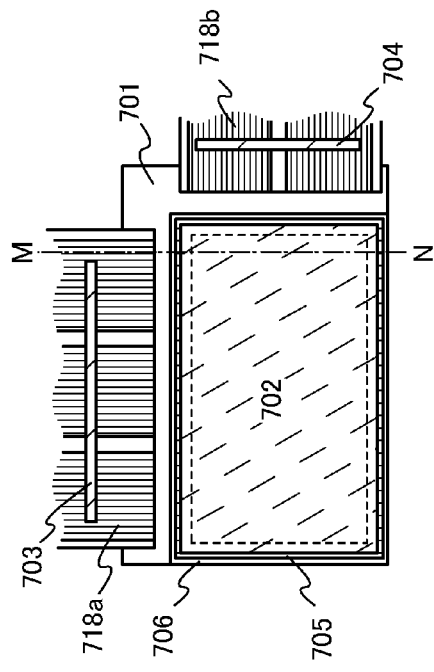

FIG. 28A (100)
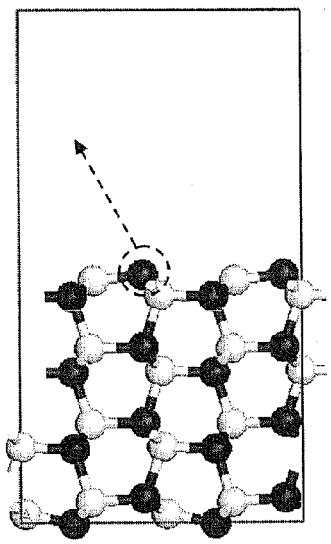
FIG. 28B (110)
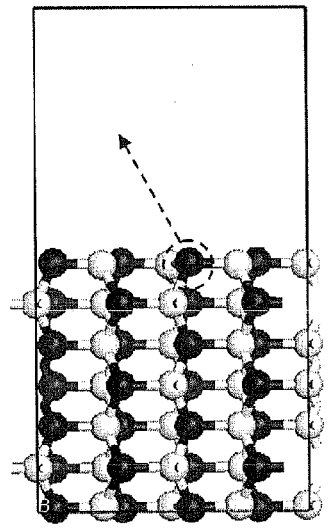
FIG. 28C (001)
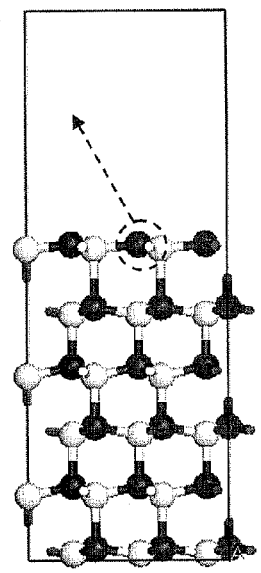

SEMICONDUCTOR DEVICE AND MANUFACTURING METHOD THEREOF

BACKGROUND OF THE INVENTION

1. Field of the Invention

The present invention relates to a semiconductor device which includes a circuit including a semiconductor element such as a transistor, and a method for manufacturing the semiconductor device. For example, the present invention relates to an electronic device which includes, as a component, a power device mounted in a power circuit; a semiconductor integrated circuit including a memory, a thyristor, a converter, an image sensor, or the like; an electro-optical device typified by a liquid crystal display panel; a light-emitting display device including a light-emitting element; or the like.

In this specification, a semiconductor device means all types of devices which can function by utilizing semiconductor characteristics, and an electro-optical device, a light-emitting display device, a semiconductor circuit, and an electronic device are all semiconductor devices.

2. Description of the Related Art

A transistor formed over a glass substrate or the like is manufactured using amorphous silicon, polycrystalline silicon, or the like, as typically seen in liquid crystal display devices. Although a transistor including amorphous silicon has low field effect mobility, it can be formed over a larger glass substrate. On the other hand, although a transistor including polycrystalline silicon has high field effect mobility, it is not suitable for being formed over a larger glass substrate.

In contrast to a transistor including silicon, attention has been drawn to a technique by which a transistor is manufactured using an oxide semiconductor and is applied to an electronic device or an optical device. For example, Patent Document 1 and Patent Document 2 disclose a technique by which a transistor is manufactured using zinc oxide or an In—Ga—Zn—O-based oxide as an oxide semiconductor and is used as a switching element of a pixel or the like of a display device.

Meanwhile, it has been pointed out that hydrogen is a source of carriers particularly in an oxide semiconductor. Therefore, some measures need to be taken to prevent hydrogen from entering the oxide semiconductor at the time of forming the oxide semiconductor. Further, variation of a threshold voltage is suppressed by reducing the amount of hydrogen contained in not only the oxide semiconductor but also a gate insulating film in contact with the oxide semiconductor (see Patent Document 3).

REFERENCE

Patent Document

[Patent Document 1] Japanese Published Patent Application No. 2007-123861

[Patent Document 2] Japanese Published Patent Application No. 2007-096055

[Patent Document 3] Japanese Published Patent Application No. 2009-224479

SUMMARY OF THE INVENTION

However, in a transistor including an oxide semiconductor, if a side surface of the oxide semiconductor is exposed to a reduced-pressure atmosphere, oxygen in the oxide semiconductor is released and an oxygen defect (also referred to as an oxygen vacancy or an oxygen deficiency) is formed. The oxygen defect affects electrical characteristics of the transistor because carriers easily flow in a region where the oxygen defect is formed in the oxide semiconductor. Typically, there is a problem such that a leakage current between a source and a drain of the transistor becomes high.

In view of the above, an object of an embodiment of the present invention is to provide a transistor including an oxide semiconductor with favorable electrical characteristics and a manufacturing method thereof.

According to an embodiment of the present invention, a first oxide insulating film is formed over a substrate; and after forming a first oxide semiconductor film over the first oxide insulating film, heat treatment is performed to release hydrogen contained in the first oxide semiconductor film and diffuse part of oxygen contained in the first oxide insulating film into the first oxide semiconductor film, so that a second oxide semiconductor film whose hydrogen concentration and oxygen defects are reduced is formed. Next, the second oxide semiconductor film is selectively etched to form a third oxide semiconductor film; then a second oxide insulating film is formed; and the second oxide insulating film is selectively etched to form a protective film that covers an end portion of the third oxide semiconductor film. Then, a pair of electrodes, a gate insulating film, and a gate electrode are formed over the third oxide semiconductor film and the protective film.

According to another embodiment of the present invention, a first oxide insulating film is formed over a substrate; a first oxide semiconductor film is formed over the first oxide insulating film; the first oxide semiconductor film is selectively etched, so that a second oxide semiconductor film is formed. Next, after forming a second oxide insulating film that covers the first oxide insulating film and the second oxide semiconductor film, heat treatment is performed to diffuse part of oxygen contained in the first oxide insulating film and the second oxide insulating film into the second oxide semiconductor film, so that a third oxide semiconductor film whose hydrogen concentration and oxygen defects are reduced is formed. Next, the second oxide insulating film is selectively etched, so that a protective film that covers an end portion of the third oxide semiconductor film is formed. Then, a pair of electrodes, a gate insulating film, and a gate electrode are formed over the third oxide semiconductor film and the protective film.

According to another embodiment of the present invention, a first oxide insulating film is formed over a substrate, a first oxide semiconductor film is formed over the first oxide insulating film, and a pair of electrodes is formed over the first oxide semiconductor film. Next, the first oxide semiconductor film is selectively etched, so that a second oxide semiconductor film is formed. Then, a second oxide insulating film that covers the first oxide insulating film, the pair of electrodes, and the second oxide semiconductor film is formed, and after that heat treatment is performed to diffuse part of oxygen contained in the first oxide insulating film and the second oxide insulating film into the second oxide semiconductor film, so that a third oxide semiconductor film whose hydrogen concentration and oxygen defects are reduced is formed. Next, the second oxide insulating film is selectively etched, so that a protective film that covers an end portion of the third oxide semiconductor film is formed. Then, a gate insulating film and a gate electrode are formed over the third oxide semiconductor film and the protective film.

The first oxide insulating film and the second oxide insulating film are each formed using an oxide insulating film from which part of oxygen is released by heat treatment. The oxide insulating film from which part of oxygen is released by heat treatment is preferably an oxide insulating film which contains oxygen at a proportion exceeding the stoichiometric proportion. The oxide insulating film from which part of oxygen is released by heat treatment can diffuse oxygen into the first oxide semiconductor film or the second oxide semiconductor film by heat treatment, because oxygen is released from the oxide insulating film by heat treatment. Typical examples of the oxide insulating film from which part of oxygen is released by heat treatment include films of silicon oxide, silicon oxynitride, silicon nitride oxide, aluminum oxide, aluminum oxynitride, gallium oxide, hafnium oxide, yttrium oxide, and the like.

In an embodiment of the present invention, by heating the first oxide semiconductor film or the second oxide semiconductor film at least in a state where the first oxide semiconductor film or the second oxide semiconductor film is in contact with the first oxide insulating film, oxygen contained in the first oxide insulating film is diffused into the first oxide semiconductor film or the second oxide semiconductor film, so that oxygen defects can be reduced. Further, the interface state density at the interface between the first oxide insulating film and the first oxide semiconductor film or the second oxide semiconductor film can be reduced. As a result, the negative shift of the threshold voltage of the transistor can be reduced.

Since the pair of electrodes, the gate insulating film, and the gate electrode are formed after the end portion of the third oxide semiconductor film is covered by the protective film, a side surface of the third oxide semiconductor film is not exposed to a reduced-pressure atmosphere. In addition, in a process of forming the pair of electrodes, the side surface of the third oxide semiconductor film is not exposed to an etching atmosphere. Accordingly, generation of oxygen defects at the side surface of the third oxide semiconductor film can be reduced.

In an embodiment of the present invention, when a dopant is added to the third oxide semiconductor film with the use of the protective film, the gate electrode, and the pair of electrodes as masks, a pair of regions containing a dopant is formed in a self-aligned manner. As the dopant, at least one of hydrogen, helium, neon, argon, krypton, and xenon is used, and the concentration of the dopant in the pair of regions containing a dopant is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than or equal to $5\times10^{19}$ atoms/cm$^3$. In this manner, a first oxide semiconductor region overlapping with the gate electrode, the pair of regions containing a dopant between which the first oxide semiconductor region is sandwiched, and a pair of second oxide semiconductor regions which overlaps with the pair of electrodes and between which the pair of regions containing a dopant is sandwiched can be formed. The first oxide semiconductor region functions as a channel region, and the pair of regions containing a dopant functions as electric-field relaxation regions. Thus, a short-channel effect of the transistor can be suppressed. Since the gate electrode does not overlap with the pair of electrodes, parasitic capacitance can be reduced, which leads to high-speed operation of the transistor.

After the dopant is added, heat treatment may be performed.

The oxide semiconductor can include one or more elements selected from In, Ga, Sn, and Zn.

An oxide semiconductor can be a non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

In this specification, the non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis is referred to as a CAAC (c-axis aligned crystals) oxide semiconductor.

The CAAC oxide semiconductor is not a single crystal and, in addition, is not composed of only an amorphous component. Although the CAAC oxide semiconductor includes a crystallized portion (crystalline portion), a boundary between one crystalline portion and another crystalline portion is not clear in some cases. Nitrogen may be substituted for part of or all of oxygen included in the CAAC oxide semiconductor. The c-axes of individual crystalline portions included in the CAAC oxide semiconductor may be aligned in a certain direction (e.g., a direction perpendicular to a surface of a substrate over which the CAAC oxide semiconductor is formed or a surface of the CAAC oxide semiconductor). Alternatively, the normals of the a-b planes of the individual crystalline portions included in the CAAC oxide semiconductor may be aligned in a certain direction (e.g., a direction perpendicular to the surface of a substrate over which the CAAC oxide semiconductor is formed, the surface of the CAAC oxide semiconductor, or the like).

The CAAC oxide semiconductor may become a conductor or an insulator depending on its composition or the like. The CAAC oxide semiconductor transmits or does not transmit visible light depending on its composition or the like. An example of a CAAC oxide semiconductor is a material which is formed into a film shape and has a triangular or hexagonal atomic arrangement when observed from the direction perpendicular to a surface of the film, a surface of a substrate, or an interface and in which metal atoms are arranged in a layered manner or metal atoms and oxygen atoms (or nitrogen atoms) are arranged in a layered manner when a cross section of the film is observed.

With an embodiment of the present invention, oxygen defects in the oxide semiconductor film can be reduced. As a result, the negative shift of the threshold voltage of the transistor can be reduced and, in addition, a leakage current between a source and a drain of the transistor can be reduced; accordingly, electrical characteristics of the transistor can be improved.

BRIEF DESCRIPTION OF THE DRAWINGS

In the accompanying drawings:

FIG. 19A is a top view illustrating a display device including a semiconductor device according to an embodiment of the present invention and FIG. 19B is a cross-sectional view thereof;

FIGS. 28A to 28C are diagrams describing models used for calculation.

DETAILED DESCRIPTION OF THE INVENTION

Figure 1A:
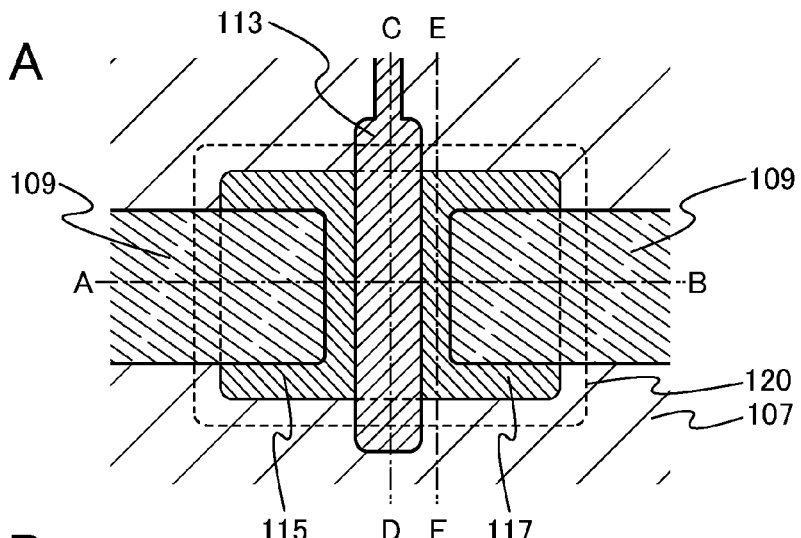
FIG. 1A is a top view illustrating a semiconductor device according to an embodiment of the present invention and FIGS. 1B to 1D are cross-sectional views thereof.

Embodiments of the present invention will be described in detail with reference to the accompanying drawings. Note that the present invention is not limited to the following description, and it will be easily understood by those skilled in the art that modes and details thereof can be modified in various ways without departing from the spirit and the scope of the present invention. Therefore, the present invention should not be construed as being limited to the description in the following embodiments. Note that in structures of the present invention described hereinafter, the same portions or portions having similar functions are denoted by the same reference numerals in different drawings, and description thereof is not repeated.

Note that in each drawing described in this specification, the size, the film thickness, or the region of each component is exaggerated for clarity in some cases. Therefore, embodiments of the present invention are not always limited to such scales.

In addition, terms such as "first", "second", and "third" in this specification are used in order to avoid confusion among components, and the terms do not limit the components numerically. Therefore, for example, the term "first" can be replaced with the term "second", "third", or the like as appropriate.

(Embodiment 1)

In this embodiment, a structure of a transistor in which a leakage current can be reduced and a manufacturing method of the transistor will be described with reference to FIGS. 1A to 1D, FIGS. 2A to 2E, and FIGS. 3A to 3C.

Figure 1B:
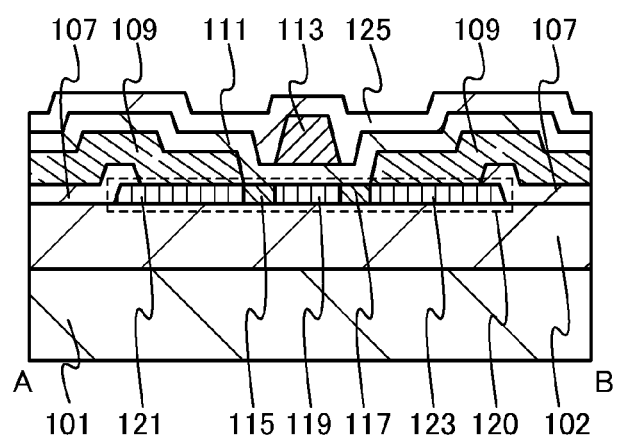
Figure 1C:
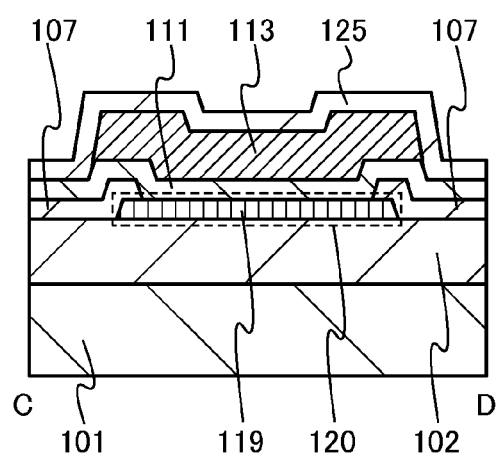
Figure 1D:
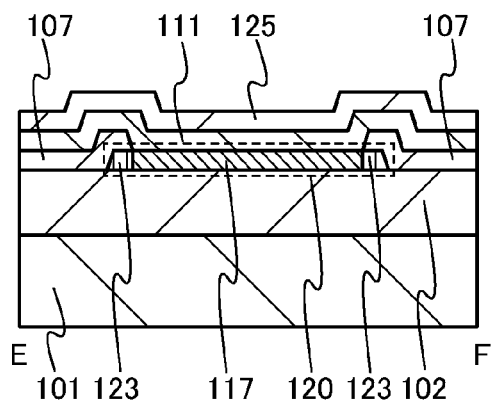

FIGS. 1A to 1D are a top view and cross-sectional views of a transistor described in this embodiment. FIG. 1A is the top view of the transistor described in this embodiment, FIG. 1B is a cross-sectional view taken along a dashed-dotted line A-B in FIG. 1A, FIG. 1C is a cross-sectional view taken along a dashed-dotted line C-D in FIG. 1A, and FIG. 1D is a cross-sectional view taken along a dashed-dotted line E-F in FIG. 1A. In FIG. 1A, some of components of the transistor (e.g., a gate insulating film 111, an insulating film 125, and the like) are not shown for simplicity.

The transistor illustrated in FIGS. 1A to 1D includes an oxide insulating film 102 provided over a substrate 101, an oxide semiconductor film 120 provided over the oxide insulating film 102, a protective film 107 that covers an end portion of the oxide semiconductor film 120, a pair of electrodes 109 formed over the protective film 107 and in contact with the oxide semiconductor film 120, a gate insulating film 111 which covers the protective film 107, the pair of electrodes 109, and the oxide semiconductor film 120, and a gate electrode 113 formed over the gate insulating film 111 so as to overlap with the oxide semiconductor film 120. Further, an insulating film 125 which covers the gate insulating film 111 and the gate electrode 113 may be included. The oxide semiconductor film 120 includes an oxide semiconductor region 119 overlapping with the gate electrode 113, a pair of regions 115 and 117 containing a dopant between which the oxide semiconductor region 119 is sandwiched, and a pair of oxide semiconductor regions 121 and 123 between which the pair of regions 115 and 117 containing a dopant is sandwiched and which is in contact with the pair of electrodes 109. Note that the oxide semiconductor region 119 functions as a channel region, the pair of regions 115 and 117 containing a dopant functions as electric-field relaxation regions, and portions in contact with the pair of electrodes 109 in the pair of oxide semiconductor regions 121 and 123 function as a source region and a drain region. The end portion of the oxide semiconductor film 120 covered by the protective film 107 includes at least a side surface of the oxide semiconductor film 120 and may further include part of a top surface of the oxide semiconductor film 120.

There is no particular limitation on the property of a material and the like of the substrate 101 as long as the material has heat resistance enough to withstand at least heat treatment to be performed later. For example, a glass substrate, a ceramic substrate, a quartz substrate, or a sapphire substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Still alternatively, any of these substrates further provided with a semiconductor element may be used as the substrate 101.

A flexible substrate may also be used as the substrate 101. A separation layer may be provided between the substrate 101 and the oxide insulating film 102. The separation layer can be used when part or the whole of a semiconductor device formed over the separation layer is separated from the substrate 101 and transferred onto another substrate. In such a case, the semiconductor device can be transferred to a substrate having low heat resistance or a flexible substrate as well.

The oxide insulating film 102 is formed using an oxide insulating film from which part of oxygen is released by heat treatment. As such an oxide insulating film from which part of oxygen is released by heat treatment, an oxide insulating film containing oxygen at a proportion exceeding the stoichiometric proportion is preferably used. The oxide insulating film from which part of oxygen is released by heat treatment can diffuse oxygen into the oxide semiconductor film by heat treatment, because oxygen is released from the oxide insulating film by heat treatment. Typical examples of the oxide insulating film 102 include films of silicon oxide, silicon oxynitride, silicon nitride oxide, aluminum oxide, aluminum oxynitride, gallium oxide, hafnium oxide, yttrium oxide, and the like.

The thickness of the oxide insulating film 102 is greater than or equal to 50 nm, preferably greater than or equal to 200 nm and less than or equal to 500 nm. With use of the thick oxide insulating film 102, the amount of oxygen released from the oxide insulating film 102 can be increased and, in addition, the interface state density at an interface between the oxide insulating film 102 and an oxide semiconductor film to be formed later can be reduced.

Here, "to release part of oxygen by heat treatment" means that the amount of released oxygen is greater than or equal to $1.0 \times 10^{18}$ atoms/cm$^3$, preferably greater than or equal to $3.0 \times 10^{20}$ atoms/cm$^3$ in thermal desorption spectroscopy (TDS) on an oxygen atom basis.

Here, a method for measuring the amount of released oxygen on an oxygen atom basis using TDS analysis will be described.

The amount of released gas in TDS analysis is proportional to the integral value of a spectrum. Therefore, the amount of released gas can be calculated from the ratio of the integral value of a spectrum of the insulating film to the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be calculated according to Formula 1 using the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. CH$_3$OH can be given as a gas having a mass number of 32, but is not taken into consideration on the assumption that it is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = N_{H2}/S_{H2} \times S_{O2} \times \alpha \quad \text{[Formula 1]}$$

$N_{H2}$ is the value obtained by conversion of the number of hydrogen molecules released from the standard sample into density. $S_{H2}$ is an integral value of a spectrum of the standard sample which is analyzed by TDS. Here, the reference value of the standard sample is set to $N_{H2}/S_{H2}$. $S_{O2}$ is an integral value of a spectrum when the insulating film is analyzed by TDS. $\alpha$ is a coefficient affecting the intensity of the spectrum in the TDS analysis. For details of Formula 1, Japanese Published Patent Application No. H6-275697 is referred to. Note that the amount of released oxygen from the above insulating film was measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of oxygen molecules. Note that, since the above $\alpha$ includes the ionization rate of oxygen molecules, the number of the released oxygen atoms can also be estimated through the evaluation of the number of the released oxygen molecules.

Note that $N_{O2}$ is the number of released oxygen molecules. The amount of released oxygen on an oxygen atom basis is twice the number of the released oxygen molecules.

In the above structure, the insulating film from which oxygen is released by heat treatment may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the oxide insulating film to the oxide semiconductor film, the interface state density at the interface between the oxide insulating film and the oxide semiconductor film can be reduced. As a result, capture of electric charge which may be generated due to operation of a transistor or the like at the interface between the oxide insulating film and the oxide semiconductor film can be suppressed. Thus, it is possible to provide a transistor with less electrical characteristic deterioration, in which negative shift of the threshold voltage can be reduced.

Further, electric charge may be generated owing to oxygen vacancies in the oxide semiconductor film in some cases. In general, part of oxygen vacancies in the oxide semiconductor film serves as a donor to generate an electron that is a carrier. As a result, the threshold voltage of the transistor shifts in the negative direction. This tendency is remarkable in an oxygen vacancy caused on the backchannel side. Note that the term "back channel" in this specification refers to the vicinity of an interface on the oxide insulating film 102 side in the oxide semiconductor region 119 in FIG. 1B. Sufficient release of oxygen from the oxide insulating film to the oxide semiconductor film can compensate for oxygen vacancies in the oxide semiconductor film which is a cause of negative shift of the threshold voltage.

In other words, when oxygen vacancies are generated in the oxide semiconductor film, it is difficult to suppress capture of electric charge at the interface between the oxide insulating film and the oxide semiconductor film. However, by providing an insulating film from which oxygen is released by heat treatment as the oxide insulating film, the interface state density between the oxide semiconductor film and the oxide insulating film and oxygen vacancies in the oxide semiconductor film can be reduced, and an influence of the capture of electric charge at the interface between the oxide semiconductor film and the oxide insulating film can be made small.

The oxide semiconductor film 120 is an oxide semiconductor film including at least one element selected from In, Ga, Sn, and Zn. Typically, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a one-component metal oxide such as ZnO, SnO, or InO; or the like can be used for the oxide semiconductor film 120. Moreover, silicon oxide may be included in the above oxide semiconductor. Here, for example, an In—Ga—Zn—O-based material means an oxide material including indium (In), gallium (Ga), and zinc (Zn), and there is no particular limitation on the composition ratio. The In—Ga—Zn—O-based material may further include an element other than indium, gallium, and zinc. Here, the amount of oxygen in the above oxide semiconductor film preferably exceeds the stoichiometric proportion of oxygen. When the amount of oxygen exceeds the stoichiometric proportion, generation of carriers which results from oxygen vacancies in the oxide semiconductor film can be suppressed.

In the case where an In—Zn—O-based material is used as the oxide semiconductor film, the atomic ratio thereof is In/Zn=0.5 to 50, preferably In/Zn=1 to 20, and further preferably In/Zn=1.5 to 15. When the atomic ratio of In to Zn is in the above preferred range, the field-effect mobility of a transistor can be improved. Here, when the atomic ratio of the compound is In:Zn:O=X:Y:Z, the relation Z>1.5X+Y is satisfied.

Note that the energy gap of a metal oxide which can form the oxide semiconductor film 120 is 2 eV or more, preferably 2.5 eV or more, further preferably 3 eV or more. In this manner, the off-state current of a transistor can be reduced by using an oxide semiconductor having a wide energy gap.

The oxide semiconductor film 120 may have an amorphous structure.

The oxide semiconductor film 120 may be formed using a non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis, that is, a c-axis-aligned crystalline material.

The oxide semiconductor film 120 may contain nitrogen at a concentration lower than or equal to $5\times10^{18}$ atoms/cm$^3$.

The concentration of alkali metals or alkaline earth metals in the oxide semiconductor film 120 is preferably lower than or equal to $1\times10^{18}$ atoms cm$^3$, further preferably lower than or equal to $2\times10^{16}$ atoms/cm$^3$. When alkali metals or alkaline earth metals are bonded to an oxide semiconductor, some of the alkali metals or the alkaline earth metals generate carriers and cause an increase in the off-state current of the transistor.

The concentration of hydrogen included in the oxide semiconductor film 120 is preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, and yet still further preferably lower than or equal to $1\times10^{16}$ atoms/cm$^3$. By a bond of an oxide semiconductor and hydrogen, part of contained hydrogen serves as a donor to generate electrons as carriers. For that reason, by the reduction in the concentration of hydrogen in the oxide semiconductor film, negative shift of the threshold voltage can be reduced.

Here, an oxide semiconductor film having an amorphous structure is formed as the oxide semiconductor film 120.

The thickness of the oxide semiconductor film 120 is preferably more than or equal to 1 nm and less than or equal to 50 nm, further preferably more than or equal to 3 nm and less than or equal to 30 nm.

The pair of regions 115 and 117 containing a dopant is provided in regions which are not covered with the followings in the oxide semiconductor film 120: the protective film 107, the pair of electrodes 109, and the gate electrode 113. The pair of regions 115 and 117 contains a Group 15 element such as nitrogen, phosphorus, or arsenic. The pair of regions 115 and 117 containing a dopant contains at least one kind of dopant selected from hydrogen, helium, neon, argon, krypton, and xenon.

The concentration of the dopant in the pair of regions 115 and 117 is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of regions 115 and 117 contains a dopant, the carrier density or the number of defects can be increased. Therefore, the conductivity can be higher than that of the oxide semiconductor region 119 which does not contain a dopant. An excessive increase in the dopant concentration causes inhibition of carrier movement by the dopant, which leads to lower conductivity of the pair of regions 115 and 117 containing a dopant.

The pair of regions 115 and 117 containing a dopant preferably has a conductivity higher than or equal to 10 S/cm and lower than or equal to 1000 S/cm, preferably higher than or equal to 100 S/cm and lower than or equal to 1000 S/cm.

The existence of the pair of regions 115 and 117 containing a dopant in the oxide semiconductor film 120 can relax an electric field applied to an end portion of the oxide semiconductor region 119 functioning as a channel region. Therefore, a short-channel effect of the transistor can be suppressed.

At least one dopant of a Group 15 element such as nitrogen, phosphorus, or arsenic, hydrogen, helium, neon, argon, krypton, and xenon is not added to a region covered with the pair of electrodes 109, the gate electrode 113, or the protective film 107 in the oxide semiconductor film 120 (such as the oxide semiconductor regions 121 and 123) using an ion doping method, an ion implantation method, a plasma treatment method, or the like.

The protective film 107 can be formed using a single layer or stacked layers of a silicon oxide film, a silicon oxynitride film, a silicon nitride oxide film, or a silicon nitride film. It is preferable that at least a region of the protective film 107, which is in contact with the oxide semiconductor film 120, be formed of an oxide insulating film from which oxygen is released by heat treatment, which is also used as the oxide insulating film 102.

The thickness of the protective film 107 is preferably more than or equal to 30 nm and less than or equal to 1000 nm, further preferably more than or equal to 100 nm and less than or equal to 1000 nm; with such a thickness, addition of a dopant to the end portion of the oxide semiconductor film 120 can be prevented and, moreover, an insulating property between the oxide semiconductor film 120 and the pair of electrodes 109 can be kept. Further, when the length of a region where the protective film 107 covers a top surface of the end portion of the oxide semiconductor film 120 is 50 nm or less, preferably 20 nm or less, the side surface of the oxide semiconductor film 120 can be surely covered by the protective film even if a mask is misaligned.

Because of the protective film 107 covering the end portion of the oxide semiconductor film 120, the side surface of the oxide semiconductor film 120 is not in contact with the pair of electrodes 109; therefore, generation of a leakage current in such a region can be suppressed.

The pair of electrodes 109 is formed to have a single-layer structure or a stacked-layer structure including, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. Note that the pair of electrodes 109 also functions as a wiring.

The gate insulating film 111 may be formed using a single layer or stacked layers of, for example, silicon oxide, silicon oxynitride, silicon nitride oxide, silicon nitride, aluminum oxide, hafnium oxide, gallium oxide, or the like. The gate insulating film 111 may be an oxide insulating film from which oxygen is released by heat treatment as described as a film that can be used as the oxide insulating film 102. By using a film from which oxygen is released by heat treatment as the gate insulating film 111, oxygen vacancies caused in the oxide semiconductor film can be reduced and deterioration of electric characteristics of the transistor can be suppressed.

When the gate insulating film 111 is formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, gate leakage current can be reduced.

The thickness of the gate insulating film 111 is preferably more than or equal to 1 nm and less than or equal to 300 nm, further preferably more than or equal to 5 nm and less than or equal to 50 nm.

It is also possible that the gate insulating film 111 is formed only over the oxide semiconductor region 119 and does not cover the pair of regions 115 and 117 containing a dopant.

The gate electrode 113 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese or zirconium may be used. Further, the gate electrode 113 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 113 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure of the above-described light-transmitting conductive material and the above-described metal element.

As a material layer in contact with the gate insulating film 111, an In—Ga—Zn—O film containing nitrogen, an In—Sn—O film containing nitrogen, an In—Ga—O film containing nitrogen, an In—Zn—O film containing nitrogen, an Sn—O film containing nitrogen, an In—O film containing nitrogen, or a film of a metal nitride (such as InN or ZnN) is preferably provided between the gate electrode 113 and the gate insulating film 111. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 120, specifically, an In—Ga—Zn—O film having a nitrogen concentration of 7 at. % or higher is used.

The insulating film 125 may be formed to have a stacked-layer structure or a single-layer structure using, for example, a material such as silicon oxide, silicon oxynitride, silicon nitride oxide, or silicon nitride.

In the transistor described in this embodiment, since the end portion of the oxide semiconductor film 120 is covered with the protective film 107, the dopant is not added to the region of the oxide semiconductor film 120, which is covered with the protective film 107. Thus, generation of a leakage current in the region can be suppressed. Further, since the pair of electrodes 109 does not overlap with the gate electrode 113, parasitic capacitance between the pair of electrodes 109 and the gate electrode 113 can be reduced. Therefore, high-speed operation of the transistor can be achieved. Furthermore, the hydrogen concentration in the oxide semiconductor film 120 is low; accordingly, electric characteristics and reliability of the transistor can be increased.

Although a transistor in which opposite regions of the pair of electrodes 109 are linear has been used in this embodiment, the opposite regions of the pair of electrodes 109 may be U-shaped or C-shaped as appropriate, for example. A transistor with such a structure can have an increased channel width; accordingly, the on-state current can be increased.

Next, a method for manufacturing the transistor in FIGS. 1A to 1D will be described with reference to FIGS. 2A to 2E and FIGS. 3A to 3C.

Figure 2A:
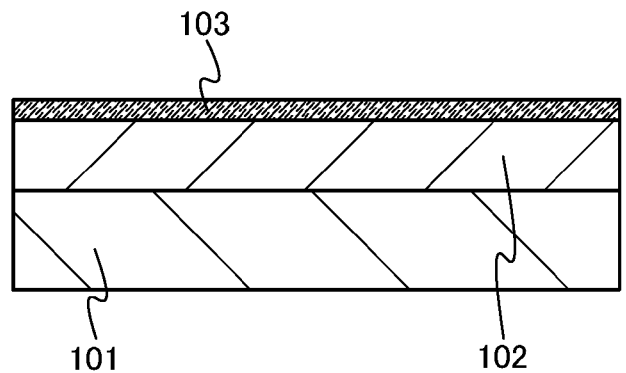
FIGS. 2A to 2E are cross-sectional views illustrating a manufacturing method of a semiconductor device according to an embodiment of the present invention.

As illustrated in FIG. 2A, the oxide insulating film 102 is formed over the substrate 101. Then, an oxide semiconductor film 103 is formed over the oxide insulating film 102.

The oxide insulating film 102 is formed by a sputtering method, a CVD method, or the like. It is preferable to use the oxide insulating film from which part of oxygen is released by heat treatment because it is easily formed by a sputtering method.

When the oxide insulating film from which part of oxygen is released by heat treatment is formed by a sputtering method, the amount of oxygen in a deposition gas is preferably large, and oxygen, a mixed gas of oxygen and a rare gas, or the like can be used. Typically, the oxygen concentration of a deposition gas is preferably from 6% to 100%.

A silicon oxide film can be formed as a typical example of such an oxide insulating film from which part of oxygen is released by heat treatment. In that case, the silicon oxide film is preferably formed by an RF sputtering method under the following conditions: quartz (preferably synthetic quartz) is used as a target; the substrate temperature is from 30° C. to 450° C. (preferably from 70° C. to 200° C.); the distance between the substrate and the target (the T-S distance) is from 20 mm to 400 mm (preferably from 40 mm to 200 mm); the pressure is from 0.1 Pa to 4 Pa (preferably from 0.2 Pa to 1.2 Pa), the high-frequency power is from 0.5 kW to 12 kW (preferably from 1 kW to 5 kW); and the proportion of oxygen in the deposition gas ($O_2/(O_2+Ar)$) is from 1% to 100% (preferably from 6% to 100%). Note that a silicon target may be used as the target instead of the quartz (preferably synthetic quartz) target. In addition, oxygen alone may be used as the deposition gas.

The oxide semiconductor film 103 can be formed by a sputtering method, a coating method, a printing method, a pulsed laser deposition method, or the like.

Here, the oxide semiconductor film 103 is formed by a sputtering method to have a thickness more than or equal to 1 nm and less than or equal to 50 nm, preferably more than or equal to 3 nm and less than or equal to 30 nm.

Next, a sputtering apparatus used for forming the oxide semiconductor film will be described in detail below.

The leakage rate of a treatment chamber in which the oxide semiconductor film is formed is preferably lower than or equal to $1\times10^{-10}$ Pa·m³/sec., whereby entry of an impurity into the film formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1\times10^{-10}$ Pa·m³/sec.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member for forming an inner wall of the treatment chamber, aluminum, chromium, titanium, zirconium, nickel, or vanadium, from which the amount of a released gas containing hydrogen is small, is used. An alloy material containing iron, chromium, nickel, and the like covered with the above-mentioned material may be used. The alloy material containing iron, chromium, nickel, and the like has stiffness and is resistant to heat and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

Furthermore, it is preferable to provide a gas purifier for a sputtering gas just in front of the treatment chamber. At this time, the length of a pipe between the gas purifier and the treatment chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the treatment chamber is preferably performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen or water. Hence, a combination of a cryopump having a high capability in evacuating water and a sputter ion pump having a high capability in evacuating hydrogen is effective.

An adsorbate present on the inner wall of the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promoting desorption of the adsorbate. By the baking, the rate of desorption of the adsorbate can be increased about tenfold. The baking may be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film 103 and preferably in the process for forming the oxide insulating film, entry of impurities is suppressed as much as possible through control of the pressure of the treatment chamber, leakage rate of the treatment chamber, and the like, whereby entry of impurities including hydrogen contained in the oxide semiconductor film can be reduced. In addition, diffusion of impurities such as hydrogen from the oxide insulating film to the oxide semiconductor film can be reduced.

Hydrogen contained in the oxide semiconductor reacts with oxygen bonded to a metal atom to produce water, and in addition, a defect is formed in a lattice from which oxygen is released (or a portion from which oxygen is removed). Thus, the impurities containing hydrogen are reduced as much as possible in the formation step of the oxide semiconductor film, whereby defects in the oxide semiconductor film can be reduced. Therefore, when a channel region is formed in an oxide semiconductor film which is purified by removing impurities as much as possible, the transistor can have higher reliability.

A power supply device for generating plasma in a sputtering method can be an RF power supply device, an AC power supply device, a DC power supply device, or the like as appropriate.

As a target, a metal oxide target containing zinc can be used. As the target, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide, or a one-component metal oxide such as a ZnO-based metal oxide or a SnO-based metal oxide can be used.

An example of the target is a metal oxide target containing In, Ga, and Zn at a composition ratio of $In_2O_3:Ga_2O_3:ZnO=1:1:1$ [molar ratio]. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used. Alternatively, a target having a composition ratio of $In_2O_3:ZnO=25:1$ to $1:4$ [molar ratio] can be used.

As a sputtering gas, a rare gas (typically argon) atmosphere, an oxygen atmosphere, or a mixed gas of a rare gas and oxygen is used as appropriate. It is preferable that a high-purity gas from which impurities containing hydrogen are removed be used as a sputtering gas.

It is preferable that the oxide insulating film 102 and the oxide semiconductor film 103 be formed successively. When the oxide semiconductor film 103 is formed without being exposed to the air after formation of the oxide insulating film 102, attachment of hydrogen at the interface between the oxide insulating film 102 and the oxide semiconductor film 103 can be reduced. Alternatively, a multi-chamber sputtering apparatus having a heating apparatus may be employed in the following manner: the oxide insulating film 102 is formed and heated with the heating apparatus so that hydrogen is released, and then the oxide semiconductor film 103 is formed over the oxide insulating film 102.

Figure 2B:
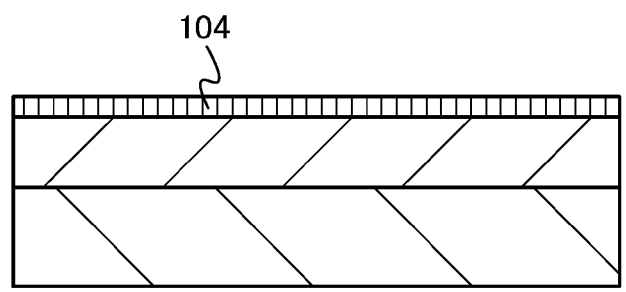

Next, heat treatment is performed on the substrate 101, so that hydrogen is released from the oxide semiconductor film and part of oxygen contained in the oxide insulating film 102 is diffused into the oxide semiconductor film 103 and the vicinity of the interface between the oxide insulating film 102 and the oxide semiconductor film 103. As a result, as illustrated in FIG. 2B, an oxide semiconductor film 104 with reduced hydrogen concentration and reduced oxygen defects can be formed.

The temperature of the heat treatment is preferably a temperature at which hydrogen is released from the oxide semiconductor film and part of oxygen contained in the oxide insulating film 102 is released and diffused into the oxide semiconductor film. The temperature is typically higher than or equal to 150° C. and lower than the strain point of the substrate, preferably higher than or equal to 250° C. and lower than or equal to 450° C., further preferably higher than or equal to 300° C. and lower than or equal to 450° C.

A rapid thermal annealing (RTA) apparatus can be used for the heat treatment. With the use of an RTA apparatus, heat treatment at a temperature higher than or equal to the strain point of the substrate can be performed only for a short time. Thus, the time during which hydrogen is released from the oxide semiconductor film and the time during which oxygen is diffused from the oxide insulating film 102 into the oxide semiconductor film 103 can be shortened.

The heat treatment can be performed in an inert gas atmosphere; typically it is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is from three minutes to 24 hours.

Oxygen vacancies in the oxide semiconductor film also serve as donors to generate electrons that are carriers. The heat treatment is performed in the state where the oxide insulating film 102 is covered with the oxide semiconductor film 103, so that part of oxygen in the oxide insulating film 102 is diffused into the oxide semiconductor film 103. Thus, oxygen vacancies of the oxide semiconductor film 103 can be reduced. Further, since the oxide insulating film 102 is covered with the oxide semiconductor film 103 and a surface of the oxide insulating film 102 is not exposed, the amount of oxygen released to the outside without diffusing from the oxide insulating film 102 to the oxide semiconductor film 103 can be reduced. Accordingly, oxygen defects of the oxide semiconductor film, the interface state density between the oxide insulating film 102 and the oxide semiconductor film 103 can be reduced.

In the process for forming the oxide semiconductor film 103, entry of impurities is suppressed as much as possible through control of the pressure of the treatment chamber, leakage rate of the treatment chamber, and the like, whereby entry of impurities including hydrogen contained in the oxide insulating film 102 and the oxide semiconductor film 103 can be reduced. Furthermore, diffusion of impurities containing hydrogen from the oxide insulating film 102 into the oxide semiconductor film 103 can be reduced. The hydrogen concentration in the oxide semiconductor film 103 can be reduced by heat treatment. By a bond with hydrogen in an oxide semiconductor, part of hydrogen serves as a donor to generate electrons that are carriers. Thus, by reducing impurities, typically hydrogen, as much as possible in the formation step of the oxide semiconductor film and the subsequent heating step, defects in the oxide semiconductor film can be reduced.

Figure 2C:
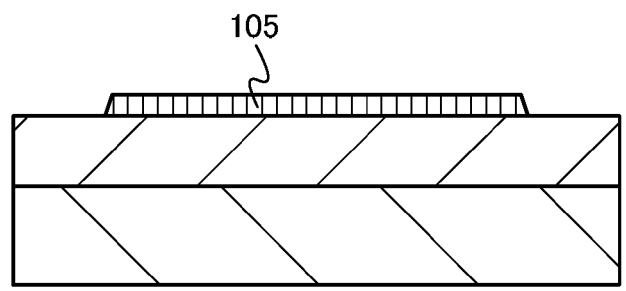

Next, a mask is formed over the oxide semiconductor film 104, and then the oxide semiconductor film 104 is selectively etched with the use of the mask, so that an oxide semiconductor film 105 is formed (see FIG. 2C).

The mask used in the etching of the oxide semiconductor film 104 can be formed as appropriate by a photolithography process, an inkjet method, a printing method, or the like. Wet etching or dry etching may be employed as appropriate for the etching of the oxide semiconductor film. Then, the mask is removed. Note that when a stripping solution is used for removing the mask, oxygen may be released from a side surface of the oxide semiconductor film 105 in some cases. Therefore, an ashing method may alternatively be used for removing the mask.

Figure 2D:
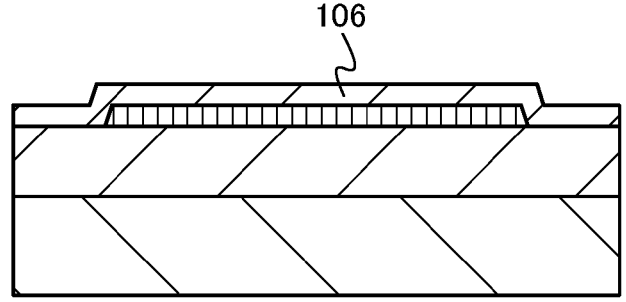
Figure 2E:
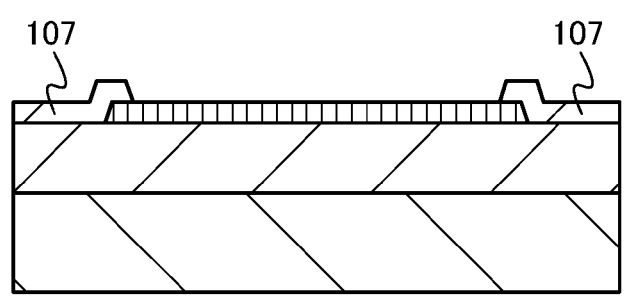

Next, as illustrated in FIG. 2D, an oxide insulating film 106 is formed over the oxide insulating film 102 and the oxide semiconductor film 105. The oxide insulating film 106 is formed using an oxide insulating film from which part of oxygen is released by heat treatment in a manner similar to that of the oxide insulating film 102. As such an oxide insulating film from which part of oxygen is released by heat treatment, an oxide insulating film containing oxygen at a proportion exceeding the stoichiometric proportion is preferably used.

As a formation method of the oxide insulating film 106, a formation method similar to that of the oxide insulating film 102 can be selected as appropriate. Note that in forming the oxide insulating film 106, the film formation temperature of the oxide insulating film 106 is preferably set to a lowest possible temperature and further preferably set to a room temperature, in order to reduce the amount of oxygen released from the side surface of the oxide semiconductor film 105.

Note that even in the case where oxygen defects are generated at the side surface of the oxide semiconductor film 105 owing to the release of oxygen, by using an oxide insulating film from which part of oxygen is released by heat as the oxide insulating film 106, oxygen defects at the side surface of the oxide semiconductor film 105 can be reduced by later heat treatment.

Next, a mask is formed over the oxide insulating film 106, the oxide insulating film 106 is selectively etched with the use of the mask, and then the protective film 107 is formed. Then, the mask is removed (see FIG. 2E). The protective film 107 covers at least the end portion of the oxide semiconductor film 105; therefore, the side surface of the oxide semiconductor film 105 is not exposed to a reduced-pressure atmosphere in a subsequent manufacturing process. In addition, a sidewall of the oxide semiconductor film 105 is not exposed to an etchant in a later etching step. Consequently, the release of oxygen from the side surface of the oxide semiconductor film 105 and generation of oxygen defects owing to the release can be prevented. Further, since the side surface of the oxide semiconductor film 105 is not in contact with the pair of electrodes 109, generation of a leakage current in a region in the vicinity of the side surface of the oxide semiconductor film 105 can be suppressed.

Figure 3A:
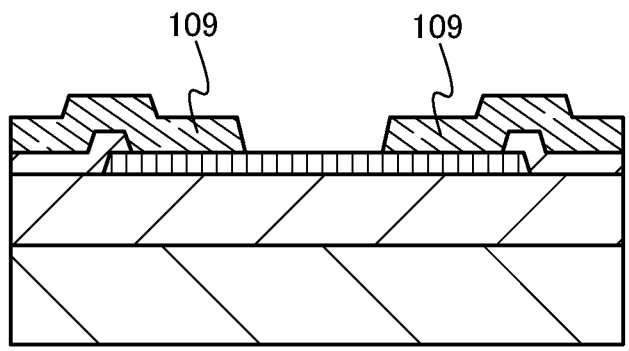
FIGS. 3A to 3C are cross-sectional views illustrating a manufacturing method of a semiconductor device according to an embodiment of the present invention.

Next, as illustrated in FIG. 3A, the pair of electrodes 109 is formed by a printing method or an inkjet method. Alternatively, after a conductive film is formed by a sputtering method, a CVD method, an evaporation method or the like, a mask is formed over the conductive film and the conductive film is etched, and thereby the pair of electrodes 109 is formed. The mask formed over the conductive film can be formed by a printing method, an inkjet method, or a photolithography method as appropriate. In the case of forming the pair of electrodes 109 with the use of a mask, the mask is removed later.

Figure 3B:
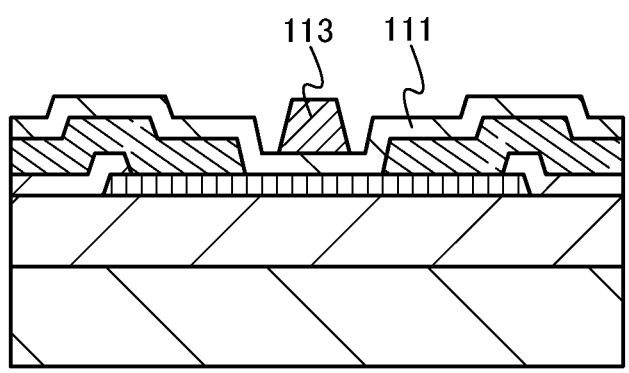

Next, as illustrated in FIG. 3B, the gate insulating film 111 is formed over the oxide semiconductor film 105, the protective film 107, and the pair of electrodes 109, and then the gate electrode 113 is formed over the gate insulating film 111.

The gate insulating film 111 may be formed using a thermal oxidation method, a CVD method, a sputtering method, or the like.

The gate electrode 113 is formed by a printing method or an inkjet method. Alternatively, after a conductive film is formed by a sputtering method, a CVD method, an evaporation method or the like, a mask is formed over the conductive film and the conductive film is etched, and thereby the gate electrode 113 is formed. The mask formed over the conductive film can be formed by a printing method, an inkjet method, or a photolithography method as appropriate. In the case of forming the gate electrode 113 with the use of a mask, the mask is removed later.

Figure 3C:
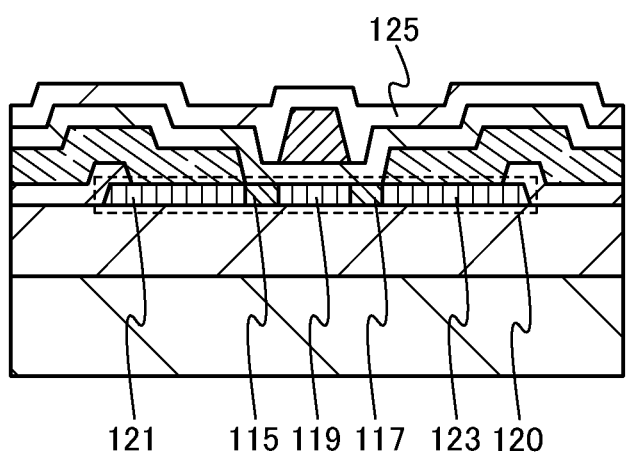

Next, treatment of adding a dopant to the oxide semiconductor film 105 is conducted, so that regions 115 and 117 containing a dopant are formed as illustrated in FIG. 3C. By using the gate electrode 113 and the pair of electrodes 109 as masks in adding a dopant, the regions 115 and 117 containing a dopant, into which the dopant is added, and the oxide semiconductor regions 119, 121, and 123, into which a dopant is not added, can be formed in a self-aligned manner. Note that the regions 115 and 117 containing a dopant function as electric-field relaxation regions. The oxide semiconductor region 119, the pair of regions 115 and 117 containing a dopant, and the pair of oxide semiconductor regions 121 and 123 are collectively referred to as the oxide semiconductor film 120.

As a method of adding a dopant to the oxide semiconductor film 105, an ion doping method or an ion implantation method can be used. As a dopant for addition, at least one element is selected from a Group 15 element such as nitrogen, phosphorus, or arsenic, hydrogen, helium, neon, argon, krypton, and xenon. Here, the pair of electrodes 109 and the gate electrode 113 are used as masks; accordingly, the regions 115 and 117 containing a dopant, into which the dopant is added, the oxide semiconductor region 119 which overlaps with the gate electrode 113 and is sandwiched between the regions 115 and 117 containing a dopant, and the oxide semiconductor regions 121 and 123 which overlap with the pair of electrodes 109 and between which the regions 115 and 117 containing a dopant are sandwiched, can be formed in a self-aligned manner.

In the embodiment describe here, the addition of the dopant to the oxide semiconductor film 105 is conducted in a state where the oxide semiconductor film 105 is covered with the insulating film and the like; alternatively, the addition of the dopant may be conducted in a state where the oxide semiconductor film 103 is exposed.

Further, the addition of the dopant may also be conducted using a method other than injection methods such as an ion doping method and an ion implantation method. For example, a dopant can be added in the following manner: plasma is generated in an atmosphere of a gas containing an element to be added and plasma treatment is performed on an object to which the dopant is added. A dry etching apparatus, a plasma CVD apparatus, a high-density plasma CVD apparatus, or the like can be used to generate the plasma.

Next, the insulating film 125 is formed and heat treatment is performed. The insulating film 125 is formed by a thermal oxidation method, a CVD method, a sputtering method, or the like, for example. The temperature of the heat treatment is typically higher than or equal to 150° C. and lower than or equal to 450° C., preferably higher than or equal to 250° C. and lower than or equal to 325° C. In the heat treatment, the temperature may be gradually increased from 250° C. to 325° C.

By the heat treatment, oxygen is diffused from the protective film 107 into the oxide semiconductor film 120, so that oxygen defects in the side surface of the oxide semiconductor film 120 can be reduced. Further, the resistance of the regions 115 and 117 containing a dopant can be reduced. In the heat treatment, the regions 115 and 117 containing a dopant may be in either a crystalline state or an amorphous state.

Figure 27:
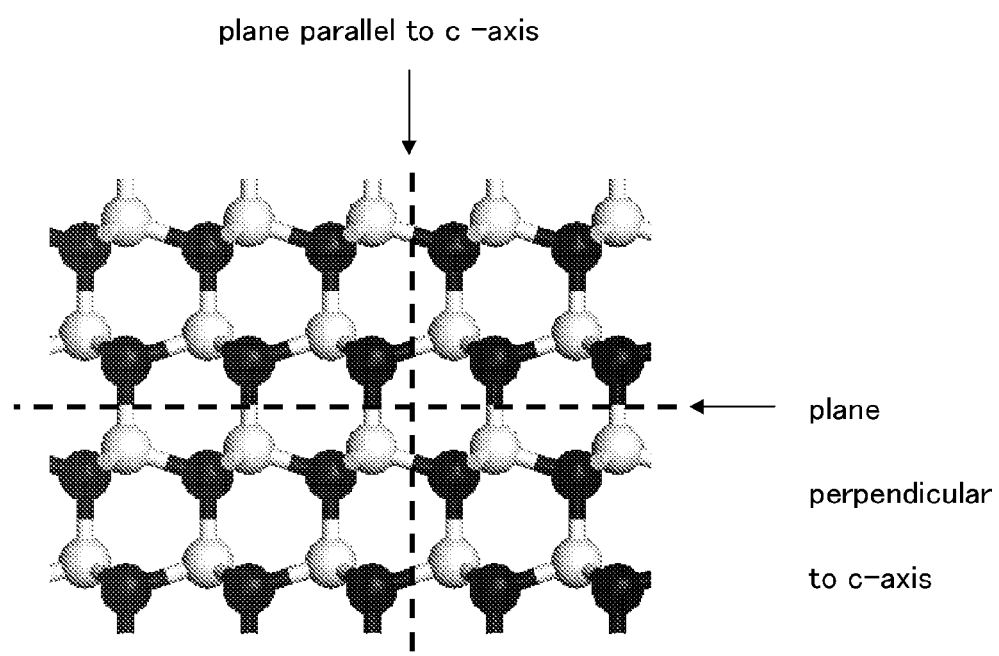
FIG. 27 is a diagram describing a model that is used for calculation.

Here, verification results on how easily oxygen vacancies are produced at a top surface and a side surface of an oxide semiconductor film, obtained through calculation using the following models, will be described. Note that a CAAC oxide semiconductor is complicated to calculate due to having a plurality of crystal planes on one side surface. Therefore, calculation was conducted here using a ZnO single crystal that has a wurtzite structure having c-axis alignment. As crystal models, the (001) plane, the (100) plane, and the (110) plane obtained by cutting the crystal structure along planes parallel to the c-axis and a plane perpendicular to the c-axis as shown in FIG. 27 were used.

After making the surface structures, calculation of the cases in which oxygen is released from the (100) plane, the (110) plane, and the (001) plane as shown in FIGS. 28A to 28C was conducted, and the easiness of release was compared between the surface structures.

A model was made by cutting the crystal structure to have the (001) plane on the surface. Since the calculation was conducted using a three-dimensional periodic structure, the model was a slab model having two (001) planes and having a vacuum region of 1 nm. Similarly, a slab model having the (100) plane on the surface and a slab model having the (110) plane on the surface were made as examples of the side surface because the side surface is assumed to be perpendicular to the (001) plane. By calculating these two planes, a tendency to release oxygen from planes perpendicular to the (001) plane can be analyzed. In this case also, the vacuum region is 1 nm. The number of atoms in the (100) plane model, the (110) plane model, and the (001) plane model were set to be 64, 108, and 108, respectively. Further, structures which were obtained by removing oxygen from the respective surfaces of the above three structures were made.

For the calculation, CASTEP, which is a program using the density functional theory, was used. A plane wave basis pseudopotential method was used as a method for the density functional theory, and GGA-PBE was used for a functional. First, in a four-atom unit cell of a wurtzite structure, structural optimization including a lattice constant was performed. Next, based on the optimized structure, the surface structure was made. Then, the surface structure with an oxygen vacancy and the surface structure without an oxygen vacancy were subjected to structural optimization with a lattice constant fixed. Energy after the structural optimization was used.

The cut-off energy was assumed to be 380 eV in unit cell calculation and 300 eV in surface structure calculation. The k-point grid size was 9×9×6 in the unit cell calculation, 3×2×1 in the (100) plane model calculation, 1×2×2 in the (110) plane model calculation, and 2×2×1 in the (001) plane model calculation.

The following calculation was performed on the above surface structures to obtain an energy difference (here, referred to as a binding energy): the energy of the structure with an oxygen vacancy and half the energy of an oxygen molecule are added, and the energy of the structure without an oxygen vacancy is subtracted therefrom. Oxygen is more likely to be released on the surface having a lower binding energy.

(Binding energy)=(Energy of the structure with an oxygen vacancy)+(Half the energy of an oxygen molecule)−(Energy of the structure without an oxygen vacancy) [Formula 2]

Binding energies of the respective surfaces obtained according to Formula 2 are shown in Table 1.

TABLE 1

|  | Binding energy |
| --- | --- |
| (100) plane model | 2.89 |
| (110) plane model | 2.64 |
| (001) plane model | 3.38 |

From the result in Table 1, it can be said that binding energies of the (100) plane and the (110) plane are lower than that of the (001) plane and oxygen is more likely to be released from the (100) plane and the (110) plane than from the (001) plane. In other words, it can be found that oxygen is more likely to be released from the side surface than the top surface of the ZnO film having c-axis alignment in a direction perpendicular to the top surface. Although ZnO which is an example of CAAC oxide semiconductors has mixed various crystal planes, it has the same kind of planes as a ZnO single crystal on its side surface. Therefore, it can be said that a tendency to release oxygen of the ZnO is similar to that of the ZnO single crystal.

When an oxide semiconductor film is selectively etched, for example when a side surface of an oxide semiconductor film is exposed to plasma including chlorine radicals, fluorine radicals, or the like in dry etching, metal atoms exposed on the side surface of the oxide semiconductor film are bonded with the chlorine radicals, the fluorine radicals, or the like. At this time, the bonds of the metal atoms and the chlorine atoms or the fluorine atoms are released and consequently oxygen atoms which had been bonded with the metal atoms in the oxide semiconductor film become active. The active oxygen atoms are easily reacted and adsorbed. Thus, oxygen vacancies are likely to be generated on the side surface of the oxide semiconductor film.

For these reasons, in the transistor described in this embodiment, after the oxide semiconductor film is formed over the oxide insulating film from which part of oxygen is released by heat treatment, heat treatment is performed. In this way, oxygen vacancies in the oxide semiconductor film can be reduced and the interface state density at the interface between the oxide insulating film and the oxide semiconductor film can be reduced. Further, an oxide insulating film from which part of oxygen is released by heat treatment is formed as the protective film which covers the end portion of the oxide semiconductor film that is formed by selective etching of the oxide semiconductor film. As a result, the side surface of the etched oxide semiconductor film is not exposed to a reduced-pressure atmosphere and an etchant, so that oxygen vacancies generated on the side surface of the oxide semiconductor film can be reduced. Furthermore, by subsequent heat treatment, oxygen is diffused from the protective film into the oxide semiconductor film; accordingly, even when oxygen defects are generated at the side surface of the oxide semiconductor film, the oxygen defects can be compensated for. Therefore, the negative shift of the threshold voltage of the transistor can be reduced and, in addition, a leakage current between a source and a drain of the transistor can be reduced; accordingly, electrical characteristics of the transistor can be improved.

(Embodiment 2)

In this embodiment, a method for manufacturing the transistor of FIGS. 1A to 1D, which is different from that described in Embodiment 1, will be described with reference to FIGS. 3A to 3C and FIGS. 4A to 4D.

Figure 4A:
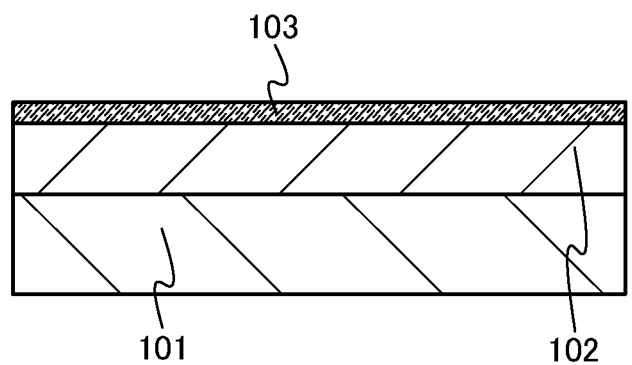
FIGS. 4A to 4D are cross-sectional views illustrating a manufacturing method of a semiconductor device according to an embodiment of the present invention.
Figure 4B:
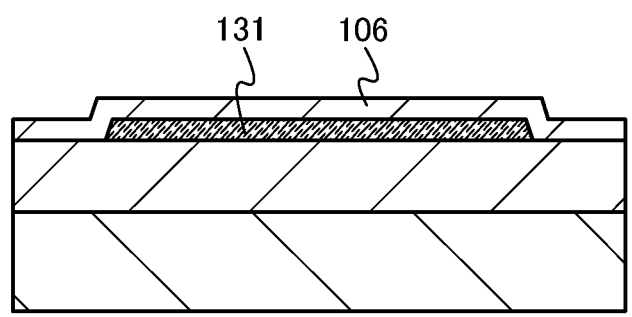

In a manner similar to that of Embodiment 1, the oxide insulating film 102 is formed over the substrate 101 as illustrated in FIG. 4A. Next, the oxide semiconductor film 103 is formed over the oxide insulating film 102. It is preferable that the oxide insulating film 102 and the oxide semiconductor film 103 be formed successively. A multi-chamber sputtering apparatus having a heating apparatus may be employed in the following manner: the oxide insulating film 102 is formed and heated with the heating apparatus so that hydrogen is released, and then the oxide semiconductor film 103 is formed over the oxide insulating film 102.

Then, a mask is formed over the oxide semiconductor film 103, and the oxide semiconductor film 103 is selectively etched with the use of the mask, so that an oxide semiconductor film 131 is formed. Then, the mask is removed. Next, the oxide insulating film 106 is formed over the oxide semiconductor film 131 (see FIG. 4B). The oxide insulating film 102 and the oxide insulating film 106 are each formed using an oxide insulating film from which part of oxygen is released by heat treatment. As such an oxide insulating film from which part of oxygen is released by heat treatment, an oxide insulating film containing oxygen at a proportion exceeding the stoichiometric proportion is preferably used.

Figure 4C:
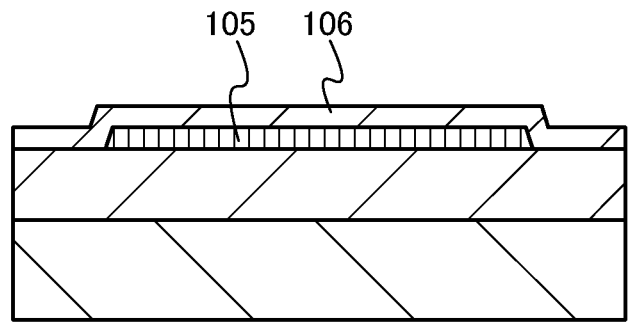

Next, heat treatment is performed on the substrate 101, so that hydrogen is released from the oxide semiconductor film 131 and part of oxygen contained in the oxide insulating film 102 and the oxide insulating film 106 is diffused into the oxide semiconductor film 131 and the vicinity of the interface with the oxide semiconductor film 131 in the oxide insulating films 102 and 106. As a result, as illustrated in FIG. 4C, the oxide semiconductor film 105 with reduced hydrogen concentration and reduced oxygen defects can be formed.

This embodiment is different from Embodiment 1 in that oxygen is diffused from the oxide insulating film 102 and the oxide insulating film 106 into the oxide semiconductor film 131. In this embodiment, not only a top surface of the oxide semiconductor film 131 but also a side surface of the oxide semiconductor film 131 is covered with the oxide insulating film 106. Accordingly, by the heat treatment, oxygen defects in the oxide semiconductor film 131 can be reduced and the interface state density at the interface between the oxide semiconductor film 131 and the oxide insulating films 102 and 106 can be reduced. In addition, oxygen is supplied to oxygen defects in the side surface of the oxide semiconductor film 131; accordingly, even when oxygen defects are generated in the side surface of the oxide semiconductor film 131, the oxygen defects can be compensated for.

In the case where a blocking film is provided over the oxide insulating film 106, oxygen can be prevented from being released to the outside from the oxide insulating film 106 in the heat treatment. As the blocking film, a silicon nitride film, a silicon nitride oxide film, an aluminum oxide film, an aluminum nitride film, an aluminum oxynitride film, an aluminum nitride oxide film, a diamond-like carbon film, or the like can be used.

Figure 4D:
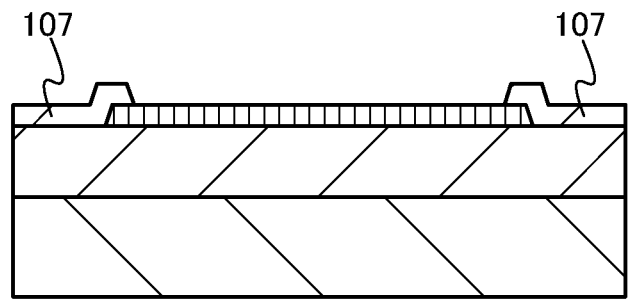

Next, a mask is formed over the oxide insulating film 106, the oxide insulating film 106 is selectively etched with the use of the mask, and then the protective film 107 is formed (see FIG. 4D). The protective film 107 covers at least the end portion of the oxide semiconductor film 105; therefore, the side surface of the oxide semiconductor film 105 is not exposed to a reduced-pressure atmosphere in a subsequent manufacturing process. In addition, a sidewall of the oxide semiconductor film 105 is not exposed to an etchant in a later etching step. Consequently, the release of oxygen from the side surface of the oxide semiconductor film 105 and generation of oxygen defects owing to the release can be prevented. Further, since the side surface of the oxide semiconductor film 105 is not in contact with the pair of electrodes 109, generation of a leakage current in a region in the vicinity of the side surface of the oxide semiconductor film 105 can be suppressed.

Then, through the process in FIGS. 3A to 3C, a transistor similar to that of FIGS. 1A to 1D, in which the negative shift of the threshold voltage is reduced and a leakage current between a source and a drain is reduced, can be manufactured.

(Embodiment 3)

In this embodiment, a method for manufacturing a transistor, which is different from those described in Embodiment 1 and Embodiment 2, will be described with reference to FIGS. 3A to 3C, FIGS. 5A to 5C, and FIG. 6. This embodiment will be described as another embodiment of the method for manufacturing a transistor in Embodiment 1; however, Embodiment 2 can be applied to this embodiment as appropriate. FIG. 6 is a top view illustrating a formation step of an insulating film 145, and FIG. 5A is a cross-sectional view taken along a dashed-dotted line A-B in FIG. 6.

Figure 5A:
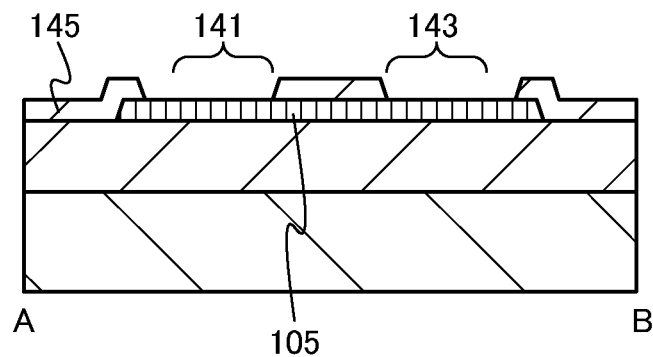
FIGS. 5A to 5C are cross-sectional views illustrating a manufacturing method of a semiconductor device according to an embodiment of the present invention.
Figure 5B:
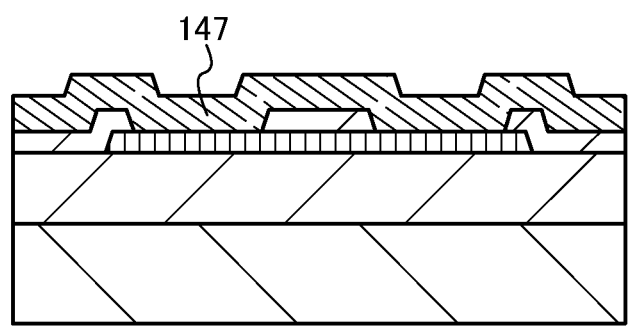
Figure 5C:
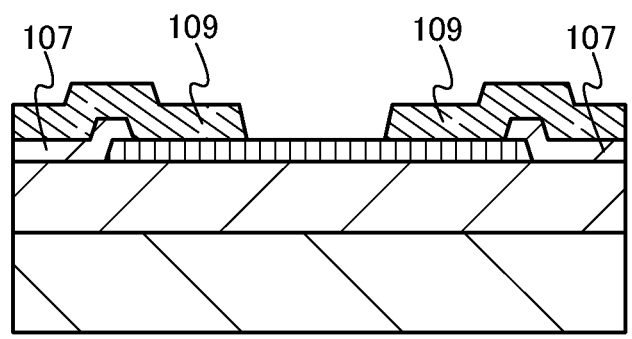
Figure 6:
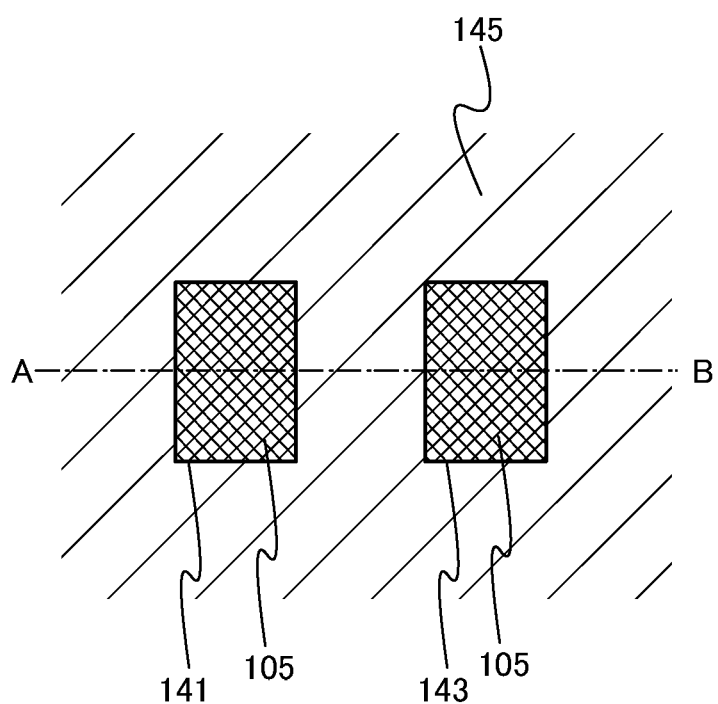
FIG. 6 is a top view illustrating a manufacturing method of a semiconductor device according to an embodiment of the present invention.

In a manner similar to that of Embodiment 1, after the process of FIGS. 2A to 2D, as illustrated in FIG. 5A and FIG. 6, an insulating film 145 having an opening 141 and an opening 143 is formed. Next, as illustrated in FIG. 5B, a conductive film 147 is formed over the oxide semiconductor film 105 and the insulating film 145. The conductive film 147 can be formed as appropriate using a material and a formation method which are similar to those of the pair of electrodes 109 described in Embodiment 1.

Next, in a manner similar to that of Embodiment 1, a mask is formed over the conductive film 147 and the conductive film 147 is selectively etched with the use of the mask, so that the pair of electrodes 109 is formed. Next, the insulating film 145 is etched so as to cover the end portion of the oxide semiconductor film 105, so that the protective film 107 is formed. Through the above-described process, the protective film 107 which covers the end portion of the oxide semiconductor film 105 and the pair of electrodes 109 in contact with the oxide semiconductor film 105 can be formed. The protective film 107 covers the end portion of the oxide semiconductor film 105; therefore, the side surface of the oxide semiconductor film 105 is not exposed to a reduced-pressure atmosphere in a subsequent manufacturing process. In addition, a sidewall of the oxide semiconductor film 105 is not exposed to an etchant in a later etching step. Consequently, the release of oxygen from the side surface of the oxide semiconductor film 105 and generation of oxygen defects owing to the release can be prevented. Further, since the side surface of the oxide semiconductor film 105 is not in contact with the pair of electrodes 109, generation of a leakage current in a region in the vicinity of the side surface of the oxide semiconductor film 105 can be suppressed.

Then, through the process in FIGS. 3A to 3C in a manner similar to that of Embodiment 1, a transistor, in which the negative shift of the threshold voltage is reduced and a leakage current between a source and a drain is reduced, can be manufactured.

(Embodiment 4)

In this embodiment, a structure of a transistor having a structure different from that of Embodiments 1 and 2 and a method for manufacturing the transistor will be described with reference to FIGS. 2A to 2E, FIGS. 3A to 3C, FIGS. 7A and 7B, and FIGS. 8A to 8C. This embodiment will be described as another embodiment of the method for manufacturing a transistor in Embodiment 1; however, this embodiment can be applied to Embodiment 2 as appropriate.

Figure 7A:
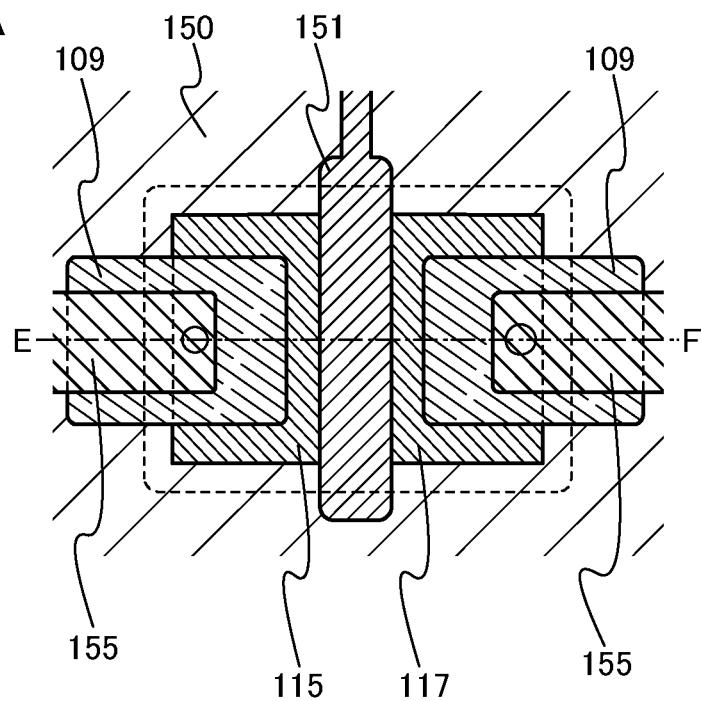
FIG. 7A is a top view illustrating a semiconductor device according to an embodiment of the present invention and FIG. 7B is a cross-sectional view thereof.
Figure 7B:
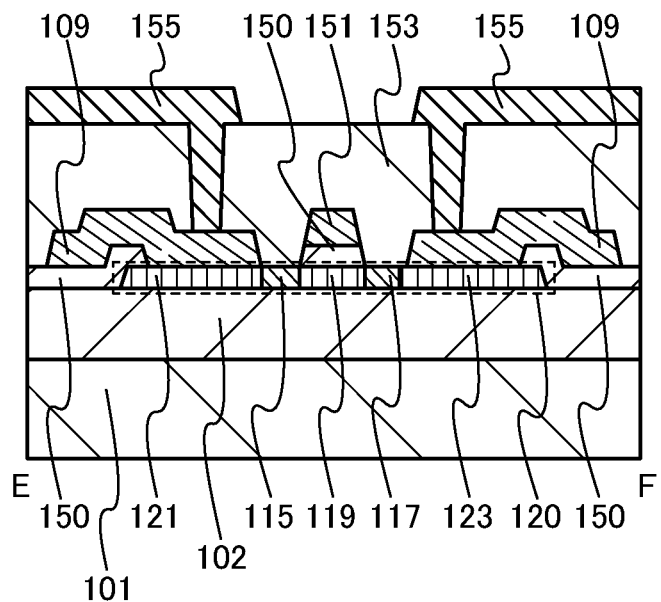

FIGS. 7A and 7B are a top view and a cross-sectional view, respectively, of a transistor of this embodiment. FIG. 7A is the top view of the transistor of this embodiment, and FIG. 7B is the cross-sectional view taken along a dashed-dotted line E-F in FIG. 7A. Note that in FIG. 7A, some of components of the transistor (e.g., an insulating film 153 and the like) are not shown for simplicity.

The transistor illustrated in FIGS. 7A and 7B includes the oxide insulating film 102 provided over the substrate 101, the oxide semiconductor film 120 provided over the oxide insulating film 102, a protective film 150 which covers the end portion of the oxide semiconductor film 120 and part of which functions as a gate insulating film, the pair of electrodes 109 formed over the protective film 150 and in contact with the oxide semiconductor film 120, and a gate electrode 151 which is located over the protective film 150 and overlaps with the oxide semiconductor film 120. In addition, the insulating film 153 which covers the pair of electrodes 109, the oxide semiconductor film 120, the protective film 150, and the gate electrode 151 is included. Further, in openings provided in the insulating film 153, a pair of wirings 155 connected to the pair of electrodes 109 is included. The oxide semiconductor film 120 includes the oxide semiconductor region 119 overlapping with the gate electrode 151, the pair of regions 115 and 117 containing a dopant between which the oxide semiconductor region 119 is sandwiched, and the pair of oxide semiconductor regions 121 and 123 between which the pair of regions 115 and 117 containing a dopant is sandwiched and which is in contact with the pair of electrodes 109. Note that the pair of regions 115 and 117 containing a dopant functions as electric-field relaxation regions, and the pair of oxide semiconductor regions 121 and 123 functions as a source region and a drain region.

In this embodiment, the protective film 150 covers the end portion of the oxide semiconductor film 120 and is used as a gate insulating film. As a result, the number of steps can be reduced. Since the gate electrode 151 and the pair of electrodes 109 are formed from the same layer, the pair of wirings 155 that is electrically connected to the pair of electrodes 109 and a scan line part of which is the gate electrode 151 are arranged to intersect with each other with the insulating film 153 interposed therebetween, in order that the scan line part of which is the gate electrode 151 is not in contact with a signal line connected to the pair of electrodes 109.

Next, a method for manufacturing the transistor in FIGS. 7A and 7B will be described with reference to FIGS. 2A to 2E, FIGS. 3A to 3C, and FIGS. 8A to 8C.

Figure 8A:
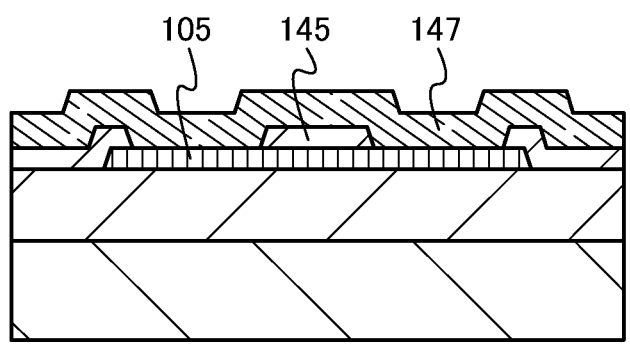
FIGS. 8A to 8C are cross-sectional views illustrating a manufacturing method of a semiconductor device according to an embodiment of the present invention.
Figure 8B:
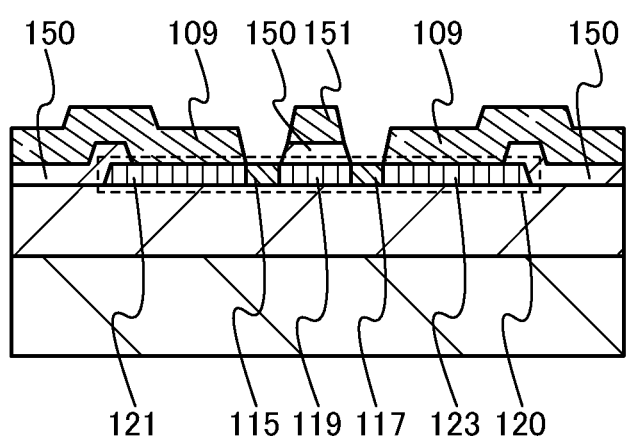
Figure 8C:
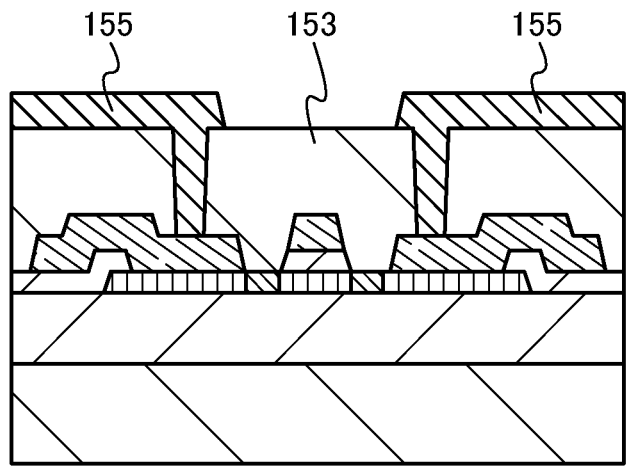

In a manner similar to that of Embodiment 1, after the process of FIGS. 2A to 2D, as illustrated in FIG. 8A, an insulating film 145 having openings is formed. Then, the conductive film 147 is formed over the oxide semiconductor film 105 and the insulating film 145.

Next, a mask is formed over the conductive film 147 and the conductive film 147 is selectively etched with the use of the mask, so that the pair of electrodes 109 and the gate electrode 151 are formed. Then, the mask is removed. Next, a mask is formed over the pair of electrodes 109, the insulating film 145, and the gate electrode 151, and then the insulating film 145 in a region which is covered with neither the pair of electrodes 109 nor the gate electrode 151 is etched so that the insulating film 145 covers the end portion of the oxide semiconductor film 105. Thus, the protective film 150 which covers the end portion of the oxide semiconductor film 105 and functions as a gate insulating film is formed. Then, the mask is removed.

Next, through a process similar to that of Embodiment 1, by the step illustrated in FIG. 3C, treatment of adding a dopant to the oxide semiconductor film 105 is conducted, so that regions 115 and 117 containing a dopant are formed. By using the gate electrode 151 and the pair of electrodes 109 as masks in adding a dopant, the regions 115 and 117 containing a dopant, into which the dopant is added, and the oxide semiconductor regions 119, 121, and 123, into which a dopant is not added, can be formed in a self-aligned manner. Note that the regions 115 and 117 containing a dopant function as electric-field relaxation regions. The oxide semiconductor region 119, the pair of regions 115 and 117 containing a dopant, and the pair of oxide semiconductor regions 121 and 123 are collectively referred to as the oxide semiconductor film 120.

Next, the insulating film 153 is formed over the oxide semiconductor film 120, the pair of electrodes 109, the protective film 150, and then a mask is formed over the insulating film 153, and the insulating film 153 is selectively etched to form openings. Then, the mask is removed. Next, the pair of wirings 155 which is in contact with the pair of electrodes 109 is formed in the openings, and heat treatment is performed (see FIG. 8C). By the heat treatment, oxygen is diffused from the protective film 150 into the oxide semiconductor film 120, so that oxygen defects in the side surface of the oxide semiconductor film 120 can be reduced. Further, the resistance of the regions 115 and 117 containing a dopant can be reduced. In the heat treatment, the regions 115 and 117 containing a dopant may be in either a crystalline state or an amorphous state.

The insulating film 153 can be formed as appropriate using a material and a formation method which are similar to those of the insulating film 125 described in Embodiment 1. The insulating film 153 may be formed using an organic resin such as polyimide, an acrylic resin, or an epoxy resin.

The pair of wirings 155 can be formed using a material and a formation method which are similar to those of the pair of electrodes 109.

Through the above-described process, a transistor as illustrated in FIGS. 7A and 7B, in which the negative shift of the threshold voltage is reduced and a leakage current between a source and a drain is reduced, can be manufactured.

(Embodiment 5)

In this embodiment, a transistor having a structure different from those of Embodiments 1 to 4 and a method for manufacturing the transistor will be described with reference to FIGS. 9A to 9C, FIGS. 10A to 10D, and FIGS. 11A to 11D.

Figure 9A:
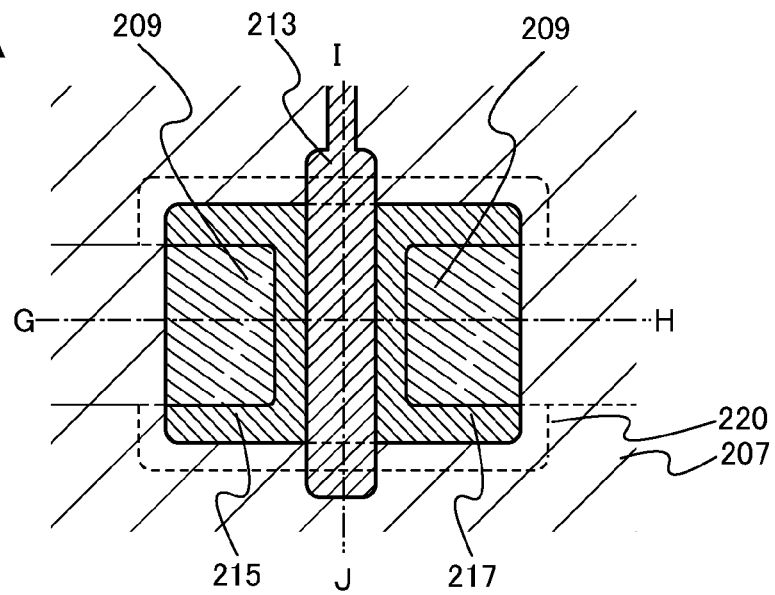
FIG. 9A is a top view illustrating a manufacturing method of a semiconductor device according to an embodiment of the present invention and FIGS. 9B and 9C are cross-sectional views thereof.
Figure 9B:
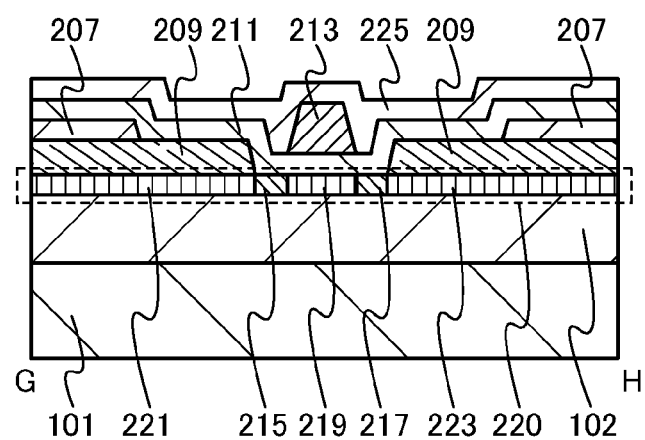
Figure 9C:
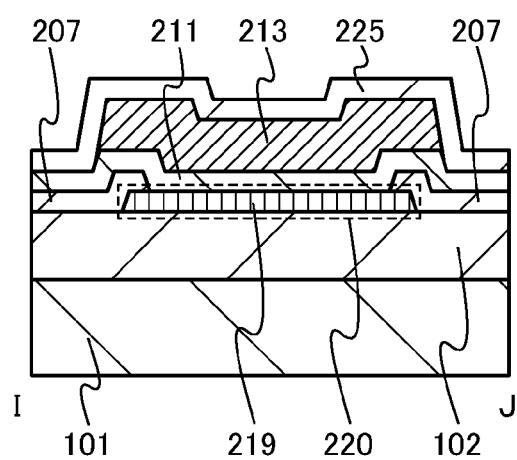

FIGS. 9A to 9C are a top view and cross-sectional views of a transistor described in this embodiment. FIG. 9A is the top view of the transistor described in this embodiment, FIG. 9B is the cross-sectional view taken along a dashed-dotted line G-H in FIG. 9A, and FIG. 9C is the cross-sectional view taken along a dashed-dotted line I-J in FIG. 9A. In FIG. 9A, some of components of the transistor (e.g., a gate insulating film 211, an insulating film 225, and the like) are not shown for simplicity.

The transistor illustrated in FIG. 9A includes the oxide insulating film 102 provided over the substrate 101, an oxide semiconductor film 220 provided over the oxide insulating film 102, a pair of electrodes 209 in contact with the oxide semiconductor film 220, a protective film 207 which covers an end portion of the oxide semiconductor film 220 and also covers part of the pair of electrodes 209, the gate insulating film 211 which covers the protective film 207, the pair of electrodes 209, and the oxide semiconductor film 220, and a gate electrode 213 which is located over the gate insulating film 211 and overlaps with the oxide semiconductor film 220. In addition, the insulating film 225 which covers the gate insulating film 211 and the gate electrode 213 may be included. The oxide semiconductor film 220 includes an oxide semiconductor region 219 overlapping with the gate electrode 213, a pair of regions 215 and 217 containing a dopant between which the oxide semiconductor region 219 is sandwiched, and a pair of oxide semiconductor regions 221 and 223 between which the pair of regions 215 and 217 containing a dopant is sandwiched and which is in contact with the pair of electrodes 209. Note that the oxide semiconductor region 219 functions as a channel region, the pair of regions 215 and 217 containing a dopant functions as electric-field relaxation regions, and the pair of oxide semiconductor regions 221 and 223 functions as a source region and a drain region.

Note that the oxide semiconductor film 220, the pair of electrodes 209, the protective film 207, the gate insulating film 211, the gate electrode 213, and the insulating film 225 can be formed using materials similar to those of the oxide semiconductor film 120, the pair of electrodes 109, the protective film 107, the gate insulating film 111, the gate electrode 113, and the insulating film 125 described in Embodiment 1, respectively. In addition, the oxide semiconductor region 219, the pair of regions 215 and 217 containing a dopant, and the pair of oxide semiconductor regions 221 and 223 can be formed using materials similar to those of the oxide semiconductor region 119, the pair of regions 115 and 117 containing a dopant, and the pair of oxide semiconductor regions 121 and 123 described in Embodiment 1, respectively.

Next, a method for manufacturing the transistor illustrated in FIGS. 9A to 9C will be described with reference to FIGS. 10A to 10D and FIGS. 11A to 11D.

Figure 10A:
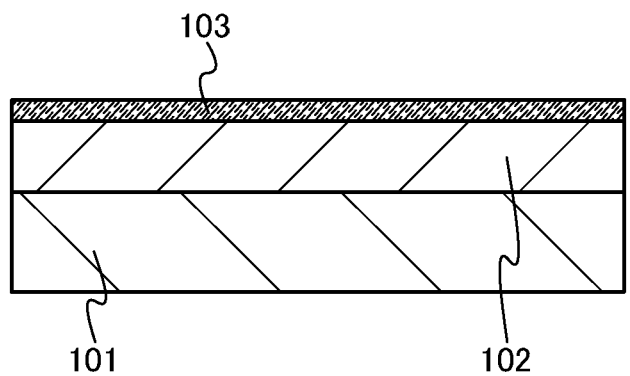
FIGS. 10A to 10D are cross-sectional views illustrating a manufacturing method of a semiconductor device according to an embodiment of the present invention.

In a manner similar to that of Embodiment 1, the oxide insulating film 102 is formed over the substrate 101 as illustrated in FIG. 10A. Next, the oxide semiconductor film 103 is formed over the oxide insulating film 102. It is preferable that the oxide insulating film 102 and the oxide semiconductor film 103 be formed successively. A multi-chamber sputtering apparatus having a heating apparatus may be employed in the following manner: the oxide insulating film 102 is formed and heated with the heating apparatus so that hydrogen is released and the oxide semiconductor film 103 is formed over the oxide insulating film 102.

Figure 10B:
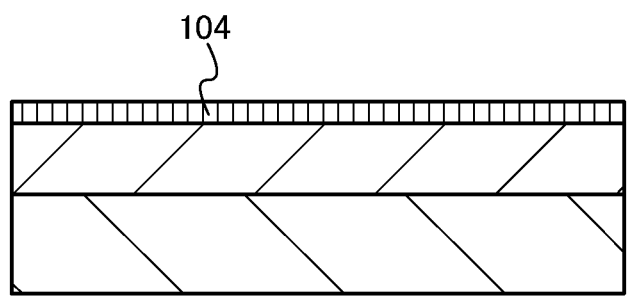

Next, heat treatment is performed on the substrate 101, so that hydrogen is released from the oxide semiconductor film and part of oxygen contained in the oxide insulating film 102 is diffused into the oxide semiconductor film and the vicinity of the interface with the oxide semiconductor film in the oxide insulating film 102. As a result, as illustrated in FIG. 10B, an oxide semiconductor film 104 with reduced hydrogen concentration and reduced oxygen defects can be formed.

Figure 10C:
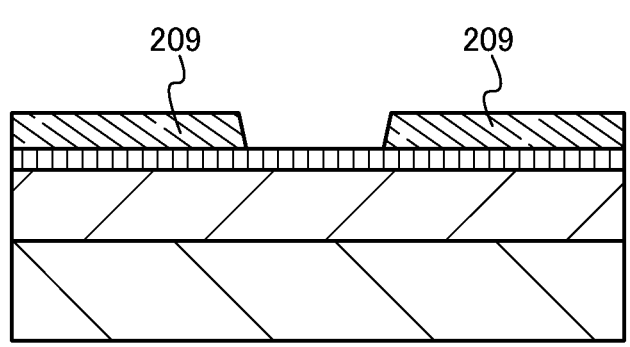

Next, as illustrated in FIG. 10C, the pair of electrodes 209 is formed over the oxide semiconductor film 104. The pair of electrodes 209 can be formed in a manner similar to that of the pair of electrodes 109 described in Embodiment 1.

In this embodiment, after the oxide semiconductor film 103 is formed over the oxide insulating film 102, the heat treatment is performed to diffuse part of oxygen contained in the oxide insulating film 102 into the oxide semiconductor film and the vicinity of the interface with the oxide semiconductor film in the oxide insulating film 102; however, the heat treatment may be performed after a conductive film for forming the above-described pair of electrodes 209 is formed.

Figure 10D:
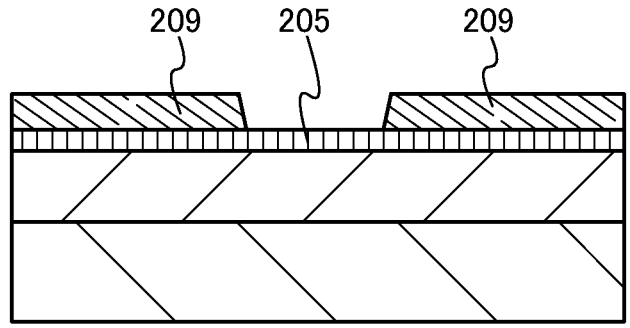

Next, a mask is formed over the oxide semiconductor film 104 and the pair of electrodes 209, and the oxide semiconductor film 104 is selectively etched, so that an oxide semiconductor film 205 is formed (see FIG. 10D). Through the above-described process, the oxide semiconductor film 205 which overlaps with the pair of electrodes 209 and part of which is exposed can be formed as shown by the oxide semiconductor film 220 in FIG. 9A. Then, the mask is removed. Note that when a stripping solution is used for removing the mask, oxygen may be released from a side surface of the oxide semiconductor film 205 in some cases. Therefore, an ashing method may alternatively be used for removing the mask.

Figure 11A:
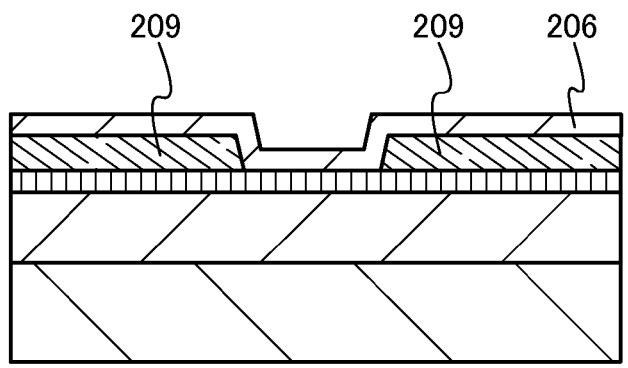
FIGS. 11A to 11D are cross-sectional views illustrating a manufacturing method of a semiconductor device according to an embodiment of the present invention.
Figure 11B:
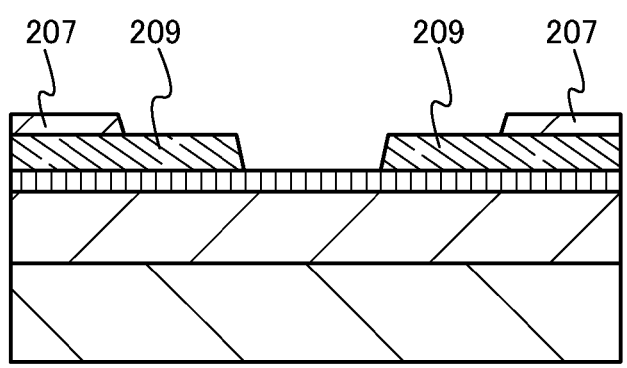

Next, as illustrated in FIG. 11A, an oxide insulating film 206 is formed over the oxide semiconductor film 205 and the pair of electrodes 209. The oxide insulating film 206 is formed using an oxide insulating film from which part of oxygen is released by heat, in a manner similar to that of the oxide insulating film 106 described in Embodiment 1. As the oxide insulating film from which part of oxygen is released by heat treatment, an oxide insulating film containing oxygen at a proportion exceeding the stoichiometric proportion is preferably used.

Even in the case where oxygen defects are generated in the side surface of the oxide semiconductor film 205 owing to the release of oxygen, by using an oxide insulating film from which part of oxygen is released by heat as the oxide insulating film 206, oxygen defects at the side surface of the oxide semiconductor film 205 can be reduced by later heat treatment.

Next, a mask is formed over the oxide insulating film 206, the oxide insulating film 206 is selectively etched with the use of the mask, and then the protective film 207 is formed. Then, the mask is removed (see FIG. 11B). Through the process, the protective film 207 which covers part of the pair of electrodes 209 and an exposed end portion of the oxide semiconductor film 205, which is not covered by the pair of electrodes 209, can be formed. Thus, the side surface of the oxide semiconductor film 205 is not exposed to a reduced-pressure atmosphere in a subsequent manufacturing process. In addition, a sidewall of the oxide semiconductor film 205 is not exposed to an etchant in a later etching step. Furthermore, since the oxide semiconductor film 104 is etched to form the oxide semiconductor film 205 after the pair of electrodes is formed, and then the insulating film covering the side surface of the oxide semiconductor film 205 is formed, the oxide semiconductor film overlapping with the pair of electrodes is formed. Consequently, the release of oxygen from the side surface of the oxide semiconductor film 205 and generation of oxygen defects owing to the release can be prevented. Further, since the side surface of the oxide semiconductor film 205 is not in contact with the pair of electrodes 209, generation of a leakage current in a region in the vicinity of the side surface of the oxide semiconductor film 205 can be suppressed.

Figure 11C:
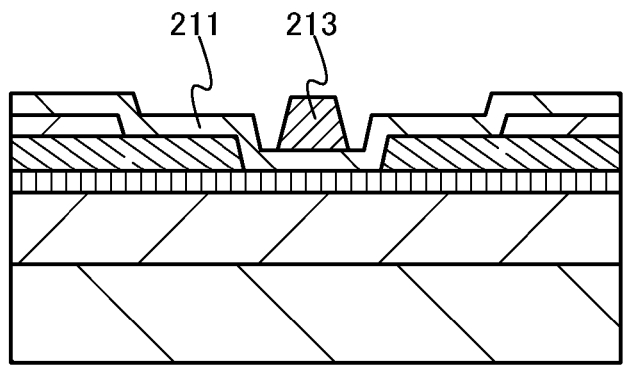

Next, as illustrated in FIG. 11C, the gate insulating film 211 is formed over the oxide semiconductor film 205, the protective film 207, and the pair of electrodes 209 in a manner similar to that of Embodiment 1, and the gate electrode 213 is formed over the gate insulating film 211.

Figure 11D:
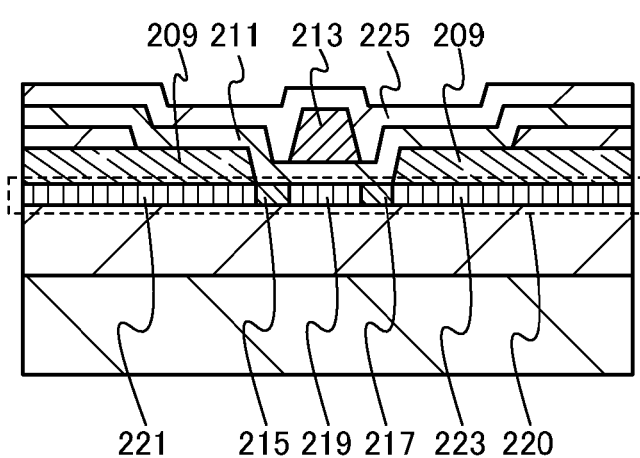

Next, treatment of adding a dopant to the oxide semiconductor film 205 is conducted, so that regions 215 and 217 containing a dopant are formed as illustrated in FIG. 11D. By using the gate electrode 213 and the pair of electrodes 209 as masks in adding a dopant, the regions 215 and 217 containing a dopant, into which the dopant is added, and the oxide semiconductor regions 219, 221, and 223, into which a dopant is not added, can be formed in a self-aligned manner. Note that the regions 215 and 217 containing a dopant function as electric-field relaxation regions.

Next, the insulating film 225 is formed and heat treatment is performed. By the heat treatment, oxygen is diffused from the protective film 207 into the oxide semiconductor film 205, so that oxygen defects in the side surface of the oxide semiconductor film can be reduced. Further, the release of oxygen from the oxide semiconductor film 205 can be reduced, and the resistance of the regions 215 and 217 containing a dopant can be reduced. In the heat treatment, the regions 215 and 217 containing a dopant may be in either a crystalline state or an amorphous state.

Through the above-described process, a transistor as illustrated in FIGS. 9A to 9C, in which the negative shift of the threshold voltage is reduced and a leakage current between a source and a drain is reduced, can be manufactured.

(Embodiment 6)

In this embodiment, a transistor having a structure different from those of Embodiments 1 to 5 will be described with reference to FIG. 12.

A cross-sectional structure of a transistor described in this embodiment will be described with reference to FIG. 12.

Figure 12:
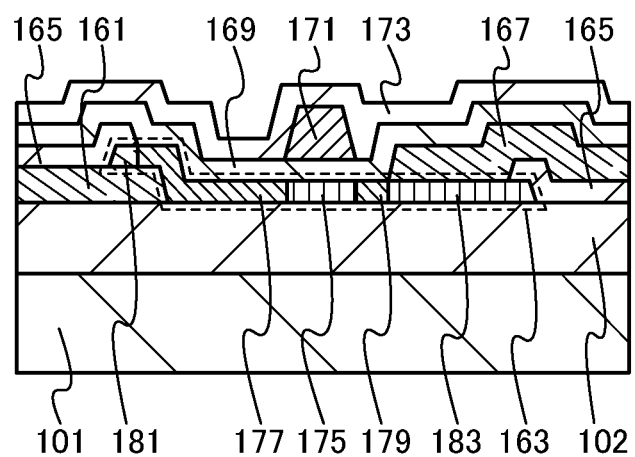
FIG. 12 is a cross-sectional view illustrating a semiconductor device and a manufacturing method thereof according to an embodiment of the present invention.

The transistor in FIG. 12 includes the oxide insulating film 102 provided over the substrate 101, one electrode 161 of a pair of electrodes provided over the oxide insulating film 102, an oxide semiconductor film 163 in contact with the one electrode 161 of the pair of electrodes, a protective film 165 which covers an end portion of the oxide semiconductor film 163 and part of the one electrode 161 of the pair of electrodes, the other electrode 167 of the pair of electrodes which is formed over the protective film 165 and is in contact with the oxide semiconductor film 163, a gate insulating film 169 which covers the protective film 165, the oxide semiconductor film 163, and the other electrode 167 of the pair of electrodes, and a gate electrode 171 which overlaps with the oxide semiconductor film 163 with the gate insulating film 169 interposed therebetween. An insulating film 173 covering the gate insulating film 169 and the gate electrode 171 may be included.

The oxide semiconductor film 163 includes an oxide semiconductor region 175 overlapping with the gate electrode 171, a pair of regions 177 and 179 containing a dopant between which the oxide semiconductor region 175 is sandwiched, and a pair of oxide semiconductor regions 181 and 183 between which the pair of regions 177 and 179 containing a dopant is sandwiched and which is in contact with the one electrode 161 and the other electrode 167 of the pair of electrodes. The oxide semiconductor region 175 functions as a channel region, the pair of regions 177 and 179 containing a dopant functions as electric-field relaxation regions, and the pair of oxide semiconductor regions 181 and 183 functions as a source region and a drain region.

Next, a manufacturing method of the transistor described in this embodiment will be described below. This embodiment will be described as an application mode of the method for manufacturing a transistor in Embodiment 1; however, this embodiment can be applied to any of Embodiments 2 to 5 as appropriate.

In the transistor described in this embodiment, the one electrode 161 of the pair of electrodes is formed before the oxide semiconductor film 103 is formed over the oxide insulating film 102. Next, through a process similar to that of Embodiment 1, the protective film 165 is formed over the selectively etched oxide semiconductor film, and the other electrode 167 of the pair of electrodes is formed. Then, in a manner similar to that of Embodiment 1, the gate insulating film 169 and the gate electrode 171 are formed. Next, a dopant is added with the use of the gate electrode, the protective film 165, and the other electrode 167 of the pair of electrodes as masks, so that the oxide semiconductor film 163 including the oxide semiconductor region 175, the pair of regions 177 and 179 containing a dopant, and the pair of oxide semiconductor regions 181 and 183 can be formed. After the insulating film 173 is formed, heat treatment may be performed in a manner similar to that of Embodiment 1.

Through the above-described process, the transistor illustrated in FIG. 12 can be manufactured.

(Embodiment 7)

In this embodiment, a method for forming a protective film, which is different from those described in Embodiments 1 to 6, will be described with reference to FIGS. 13A to 13D.

Figure 13A:
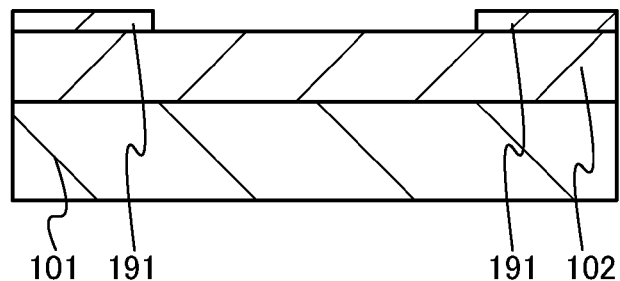
FIGS. 13A to 13D are cross-sectional views illustrating a manufacturing method of a semiconductor device according to an embodiment of the present invention.

As illustrated in FIG. 13A, the oxide insulating film 102 is formed over the substrate 101. Next, an oxide insulating film 191 that is to be a protective film later is formed over the oxide insulating film 102. The oxide insulating film 191 is formed so that the oxide insulating film 102 is exposed in a region where an oxide semiconductor film 197 formed later as illustrated in FIG. 13D is to be located.

The oxide insulating film 191 is formed using an oxide insulating film from which part of oxygen is released by heat in a manner similar to that of the oxide insulating film 102. As such an oxide insulating film from which part of oxygen is released by heat treatment, an oxide insulating film containing oxygen at a proportion exceeding the stoichiometric proportion is preferably used.

Figure 13B:
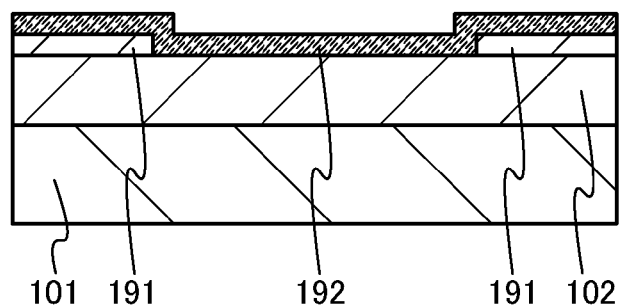
Figure 13C:
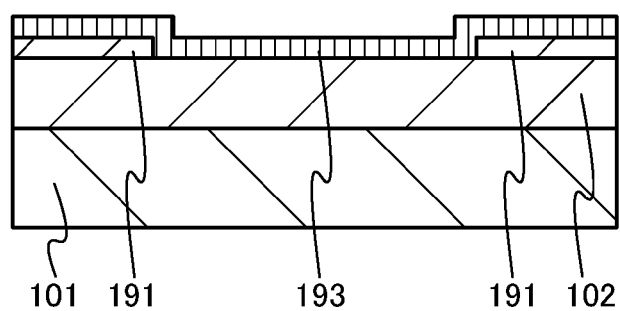
Figure 13D:
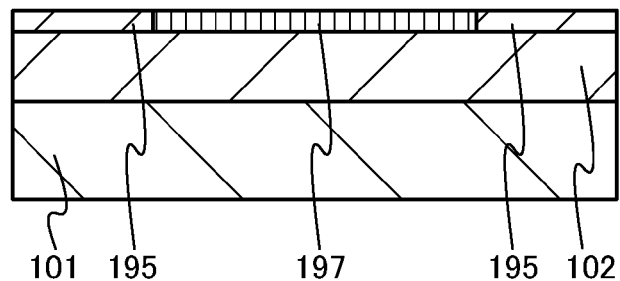

As illustrated in FIG. 13B, an oxide semiconductor film 192 is formed over the oxide insulating film 102 and the oxide insulating film 191. Then, in a manner similar to that of Embodiment 1, heat treatment is performed to release hydrogen from the oxide semiconductor film 192 and diffuse part of oxygen contained in the oxide insulating film 102 and the oxide insulating film 191 into the oxide semiconductor film 192 and the vicinity of the interface with the oxide semiconductor film 192 in the oxide insulating film 102 and the oxide insulating film 191. As a result, as illustrated in FIG. 13C, an oxide semiconductor film 193 with reduced hydrogen concentration and reduced oxygen defects can be formed (see FIG. 13C).

Next, at least the oxide semiconductor film 193 is polished; accordingly, without being influenced by the thickness of the oxide insulating film 191, an oxide semiconductor film 197 having a flat surface and a protective film 195 having a thickness similar to that of the oxide semiconductor film 197 and a level of surface flatness similar to that of the oxide semiconductor film 197 can be formed. Since a side surface of the oxide semiconductor film 197 is in contact with the protective film 195 which is an oxide insulating film from which part of oxygen is released by heat treatment, even if the side surface of the oxide semiconductor film 197 includes oxygen defects, the oxygen defects can be compensated for by later heat treatment.

As a result, the oxide semiconductor film whose surface unevenness is little different from that of the protective film and which has a side surface with reduced oxygen defects can be formed. Accordingly, the thickness of a gate insulating film that is to be formed over the oxide semiconductor film 197 can be made small. Further, processing accuracy of a gate electrode that is formed later can be enhanced. In this embodiment, as a method for supplying oxygen from the oxide insulating film 102 to the oxide semiconductor film, the method described in Embodiment 1 is used. However, in a manner similar to that of Embodiment 2, after an oxide insulating film is formed over the oxide semiconductor film 192, heat treatment may be performed to supply oxygen from the oxide insulating film provided over the oxide semiconductor film 192 to the oxide semiconductor film 192, and then a projection portion of the oxide semiconductor film 192 and a projection portion of the oxide insulating film over the oxide semiconductor film 192 may be etched. Thus, an oxide semiconductor film whose surface unevenness is little different from that of the protective film and which has a side surface with reduced oxygen defects can be formed.

(Embodiment 8)

In this embodiment, a method for forming the oxide semiconductor films 103 and 192 described in Embodiments 1 to 7 using a CAAC oxide semiconductor will be described. Here, description will be made using the oxide semiconductor film 103 as an example.

The first method for forming the oxide semiconductor film 103 using a CAAC oxide semiconductor will be described below.

In the case where a sputtering method is employed in the method for forming the oxide semiconductor film 103 described in Embodiment 1 in forming the oxide semiconductor film 103 using a CAAC oxide semiconductor, the substrate temperature is set to be higher than or equal to 150° C. and lower than or equal to 450° C., preferably higher than or equal to 200° C. and lower than or equal to 350° C., so that entry of moisture (including hydrogen) to the oxide semiconductor film can be prevented and a CAAC oxide semiconductor including crystals can be formed.

Heat treatment after the oxide semiconductor film 103 is formed using a CAAC oxide semiconductor by the above-described method releases further hydrogen from the oxide semiconductor film 103, can diffuse part of oxygen contained in the oxide insulating film 102 into the oxide semiconductor film 103 and the vicinity of the interface between the oxide insulating film 102 and the oxide semiconductor film 103, and can further form the oxide semiconductor film 104 including a CAAC oxide semiconductor with a high crystallinity.

Next, the second method for forming the oxide semiconductor film 103 using a CAAC oxide semiconductor will be described.

A first oxide semiconductor film is formed over the oxide insulating film 102. The thickness of the first oxide semiconductor film is more than or equal to a thickness of one atomic layer and less than or equal to 10 nm, preferably more than or equal to 2 nm and less than or equal to 5 nm.

When the first oxide semiconductor film is formed, the substrate temperature is set to be higher than or equal to 150° C. and lower than or equal to 450° C., preferably higher than or equal to 200° C. and lower than or equal to 350° C. As a result, entry of impurities such as moisture (including hydrogen) contained in the formed first oxide semiconductor film can be reduced. Further, crystallinity of the first oxide semiconductor film can be improved; accordingly, an oxide semiconductor film of a CAAC oxide semiconductor with high orientation can be formed.

After the first oxide semiconductor film is formed, first heat treatment may be performed. By the first heat treatment, moisture (including hydrogen) can be further released from the first oxide semiconductor film; accordingly, crystallinity can be further increased. By the first heat treatment, a CAAC oxide semiconductor with high orientation can be formed. The first heat treatment is performed at a temperature higher than or equal to 200° C. and lower than the strain point of the substrate, preferably higher than or equal to 250° C. and lower than or equal to 450° C.

For the first heat treatment, a rapid thermal anneal (RTA) apparatus can be used. With the use of the RTA apparatus, only in a short time, the heat treatment can be performed at a temperature higher than or equal to the strain point of the substrate. Thus, the time required for formation of the oxide semiconductor film in which the ratio of a crystalline region to an amorphous region is high can be shortened.

The first heat treatment can be performed in an inert gas atmosphere; typically it is preferably performed in a rare gas (such as helium, neon, argon, xenon, or krypton) atmosphere or a nitrogen atmosphere. The first heat treatment may be performed in an oxygen atmosphere or a reduced-pressure atmosphere. The treatment time is from 3 minutes to 24 hours. As the treatment time is increased, the proportion of a crystalline region with respect to that of an amorphous region in the oxide semiconductor film can be increased. Note that heat treatment for longer than 24 hours is not preferable because the productivity is reduced.

Next, a second oxide semiconductor film is formed over the first oxide semiconductor film. The second oxide semiconductor film can be formed in a manner similar to that of the first oxide semiconductor film.

When the second oxide semiconductor film is formed with the substrate being heated, the second oxide semiconductor film can be crystallized using the first oxide semiconductor film as a seed crystal. At this time, the formation of the first oxide semiconductor film and the second oxide semiconductor film both including the same element is referred to as "homoepitaxial growth". The formation of the first oxide semiconductor film and the second oxide semiconductor film including at least one different element from each other is referred to as "heteroepitaxial growth".

After the second oxide semiconductor film is formed, second heat treatment may be performed. The second heat treatment may be performed using a method similar to that of the first heat treatment. By the second heat treatment, an oxide semiconductor film in which the proportion of a crystalline region is higher than that of an amorphous region can be formed. By the second heat treatment, the second oxide semiconductor film can be crystallized using the first oxide semiconductor film as a seed crystal. At this time, homoepitaxial growth causing the formation of the first oxide semiconductor film and the second oxide semiconductor film both including the same element may be employed. Alternatively, heteroepitaxial growth causing the formation of the first oxide semiconductor film and the second oxide semiconductor film including at least one different element from each other may be employed.

By the above-described method, the oxide semiconductor film 103 can be formed using a CAAC oxide semiconductor. Hydrogen contained in the oxide semiconductor reacts with oxygen bonded to a metal atom to produce water, and in addition, a defect is formed in a lattice from which oxygen is released (or a portion from which oxygen is removed). Thus, impurities are reduced as much as possible in the formation step of the oxide semiconductor film, whereby defects in the oxide semiconductor film can be reduced. Therefore, when a channel region is formed in an oxide semiconductor film including a CAAC oxide semiconductor which is purified by removing impurities as much as possible, the transistor can have stable electrical characteristics with small change in threshold voltage before and after light irradiation or the BT stress test.

In the above-described first heat treatment and the second heat treatment, oxygen may diffuse from the oxide insulating film 102 into the oxide semiconductor film in some cases. In such a case, defects in the oxide semiconductor film 103 can be reduced without performing heat treatments between FIG. 2A and FIG. 2B; therefore, the number of heat treatment steps can be reduced.

(Embodiment 9)

Figure 14A:
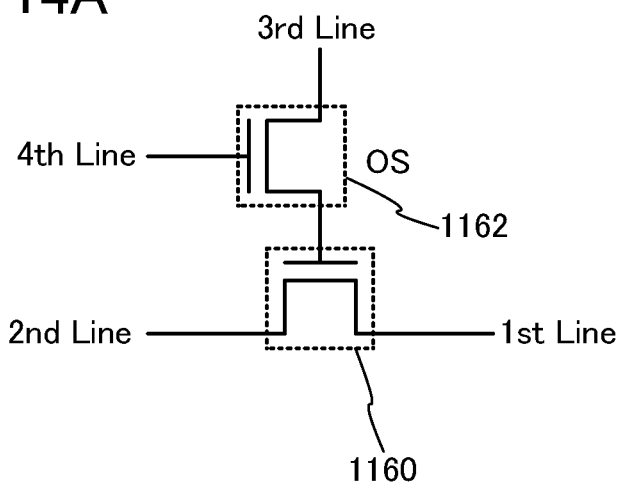
FIGS. 14A and 14B are circuit diagrams illustrating a semiconductor device according to an embodiment of the present invention.

An example of a circuit diagram of a memory element (hereinafter also referred to as a memory cell) included in a semiconductor device is illustrated in FIG. 14A. The memory cell includes a transistor 1160 in which a channel formation region is formed using a material other than an oxide semiconductor (e.g., silicon, germanium, silicon carbide, gallium arsenide, gallium nitride, an organic compound, or the like) and a transistor 1162 in which a channel formation region is formed using an oxide semiconductor.

The transistor 1162 in which the channel formation region is formed using an oxide semiconductor can be manufactured in accordance with any of Embodiments 1 to 8. Note that a transistor including an oxide semiconductor in a channel formation region is denoted by "OS" in drawings.

As illustrated in FIG. 14A, a gate electrode of the transistor 1160 is electrically connected to one of a source electrode and a drain electrode of the transistor 1162. A first wiring SL (a 1st line, also referred to as a source line) is electrically connected to a source electrode of the transistor 1160. A second wiring BL (a 2nd line, also referred to as a bit line) is electrically connected to a drain electrode of the transistor 1160. A third wiring S1 (a 3rd line, also referred to as a first signal line) is electrically connected to the other of the source electrode and the drain electrode of the transistor 1162. A fourth wiring S2 (a 4th line, also referred to as a second signal line) is electrically connected to a gate electrode of the transistor 1162.

The transistor 1160 in which the channel formation region is formed using a material other than an oxide semiconductor, e.g., single crystal silicon, can operate at sufficiently high speed. Therefore, with the use of the transistor 1160, high-speed reading of stored contents and the like are possible. The transistor 1162 in which the channel formation region is formed using an oxide semiconductor is characterized by its off-state current which is smaller than the off-state current of the transistor 1160. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data are described. First, a potential of the fourth wiring S2 is set to a potential at which the transistor 1162 is on, so that the transistor 1162 is turned on. Thus, a potential of the third wiring S1 is supplied to the gate electrode of the transistor 1160 (writing). After that, the potential of the fourth wiring S2 is set to a potential at which the transistor 1162 is off, so that the transistor 1162 is turned off, and thus, the potential of the gate electrode of the transistor 1160 is held (holding).

Since the off-state current of the transistor 1162 is extremely small, the potential of the gate electrode of the transistor 1160 is held for a long time. For example, when the potential of the gate electrode of the transistor 1160 is a potential at which the transistor 1160 is in an on state, the on state of the transistor 1160 is kept for a long time. In addition, when the potential of the gate electrode of the transistor 1160 is a potential at which the transistor 1160 is in an off state, the off state of the transistor 1160 is kept for a long time.

Then, reading of data is described. When a predetermined potential (a fixed potential) is supplied to the first wiring SL in a state where the on state or the off state of the transistor 1160 is kept as described above, a potential of the second wiring BL varies depending on the on state or the off state of the transistor 1160. For example, when the transistor 1160 is in the on state, the potential of the second wiring BL becomes close to the potential of the first wiring SL. On the other hand, when the transistor 1160 is in the off state, the potential of the second wiring BL does not vary.

In such a manner, the potential of the second wiring BL and a predetermined potential are compared with each other in a state where data is held, whereby the data can be read out.

Then, rewriting of data is described. Rewriting of data is performed in a manner similar to that of the writing and holding of data. That is, a potential of the fourth wiring S2 is set to a potential at which the transistor 1162 is on, so that the transistor 1162 is turned on. Thus, a potential of the third wiring S1 (a potential for new data) is supplied to the gate electrode of the transistor 1160. After that, the potential of the fourth wiring S2 is set to be a potential at which the transistor 1162 is off, so that the transistor 1162 is turned off, and thus, the new data is held.

In the memory cell according to the disclosed invention, data can be directly rewritten by another writing of data as described above. For that reason, erasing operation which is necessary for a flash memory or the like is not needed, so that a reduction in operation speed because of erasing operation can be suppressed. In other words, high-speed operation of the semiconductor device including the memory cell can be realized.

Figure 14B:
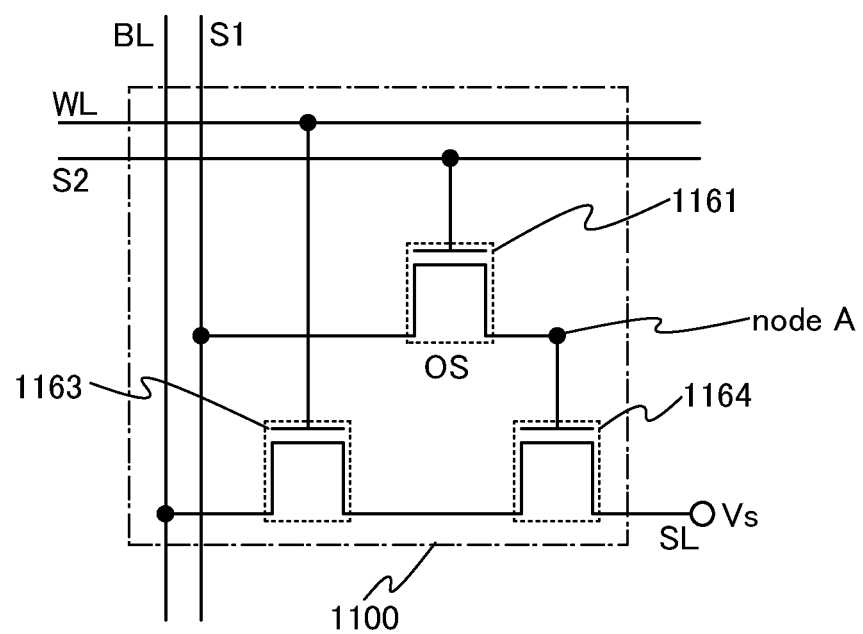

FIG. 14B is a circuit diagram illustrating an extensive application example of the memory cell illustrated in FIG. 14A.

A memory cell 1100 illustrated in FIG. 14B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163.

The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, a specific example of operation of the circuit will be described. Note that the values of a potential, a voltage, and the like in the description below can be changed as appropriate.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that at the end of the writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of the data "1" and set to approximately 0 V after the writing of the data "0". Electric charge corresponding to a potential of the third wiring S1 is accumulated at the node A; since the off-state current of the transistor 1161 is extremely small as described above, the potential of the gate electrode of the transistor 1164 is held for a long time.

When data is read from the memory cell, the first wiring SL is set to 0 V, the fifth wiring WL is set to 2 V, the fourth wiring S2 and the third wiring S1 are set to 0 V, and a reading circuit connected to the second wiring BL is set in an operation state. At this time, the transistor 1163 is in an on state and the transistor 1161 is in an off state.

The transistor 1164 is in an off state when the data "0" has been written, that is, the node A is set to approximately 0 V, so that the resistance between the second wiring BL and the first wiring SL is high. On the other hand, the transistor 1164 is in an on state when the data "1" has been written, that is, the node A is set to approximately 2 V, so that the resistance between the second wiring BL and the first wiring SL is low. A reading circuit can read the data "0" or the data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that the data "1" and the data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. In particular, a power supply potential VDD of a peripheral logic circuit may also be used instead of 2 V.

In this embodiment, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 14A or 14B and can be changed as appropriate.

Figure 15:
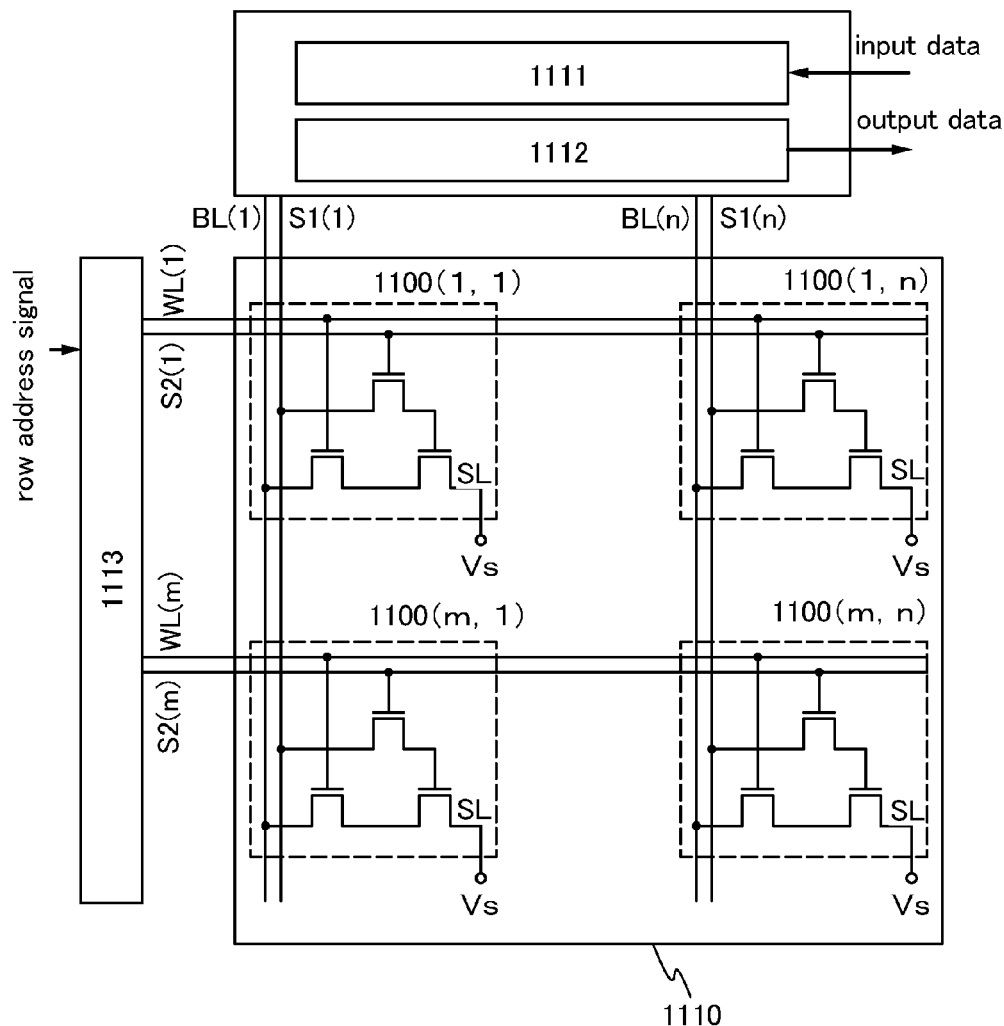
FIG. 15 is a circuit diagram illustrating a semiconductor device according to an embodiment of the present invention.

FIG. 15 is a block circuit diagram of a semiconductor device according to an embodiment of the present invention. The semiconductor device includes m×n bits of memory capacitance.

The semiconductor device illustrated in FIG. 15 includes m fourth wirings S2(1) to S2($m$), m fifth wirings WL(1) to WL(m), n second wirings BL(1) to BL(n), n third wirings S1(1) to S1($n$), a memory cell array 1110 in which a plurality of memory cells 1100(1,1) to 1100($m,n$) is arranged in a matrix of m rows by n columns (m and n are each a natural number), and peripheral circuits such as a driver circuit 1111 connected to the second wirings BL and the third wirings S1, a driver circuit 1113 connected to the fourth wirings S2 and the fifth wirings WL, and a reading circuit 1112. A refresh circuit or the like may be provided as another peripheral circuit.

A memory cell 1100($i,j$) is considered as a typical example of the memory cell. Here, the memory cell 1100($i,j$) (i is an integer of greater than or equal to 1 and less than or equal to m and j is an integer of greater than or equal to 1 and less than or equal to n) is connected to a second wiring BL(j), a third wiring S1(j), a fourth wiring S2(i), a fifth wiring WL(i), and a first wiring. A first wiring potential Vs is supplied to the first wiring SL. The second wirings BL(1) to BL(n) and the third wirings S1(1) to S1($n$) are connected to the driver circuit 1111 connected to the second wirings BL and the third wirings S1 and the reading circuit 1112. The fifth wirings WL(1) to WL(m) and the fourth wirings S2(1) to S2($m$) are connected to the driver circuit 1113 through the fourth wirings S2 and the fifth wirings WL.

The operation of the semiconductor device illustrated in FIG. 15 will be described. In this configuration, data is written and read per row.

When data is written into memory cells 1100($i$,1) to 1100($i,n$) of an i-th row, the potential Vs of the first wiring SL is set to 0 V, a fifth wiring WL(i) and the second wirings BL(1) to BL(n) are set to 0 V, and a fourth wiring S2($i$) is set to 2 V. At this time, the transistors 1161 are in an on state. Among the third wirings S1(1) to S1($n$), the third wiring in a column in which data "1" is to be written is set to 2 V and the third wiring in a column in which data "0" is to be written is set to 0 V. Note that, to finish writing, the fourth wiring S2($i$) is set to 0 V before the potentials of the third wirings S1(1) to S1($n$) are changed, so that the transistors 1161 are turned off. Moreover, a non-selected fifth wiring WL and a non-selected fourth wiring S2 are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V. The potential of the node A of the non-selected memory cell is not changed.

When data is read from the memory cells 1100($i$,1) to 1100($i,n$) of the i-th row, the first wiring potential Vs is set to 0 V, the fifth wiring WL(i) is set to 2 V, the fourth wiring S2($i$) and the third wirings S1(1) to S1($n$) are set to 0 V, and the reading circuit connected to the second wirings BL(1) to BL(n) is set in an operation state. The reading circuit can read data "0" or data "1" in accordance with the difference in resistance state of the memory cell, for example. Note that the fifth wirings WL except the fifth wiring WL(i) are set to 0 V, and the fourth wirings S2 except the fourth wirings S2($i$)

are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

In accordance with this embodiment, a potential of a node connected to a transistor in which a channel formation region is formed using an oxide semiconductor can be held for a very long time, whereby a memory cell capable of writing, holding, and reading of data with low power consumption can be manufactured.

(Embodiment 10)

Figure 16A:
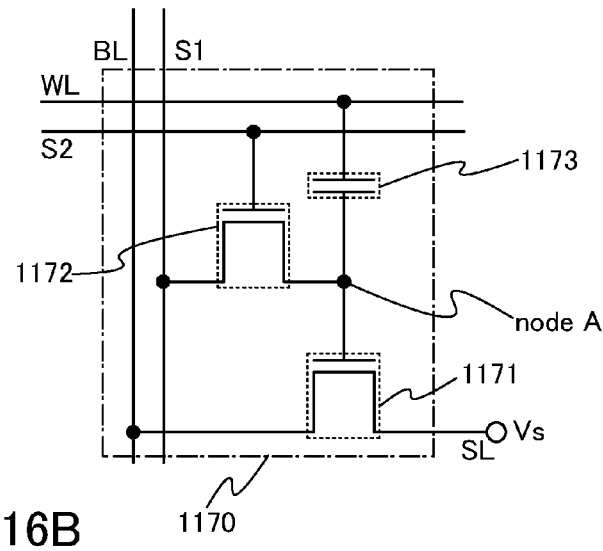
FIGS. 16A and 16B are circuit diagrams each illustrating a semiconductor device according to an embodiment of the present invention.

In this embodiment, an example of a circuit diagram of a memory cell including a capacitor will be shown. A memory cell 1170 illustrated in FIG. 16A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

The transistor 1172 in which a channel formation region is formed using an oxide semiconductor can be manufactured in accordance with any of Embodiments 1 to 8.

Here, a gate electrode of the transistor 1171, one of a source electrode and a drain electrode of the transistor 1172, and one electrode of the capacitor 1173 are electrically connected to each other. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is in an on state. Note that, to finish writing, the fourth wiring S2 is supplied with 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and is set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is operated. At this time, the transistor 1172 is in an off state.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of reading is set to 0 V; however, the third wiring S1 may be in a floating state or may be charged to have a potential higher than 0 V. Data "1" and data "0" are defined for convenience and may be reversed.

The potential of the third wiring S1 at the time of writing may be selected from the potentials of data "0" and data "1" as long as the transistor 1172 is turned off after the writing and the transistor 1171 is off in the case where the potential of the fifth wiring WL is set to 0 V. The potential of the fifth wiring WL at the time of reading may be selected so that the transistor 1171 is turned off in the case where data "0" has been written and is turned on in the case where data "1" has been written. For example, the threshold voltage of the transistor 1171 may be employed. The transistor 1171 can have any threshold voltage as long as the transistor 1171 operates in the above-described manner.

An example of a NOR semiconductor memory device in which a memory cell including a capacitor and a selection transistor having a first gate electrode and a second gate electrode is used will be described with reference to FIG. 16B.

Figure 16B:
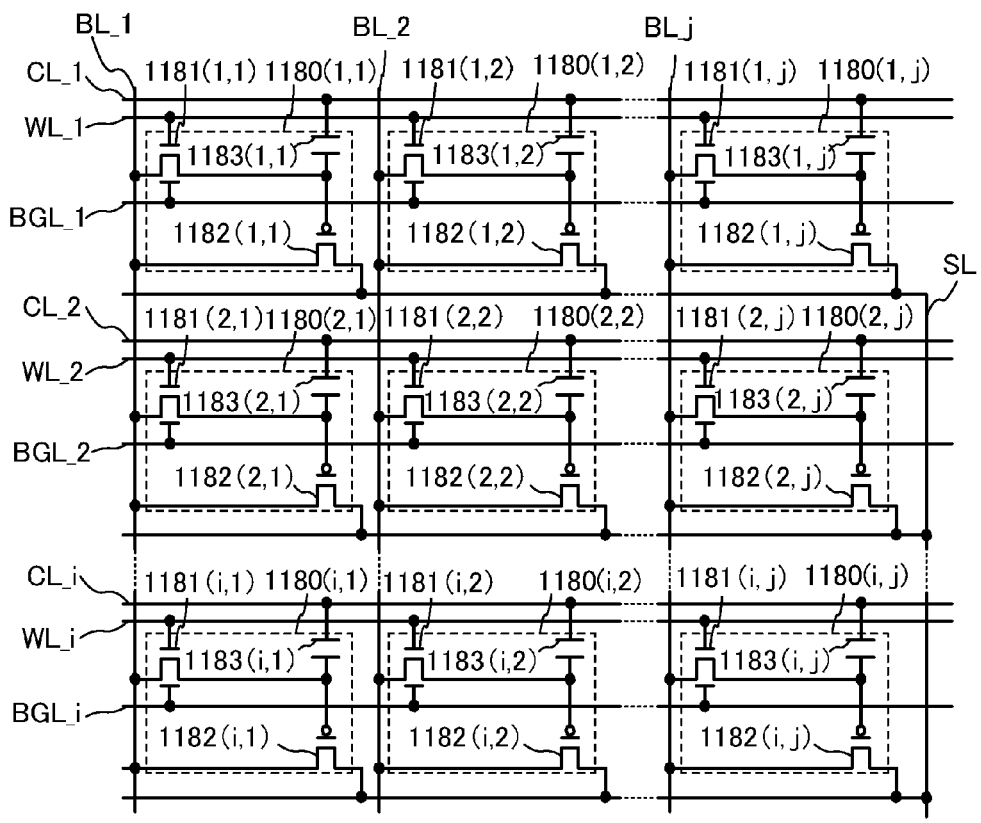

The memory cell array illustrated in FIG. 16B includes a plurality of memory cells 1180 arranged in a matrix of i rows (i is a natural number of 3 or more) and j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL. Here, i and j are each a natural number of greater than or equal to 3 for convenience, but the number of rows and the number of columns of the memory cell array described in this embodiment are not necessarily greater than or equal to 3. A memory cell array including one row or one column may be used or a memory cell array including two rows or two columns may be used.

The memory cell array illustrated in FIG. 16B includes a plurality of memory cells 1180 arranged in a matrix of i rows (i is a natural number of 3 or more) and j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

Further, each of the plurality of memory cells 1180 (also referred to as a memory cell 1180(M,N) (note that M is a natural number greater than or equal to 1 and less than or equal to i and that N is a natural number greater than or equal to 1 and less than or equal to j)) includes a transistor 1181(M,N), a capacitor 1183(M,N), and a transistor 1182 (M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with voltage applied between the first capacitor electrode and the second capacitor electrode.

The transistor 1181(M,N) is an n-channel transistor which has a source electrode, a drain electrode, a first gate electrode, and a second gate electrode. Note that in the semiconductor memory device in this embodiment, the transistor 1181 does not necessarily need to be an n-channel transistor.

One of the source electrode and the drain electrode of the transistor 1181(M,N) is connected to the bit line BL_N. The first gate electrode of the transistor 1181(M,N) is connected to the word line WL_M The second gate electrode of the transistor 1181(M,N) is connected to the gate line BGL_M.

With the configuration in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used. In the transistor 1181(M,N), structures and methods for forming the pair of electrodes, the oxide semiconductor film, and the gate electrode described in Embodiments 1 to 8 can be applied to the source electrode, the drain electrode, the channel formation region, and the first gate electrode or the second gate electrode.

The transistor 1182(M,N) is a p-channel transistor. Note that in the semiconductor memory device in this embodiment, the transistor 1182 does not necessarily need to be a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181 (M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to the capacitor line CL_M. A second capacitor electrode of the capacitor 1183(M,N) is connected to the other of the source electrode and the drain electrode of the transistor 1181 (M,N). Note that the capacitor 1183(M,N) serves as a storage capacitor.

The voltages of the word lines WL_1 to WL_i are controlled by, for example, a driver circuit including a decoder.

The voltages of the bit lines BL_1 to BL_j are controlled by, for example, a driver circuit including a decoder.

The voltages of the capacitor lines CL_1 to CL_i are controlled by, for example, a driver circuit including a decoder.

The voltages of the gate lines BGL_1 to BGL_i are controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be extremely small. Thus, a data retention period in the memory circuit can be longer. In addition, voltage necessary for writing and reading data can be made lower than that of a conventional semiconductor device; thus, power consumption can be reduced.

In accordance with this embodiment, a potential of a node connected to a transistor in which a channel formation region is formed using an oxide semiconductor can be held for a very long time, whereby a memory cell capable of writing, holding, and reading of data with low power consumption can be manufactured. In the memory cell array illustrated in FIG. 16B, the memory cell 1170 illustrated in FIG. 16A can be used instead of the memory cell 1180. On this occasion, in accordance with the memory cell 1170, wirings are provided in an appropriate manner.

The methods and configurations described in this embodiment can be combined as appropriate with any of the methods and configurations described in the other embodiments.

(Embodiment 11)

In this embodiment, examples of a semiconductor device using the transistor described in any of the above embodiments will be described with reference to FIGS. 17A and 17B.

Figure 17A:
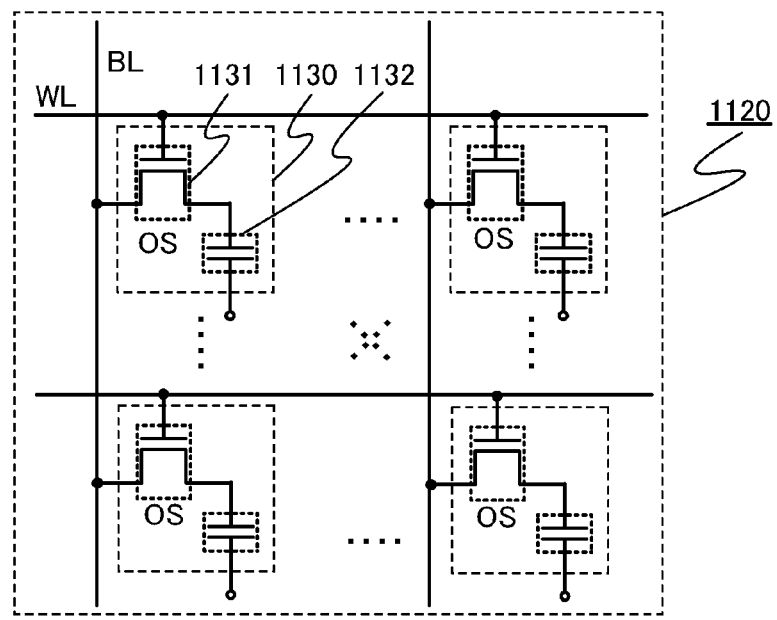
FIGS. 17A and 17B are circuit diagrams each illustrating a semiconductor device according to an embodiment of the present invention.

FIG. 17A illustrates an example of a semiconductor device whose configuration corresponds to that of a so-called dynamic random access memory (DRAM). A memory cell array 1120 illustrated in FIG. 17A has a structure in which a plurality of memory cells 1130 is arranged in a matrix. Further, the memory cell array 1120 includes m first wirings BL and n second wirings WL. Note that in this embodiment, the first wiring BL and the second wiring WL are referred to as a bit line BL and a word line WL, respectively.

The memory cell 1130 includes a transistor 1131 and a capacitor 1132. A gate electrode of the transistor 1131 is connected to the second wiring WL (the word line WL). Further, one of a source electrode and a drain electrode of the transistor 1131 is connected to the first wiring BL (the bit line BL). The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131.

The transistor in which a channel formation region is formed using an oxide semiconductor, which is described in any of the above embodiments, is characterized by having smaller off-state current than a transistor in which a channel formation region is formed using single crystal silicon. Accordingly, when the transistor is applied to the semiconductor device illustrated in FIG. 17A, which is regarded as a so-called DRAM, a substantially nonvolatile memory can be obtained.

Figure 17B:
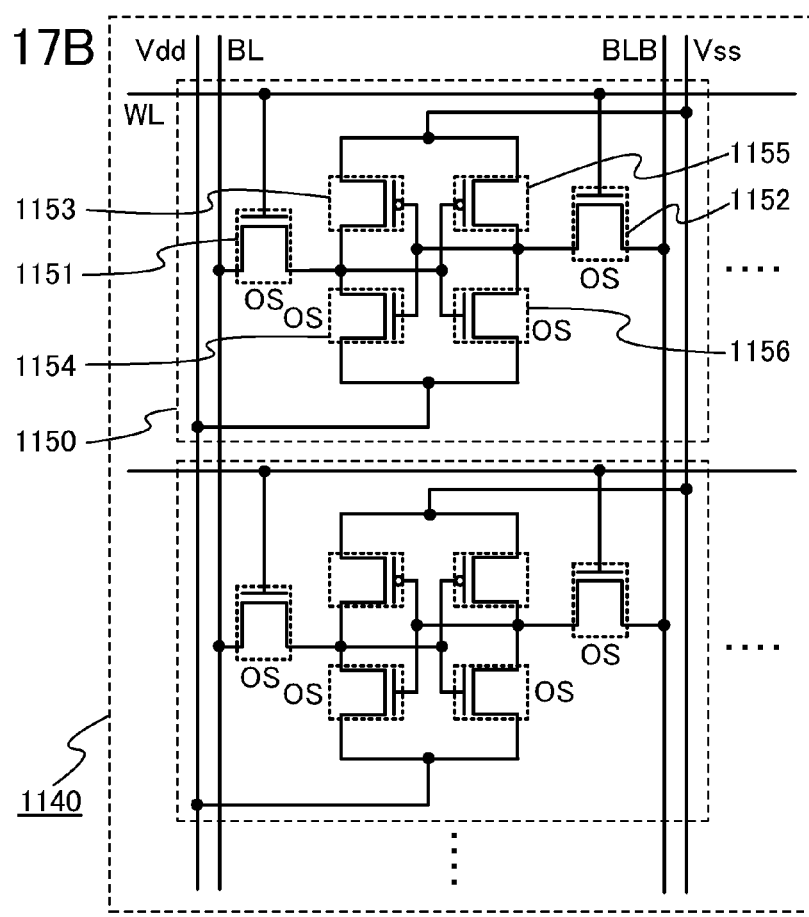

FIG. 17B illustrates an example of a semiconductor device whose configuration corresponds to that of a so-called static random access memory (SRAM). A memory cell array 1140 illustrated in FIG. 17B can have a structure in which a plurality of memory cells 1150 is arranged in a matrix. Further, the memory cell array 1140 includes a first wiring BL, a second wiring BLB (inverted bit line), a third wiring WL, a power supply line Vdd, and a ground potential line Vss.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

The methods and configurations described in this embodiment can be combined as appropriate with any of the methods and configurations described in the other embodiments.

(Embodiment 12)

A central processing unit (CPU) can be formed using a transistor including an oxide semiconductor in a channel formation region for at least part of the CPU.

Figure 18A:
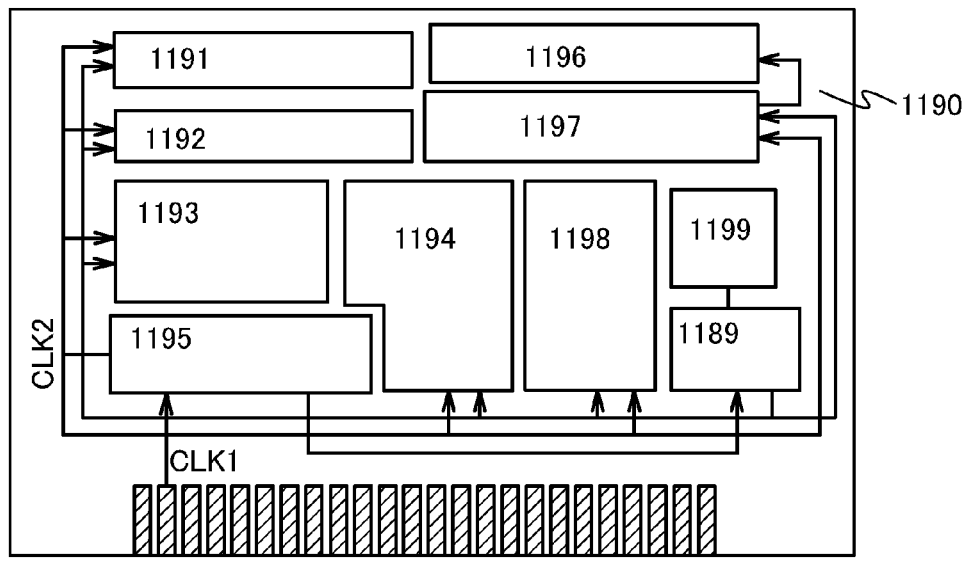
FIG. 18A is a block diagram illustrating a semiconductor device which is a specific example of a CPU and FIGS. 18B and 18C are circuit diagrams each illustrating a part thereof.

FIG. 18A is a block diagram illustrating a specific structure of a CPU. The CPU illustrated in FIG. 18A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 18A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 18A, a memory cell is provided in the register 1196. The memory cell described in any of Embodiments 9 to 11 can be used as the memory cell provided in the register 1196.

In the CPU illustrated in FIG. 18A, the register controller 1197 selects an operation of holding data in the register 1196 in accordance with an instruction from the ALU 1191. That is, the register controller 1197 selects whether data is held by a phase-inversion element or a capacitor in the memory cell included in the register 1196. When data holding by the phase-inversion element is selected, power supply voltage is supplied to the memory cell in the register 1196. When data holding by the capacitor is selected, the data is rewritten in the capacitor, and supply of power supply voltage to the memory cell in the register 1196 can be stopped.

Figure 18B:
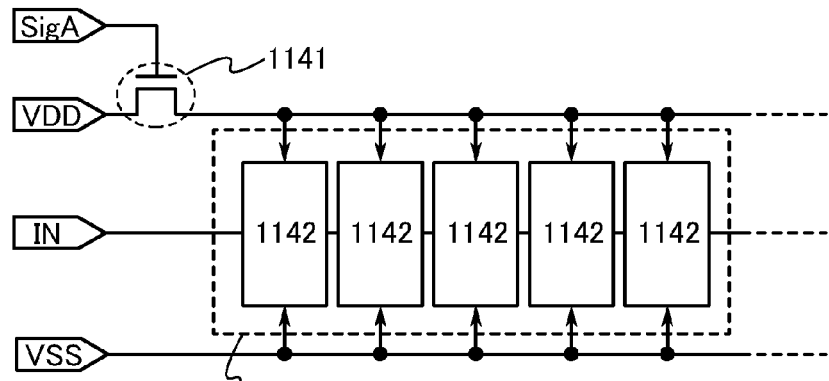
Figure 18C:
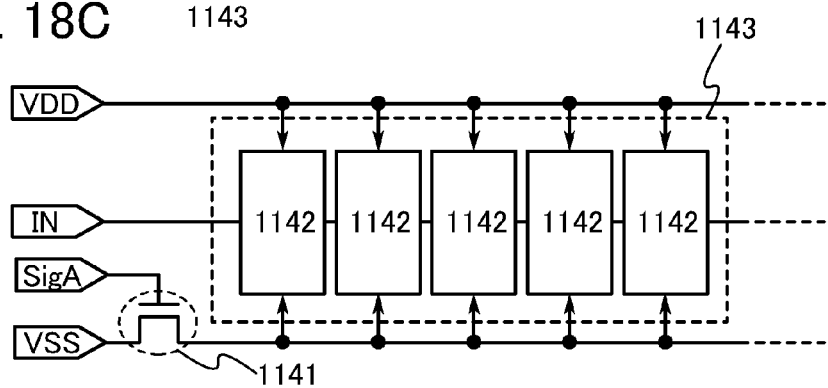

The power supply can be stopped by providing a switching element between a memory cell group and a node to which a power supply potential VDD or a power supply potential VSS is supplied, as illustrated in FIG. 18B or FIG. 18C. Circuits illustrated in FIGS. 18B and 18C are described below.

FIGS. 18B and 18C each illustrate an example of a configuration of a memory circuit including a transistor including an oxide semiconductor in a channel formation region as a switching element for controlling supply of a power supply potential to a memory cell.

The memory device illustrated in FIG. 18B includes a switching element 1141 and a memory cell group 1143 including a plurality of memory cells 1142. Specifically, as each of the memory cells 1142, the memory cell described in any of Embodiments 9 to 11 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 18B, a transistor including an oxide semiconductor in a channel formation region is used for the switching element 1141, and the switching of the transistor is controlled by a signal Sig A supplied to a gate electrode thereof.

Note that FIG. 18B illustrates the configuration in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 18B, the switching element 1141 may control the supply of the low-level power supply potential VSS.

In FIG. 18C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented by being combined as appropriate with any of the above-described embodiments.

(Embodiment 13)

One mode of a display device including any of the transistors exemplified in Embodiments 1 to 8 is illustrated in FIGS. 19A and 19B.

FIG. 19A is a top view of a panel. In the panel, a transistor 750 and a liquid crystal element 713 are sealed between a first substrate 701 and a second substrate 706 by a sealant 705. FIG. 19B is a cross-sectional view taken along a dashed-dotted line M-N in FIG. 19A.

The sealant 705 is provided so as to surround a pixel portion 702 provided over the first substrate 701. The second substrate 706 is provided over the pixel portion 702. Thus, the pixel portion 702 is sealed together with a liquid crystal layer 708 by the first substrate 701, the sealant 705, and the second substrate 706.

Further, an input terminal 720 is provided in a region that is different from a region surrounded by the sealant 705 over the first substrate 701, and flexible printed circuits (FPCs) 718a and 718b are connected to the input terminal 720. The FPC 718a is electrically connected to a signal line driver circuit 703 which is separately provided over another substrate, and the FPC 718b is electrically connected to a scan line driver circuit 704 which is separately provided over another substrate. A variety of signals and potentials supplied to the pixel portion 702 are supplied from the signal line driver circuit 703 and the scan line driver circuit 704 through the FPC 718a and the FPC 718b.

Note that there is no particular limitation on a connection method of a driver circuit which is separately provided over another substrate, and a chip on glass (COG) method, a wire bonding method, a tape carrier package (TCP) method, a tape automated bonding (TAB) method, or the like can be used.

As a display element provided in the display device, a liquid crystal element (also referred to as a liquid crystal display element) can be used. Further, a display medium whose contrast is changed by an electric effect, such as electronic ink, can be used.

The display device illustrated in FIGS. 19A and 19B includes an electrode 715 and a wiring 716. The electrode 715 and the wiring 716 are electrically connected to a terminal included in the FPC 718a through an anisotropic conductive film 719.

The electrode 715 is formed using the same conductive film as a first electrode 730. The wiring 716 is formed using the same conductive film as a source electrode and a drain electrode of the transistor 750.

Note that the transistor 750 provided in the pixel portion 702 is electrically connected to a display element to form a display panel. A variety of display elements can be used as the display element as long as display can be performed.

The size of a storage capacitor provided in the liquid crystal display device is set considering the leakage current of the transistor provided in the pixel portion or the like so that electric charge can be held for a predetermined period. By using a transistor including an oxide semiconductor film as described in Embodiments 1 to 8 as the transistor 750, it is enough to provide a storage capacitor having capacitance that is ⅓ or less, preferably ⅕ or less of liquid crystal capacitance of each pixel.

In the transistor which includes the oxide semiconductor film and is used in this embodiment, the hydrogen concentration can be reduced by heat treatment. Accordingly, the current in an off state (off-state current) can be reduced. Therefore, an electric signal such as an image signal can be held for a longer period, and a writing interval can be set longer in an on state. Accordingly, the frequency of refresh operation can be reduced, which leads to an effect of suppressing power consumption. Further, the transistor including the oxide semiconductor film can hold a potential supplied to a liquid crystal element even when a storage capacitor is not provided.

In addition, the transistor which includes the oxide semiconductor film as described in Embodiments 1 to 8 can have relatively high field-effect mobility and thus can operate at high speed. Therefore, by using the transistor in a pixel portion of a liquid crystal display device, a high-quality image can be provided. In addition, since such transistors can be separately provided in a driver circuit portion and a pixel portion over one substrate, the number of components of the liquid crystal display device can be reduced.

A mode of a display device using a liquid crystal element as a display element is illustrated in FIGS. 19A and 19B. In FIGS. 19A and 19B, the liquid crystal element 713 is a display element including the first electrode 730, a second electrode 731, and the liquid crystal layer 708. Note that an insulating film 732 and an insulating film 733 which function as alignment films are provided so that the liquid crystal layer 708 is interposed therebetween. The second electrode 731 is provided on the second substrate 706 side, and the first electrode 730 and the second electrode 731 are stacked with the liquid crystal layer 708 positioned therebetween.

Further, a spacer 735 is a columnar spacer formed of an insulating film over the second substrate 706 in order to control the thickness (a cell gap) of the liquid crystal layer 708. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used for the liquid crystal layer 708. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used for the liquid crystal layer 708. A blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which a chiral agent is mixed is used for the liquid crystal layer in order to improve the temperature range. The liquid crystal composition which includes a liquid crystal exhibiting a blue phase and a chiral agent has a short response time of 1 millisecond or less and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The specific resistivity of the liquid crystal material is $1 \times 10^9$ Ω·cm or higher, preferably $1 \times 10^{11}$ Ω·cm or higher, further preferably $1 \times 10^{12}$ Ω·cm or higher. The value of the specific resistivity in this specification is measured at 20° C.

As an operation mode for the liquid crystal display device of this embodiment, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, a vertical alignment (VA)

mode, a multi-domain vertical alignment (MVA) mode, an advanced super-view (ASV) mode, a patterned vertical alignment (PVA) mode, a transverse bend alignment (TBA) mode, or the like can be used.

In the liquid crystal display device, a black matrix (a light-blocking layer); an optical member (an optical substrate) such as a polarizing member, a retardation member, or an anti-reflection member; and the like are provided as appropriate. For example, circular polarization may be employed by using a polarizing substrate and a retardation substrate. In addition, a backlight, a side light, or the like may be used as a light source.

In addition, it is possible to employ a time-division display method (a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may differ between respective dots of color elements. However, one embodiment of the present invention is not limited to a liquid crystal display device for color display and can be applied to a liquid crystal display device for monochrome display.

Here, a typical driving method of a liquid crystal display device will be described showing some operation modes of liquid crystals as examples. As methods for driving liquid crystals in liquid crystal display devices, there is a vertical electric field method in which voltage is applied perpendicular to a substrate, and a horizontal electric field method in which voltage is applied parallel to a substrate.

Figure 20A:
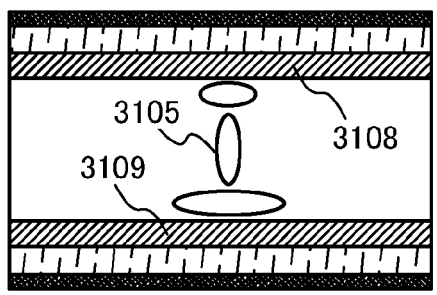
FIGS. 20A to 20F are cross-sectional views illustrating operation modes of liquid crystals.
Figure 20B:
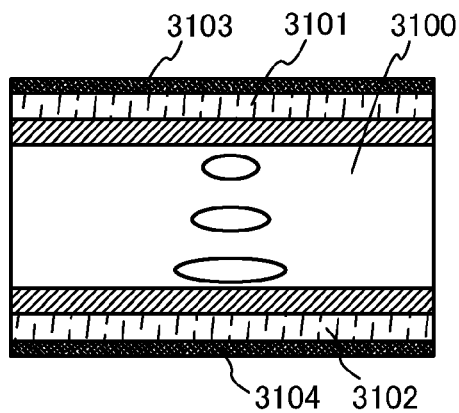

First, FIGS. 20A and 20B are cross-sectional schematic views illustrating a pixel structure of a TN-mode liquid crystal display device.

A layer 3100 including a display element is held between a first substrate 3101 and a second substrate 3102 which are provided so as to face each other. A first polarizing plate 3103 is formed on the first substrate 3101 side, and a second polarizing plate 3104 is formed on the second substrate 3102 side. An absorption axis of the first polarizing plate 3103 and an absorption axis of the second polarizing plate 3104 are arranged in a cross-Nicol state.

Although not illustrated, a backlight and the like are provided outside the second polarizing plate 3104. A first electrode 3108 is provided on the first substrate 3101 and a second electrode 3109 is provided on the second substrate 3102. The first electrode 3108 on the opposite side to the backlight, that is, on the viewing side, is formed to have a light-transmitting property.

In the case where the liquid crystal display device having such a structure is in a normally white mode, when a voltage is applied between the first electrode 3108 and the second electrode 3109 (referred to as a vertical electric field method), liquid crystal molecules 3105 are aligned vertically as illustrated in FIG. 20A. Thus, light from the backlight cannot pass through the first polarizing plate 3103, which leads to black display.

When no voltage is applied between the first electrode 3108 and the second electrode 3109, the liquid crystal molecules 3105 are aligned horizontally and twisted on a plane surface as illustrated in FIG. 20B. As a result, light from the backlight can pass through the first polarizing plate 3103, which leads to white display. In addition, adjustment of a voltage applied between the first electrode 3108 and the second electrode 3109 enables expression of gray scale. In this manner, a predetermined image is displayed.

A known liquid crystal material may be used for a TN-mode liquid crystal display device.

Figure 20C:
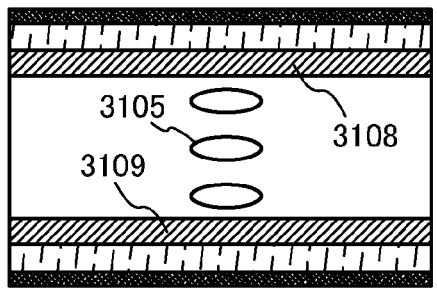
Figure 20D:
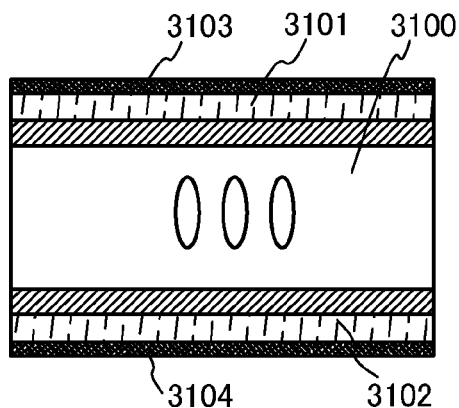

FIGS. 20C and 20D are cross-sectional schematic views illustrating a pixel structure of a VA-mode liquid crystal display device. In the VA mode, the liquid crystal molecules 3105 are aligned to be vertical to the substrate when no electric field is applied.

As in FIGS. 20A and 20B, the first electrode 3108 is provided on the first substrate 3101 and the second electrode 3109 is provided on the second substrate 3102. The first electrode 3108 on the opposite side to the backlight, that is, on the viewing side, is formed to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are arranged in a cross-Nicol state.

In the liquid crystal display device having such a structure, when a voltage is applied between the first electrode 3108 and the second electrode 3109 (the vertical electric field method), the liquid crystal molecules 3105 are aligned horizontally as illustrated in FIG. 20C. Thus, light from the backlight can pass through the first polarizing plate 3103, which leads to white display.

When no voltage is applied between the first electrode 3108 and the second electrode 3109, the liquid crystal molecules 3105 are aligned vertically as illustrated in FIG. 20D. As a result, light from the backlight which is polarized by the second polarizing plate 3104 passes through a cell without being influenced by birefringence of the liquid crystal molecules 3105. Thus, the polarized light from the backlight cannot pass through the first polarizing plate 3103, which leads to black display. In addition, adjustment of a voltage applied between the first electrode 3108 and the second electrode 3109 enables expression of gray scale. In this manner, a predetermined image is displayed.

Figure 20E:
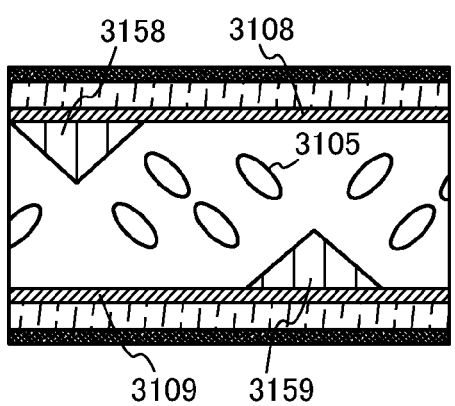
Figure 20F:
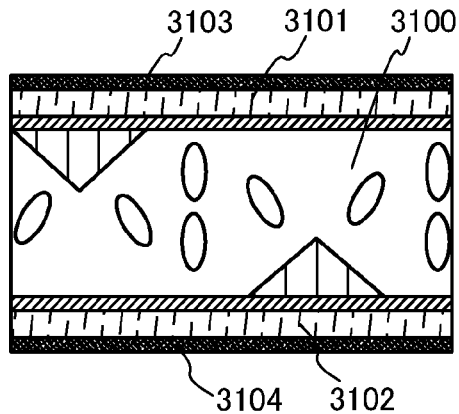

FIGS. 20E and 20F are cross-sectional schematic views illustrating a pixel structure of an MVA-mode liquid crystal display device. The MVA mode is a method in which one pixel is divided into a plurality of portions, and the portions have different alignment directions of the liquid crystal molecules 3105 and compensate the viewing angle dependencies with each other. As illustrated in FIG. 20E, in the MVA mode, a protrusion 3158 whose cross section is a triangle is provided on the first electrode 3108 and a protrusion 3159 whose cross section is a triangle is provided on the second electrode 3109 for controlling alignment. Note that the structures other than the protrusions are in common with the structures in the VA mode.

When a voltage is applied between the first electrode 3108 and the second electrode 3109 (the vertical electric field method), the liquid crystal molecules 3105 are aligned so that a long axis of the liquid crystal molecule 3105 is substantially vertical to surfaces of the projections 3158 and 3159 as illustrated in FIG. 20E. Thus, light from the backlight can pass through the first polarizing plate 3103, which leads to white display.

When no voltage is applied between the first electrode 3108 and the second electrode 3109, the liquid crystal molecules 3105 are aligned horizontally as illustrated in FIG. 20F. As a result, light from the backlight cannot pass through the first polarizing plate 3103, which leads to black display. In addition, adjustment of a voltage applied between the first electrode 3108 and the second electrode 3109 enables expression of gray scale. In this manner, a predetermined image is displayed.

Figure 23A:
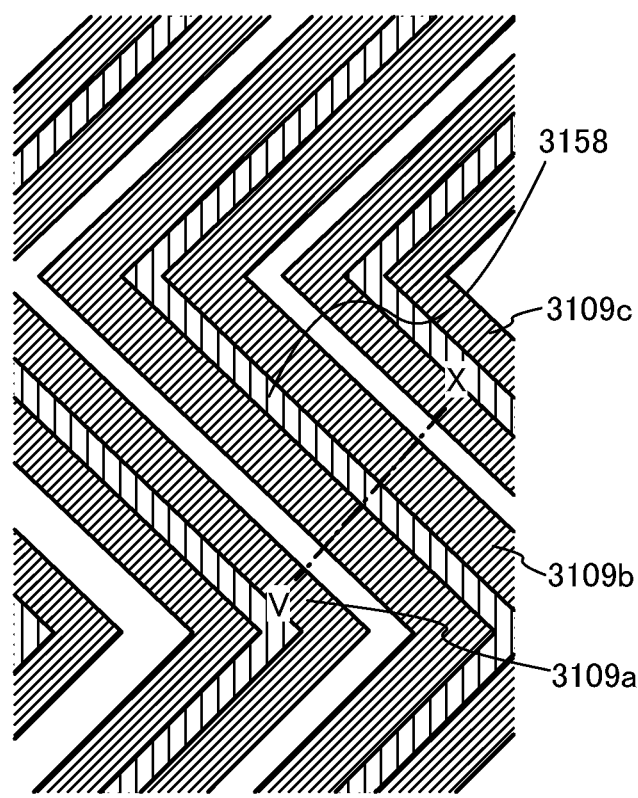
FIGS. 23A and 23B are a top view and a cross-sectional view illustrating an operation mode of liquid crystals.
Figure 23B:
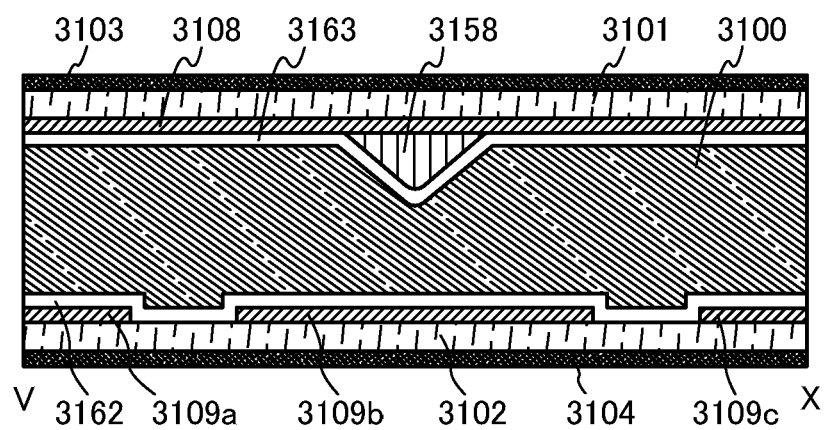

FIGS. 23A and 23B are a top view and a cross-sectional view, respectively, of another example of the MVA mode. In FIG. 23A, a second electrode 3109a, a second electrode 3109b, and a second electrode 3109c are formed into a bent pattern of a dogleg-like shape. As illustrated in FIG. 23B, an insulating layer 3162 that is an alignment film is formed over the second electrodes 3109a, 3109b, and 3109c. The protrusion 3158 is formed on the first electrode 3108 so as to overlap with the second electrode 3109b. An insulating layer 3163 that is an alignment film is formed on the first electrode 3108 and the protrusion 3158.

Figure 21A:
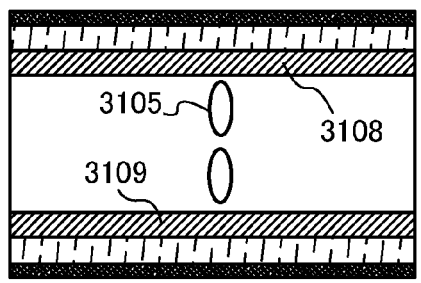
FIGS. 21A to 21D are cross-sectional views illustrating operation modes of liquid crystals.
Figure 21B:
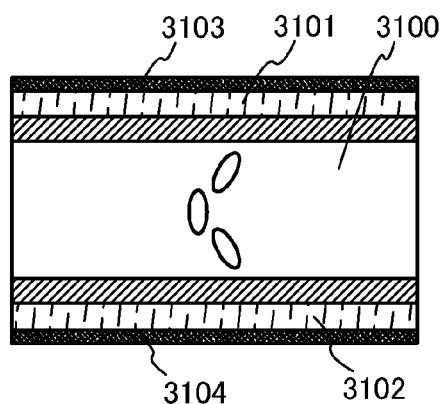

Next, FIGS. 21A and 21B are cross-sectional schematic views illustrating a pixel structure of an OCB-mode liquid crystal display device. In the OCB mode, the liquid crystal molecules 3105 align so as to compensate the viewing angle dependency in a liquid crystal layer. This alignment is referred to as bend alignment.

As in FIGS. 20A to 20F, the first electrode 3108 is provided on the first substrate 3101 and the second electrode 3109 is provided on the second substrate 3102. The first electrode 3108 on the opposite side to the backlight, that is, on the viewing side, is formed to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are arranged in a cross-Nicol state.

In the liquid crystal display device having such a structure, when a certain voltage is applied to the first electrode 3108 and the second electrode 3109 (the vertical electric field method), black display is performed as illustrated in FIG. 21A. At that time, liquid crystal molecules 3105 are aligned vertically. Thus, light from the backlight cannot pass through the first polarizing plate 3103, which leads to black display.

When a certain voltage is applied between the first electrode 3108 and the second electrode 3109, the liquid crystal molecules 3105 are in a bend alignment state as illustrated in FIG. 21B. As a result, light from the backlight can pass through the first polarizing plate 3103, which leads to white display. In addition, adjustment of a voltage applied between the first electrode 3108 and the second electrode 3109 enables expression of gray scale. In this manner, a predetermined image is displayed.

In the OCB mode, the viewing angle dependency can be compensated by alignment of the liquid crystal molecules 3105 in a liquid crystal layer.

Figure 21C:
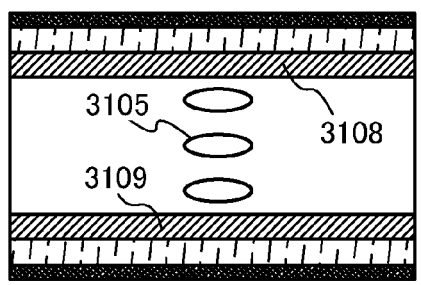
Figure 21D:
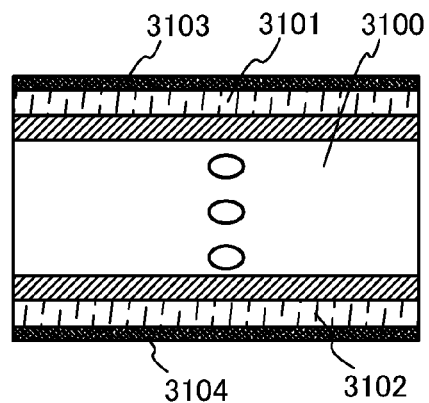

FIGS. 21C and 21D are cross-sectional schematic views illustrating pixel structures of an FLC-mode liquid crystal display device and an AFLC-mode liquid crystal display device.

As in FIGS. 20A to 20F, the first electrode 3108 is provided on the first substrate 3101 and the second electrode 3109 is provided on the second substrate 3102. The first electrode 3108 on the opposite side to the backlight, that is, on the viewing side, is formed to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are arranged in a cross-Nicol state.

In the liquid crystal display device having such a structure, when a voltage is applied to the first electrode 3108 and the second electrode 3109 (the vertical electric field method), the liquid crystal molecules 3105 are aligned horizontally in a direction deviated from a rubbing direction. Thus, light from the backlight can pass through the first polarizing plate 3103, which leads to white display.

When no voltage is applied between the first electrode 3108 and the second electrode 3109, the liquid crystal molecules 3105 are aligned horizontally along the rubbing direction as shown in FIG. 21D. As a result, light from the backlight cannot pass through the first polarizing plate 3103, which leads to black display. In addition, adjustment of a voltage applied between the first electrode 3108 and the second electrode 3109 enables expression of gray scale. In this manner, a predetermined image is displayed.

A known liquid crystal material may be used for the FLC-mode liquid crystal display device and the AFLC-mode liquid crystal display device.

Figure 22A:
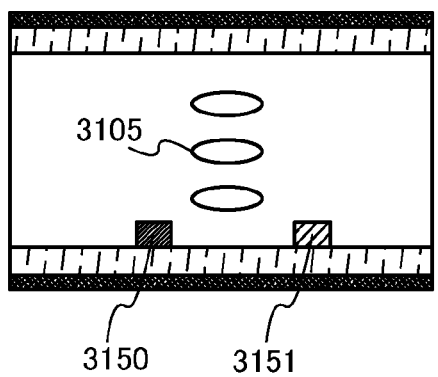
FIGS. 22A to 22D are cross-sectional views illustrating operation modes of liquid crystals.
Figure 22B:
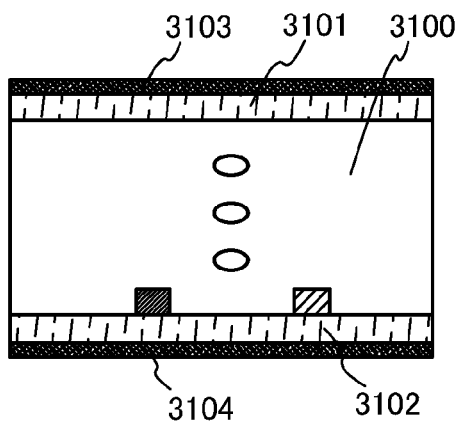

FIGS. 22A and 22B are cross-sectional schematic views each illustrating a pixel structure of a liquid crystal display device of an IPS mode. In the IPS mode, liquid crystal molecules 3105 are rotated constantly on a plane surface with respect to a substrate, and a horizontal electric field mode in which electrodes are provided only on one substrate side is employed.

The IPS mode is characterized in that liquid crystals are controlled by a pair of electrodes which is provided on one substrate. That is, a pair of electrodes 3150 and 3151 is provided over the second substrate 3102. The pair of electrodes 3150 and 3151 preferably has a light transmitting property. The first polarizing plate 3103 is formed on the first substrate 3101 side and the second polarizing plate 3104 is formed on the side of the second substrate 3102. The absorption axis of the first polarizing plate 3103 and the absorption axis of the second polarizing plate 3104 are arranged in a cross-Nicol state.

When a voltage is applied between the pair of electrodes 3150 and 3151 in a liquid crystal display device having such a structure, the liquid crystal molecules 3105 are aligned along a line of electric force which is deviated from the rubbing direction, as illustrated in FIG. 22A. As a result, light from a backlight can pass through the first polarizing plate 3103, and white is displayed.

When no voltage is applied between the pair of electrodes 3150 and 3151, the liquid crystal molecules 3105 are aligned horizontally along the rubbing direction, as illustrated in FIG. 22B. As a result, light from a backlight cannot pass through the first polarizing plate 3103, and black is displayed. In addition, adjustment of a voltage applied between the pair of electrodes 3150 and 3151 enables expression of gray scale. In this manner, a predetermined image is displayed.

Figure 24A:
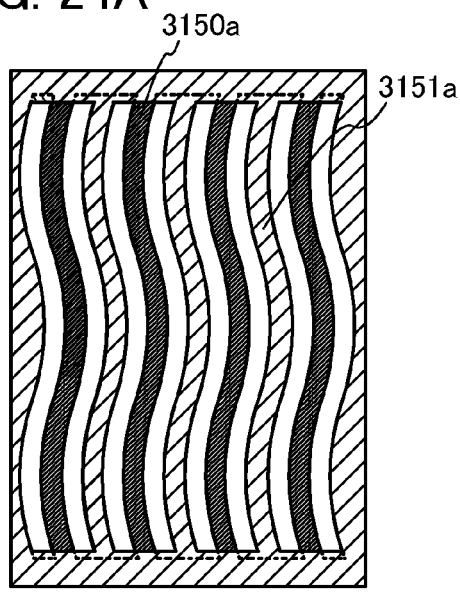
FIGS. 24A to 24C are top views each illustrating a structure of a pixel electrode.
Figure 24B:
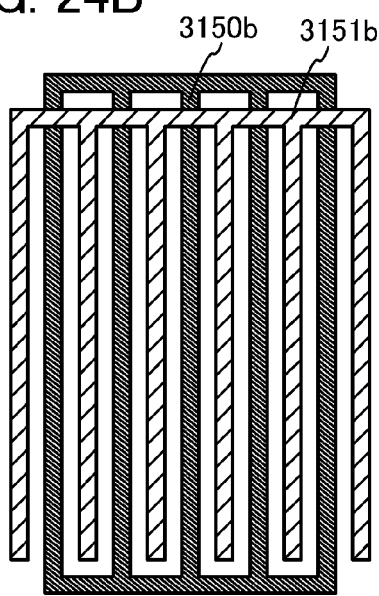
Figure 24C:
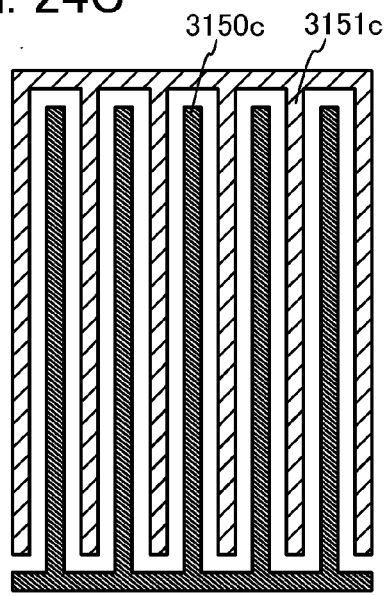

FIGS. 24A to 24C each illustrate an example of the pair of electrodes 3150 and 3151 that can be used in the IPS mode. As illustrated in top views of FIGS. 24A to 24C, the pair of electrodes 3150 and 3151 are alternatively formed. In FIG. 24A, electrodes 3150a and 3151a have an undulating wave shape. In FIG. 24B, electrodes 3150b and 3151b each have a comb-shape and partly overlap with each other. In FIG. 24C, electrodes 3150c and 3151c have a comb-like shape in which the electrodes are meshed with each other.

Figure 22C:
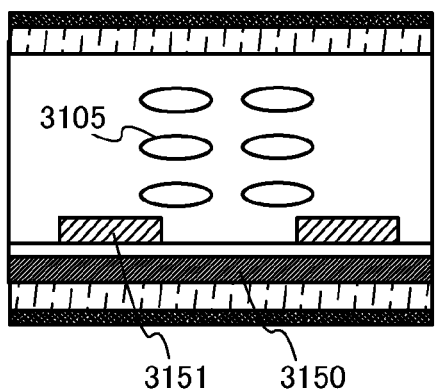
Figure 22D:
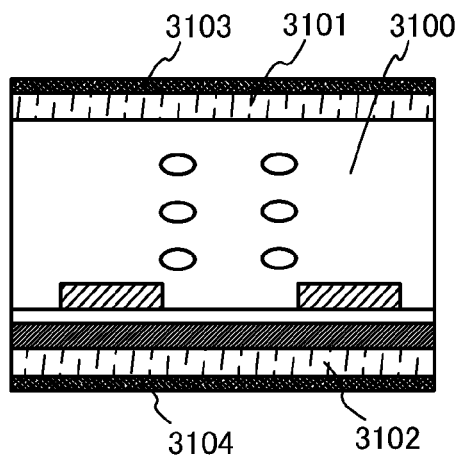

FIGS. 22C and 22D are cross-sectional schematic views each illustrating a pixel structure of a liquid crystal display device of an FFS mode. The FFS mode is also vertical electronic field type as the IPS mode and has a structure in which the electrode 3151 is formed over the electrode 3150 with an insulating film provided therebetween as shown in FIGS. 22C and 22D.

The pair of electrodes 3150 and 3151 preferably has a light transmitting property. The first polarizing plate 3103 is formed on the first substrate 3101 side and the second polarizing plate 3104 is formed on the second substrate 3102 side. The absorption axis of the first polarizing plate 3103 and the absorption axis of the second polarizing plate 3104 are arranged in a cross-Nicol state.

When a voltage is applied between the pair of electrodes 3150 and 3151 in a liquid crystal display device having such a structure, the liquid crystal molecules 3105 are aligned along a line of electric force which is deviated from the rubbing direction, as illustrated in FIG. 22C. As a result, light from the backlight can pass through the first polarizing plate 3103, which leads to white display.

When no voltage is applied between the pair of electrodes 3150 and 3151, the liquid crystal molecules 3105 are aligned horizontally along the rubbing direction, as illustrated in FIG. 22D. As a result, light from a backlight cannot pass through the first polarizing plate 3103, and black is displayed. In addition, adjustment of a voltage applied between the pair of electrodes 3150 and 3151 enables expression of gray scale. In this manner, a predetermined image is displayed.

Figure 25A:
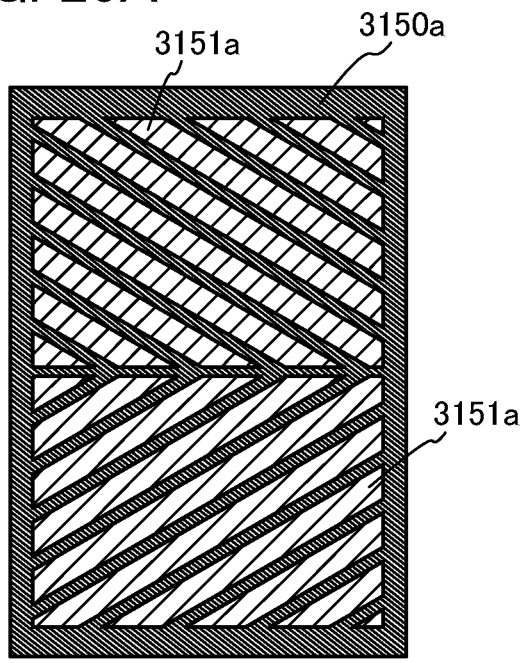
FIGS. 25A to 25C are top views each illustrating a structure of a pixel electrode.
Figure 25B:
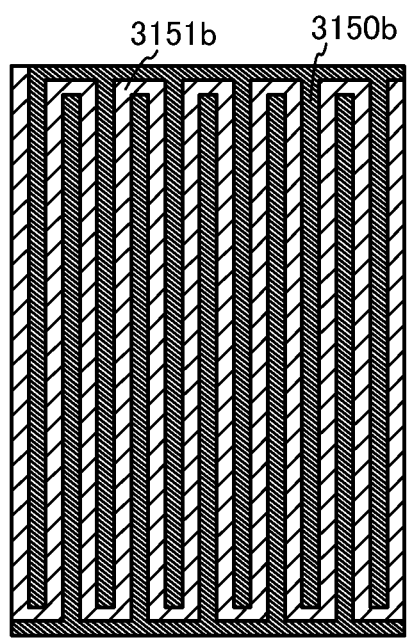
Figure 25C:
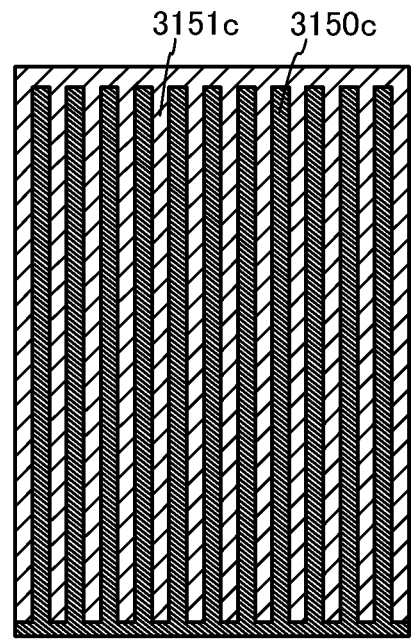

FIGS. 25A to 25C each show an example of the pair of electrodes 3150 and 3151 that can be used in the FFS mode. As illustrated in top views of FIGS. 25A to 25C, the electrodes 3151 are formed into various patterns over the electrodes 3150. In FIG. 25A, the electrode 3151a over the electrode 3150a has a bent dogleg-like shape. In FIG. 25B, the electrode 3151b over the electrode 3150b has a comb-like shape in which the electrodes are meshed with each other. In FIG. 25C, the electrode 3151c over the electrode 3150c has a comb-like shape.

A known material may be used for a liquid crystal material of the IPS mode and the FFS mode. Alternatively, a liquid crystal exhibiting a blue phase may be used.

In FIGS. 19A and 19B, the substrate 101 that is described in Embodiment 1 can be used as the first substrate 701 and the second substrate 706 as appropriate. Alternatively, a flexible substrate can be used as the first substrate 701 and the second substrate 706. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The liquid crystal display device performs display by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode and the second electrode (each of which is also referred to as a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 730 and the second electrode 731 can be formed using a light-transmitting conductive material such as indium oxide including tungsten oxide, indium zinc oxide including tungsten oxide, indium oxide including titanium oxide, indium tin oxide including titanium oxide, indium tin oxide (also referred to as ITO), indium zinc oxide, or indium tin oxide to which silicon oxide is added. Alternatively, a material formed of one to ten graphene sheets may be used.

The first electrode 730 and the second electrode 731 can be formed using a conductive composition including a conductive macromolecule (also referred to as a conductive polymer). As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

In the case of a reflective liquid crystal display device, one of the first electrode 730 and the second electrode 731 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Further, since a transistor is easily broken by static electricity or the like, a protection circuit is preferably provided. The protection circuit is preferably formed using a nonlinear element. Here, a mode of protection circuit that can be used in the display device of this embodiment will be described with reference to FIGS. 26A and 26B.

A protection circuit 997 includes transistors 970a and 970b which are n-channel transistors. Each gate terminal of the transistors 970a and 970b is connected to each drain terminal to have similar characteristics as a diode. The transistors disclosed in the any of Embodiments 1 to 8 can be used as the transistors 970a and 970b.

A first terminal (a gate) and a third terminal (a drain) of the transistor 970a are connected to a first wiring 945 and a second terminal (a source) of the transistor 970a is connected to a second wiring 960. A first terminal (a gate) and a third terminal (a drain) of the transistor 970b are connected to the second wiring 960 and a second terminal (a source) of the transistor 970b is connected to the first wiring 945. That is, the protection circuit illustrated in FIG. 26A includes two transistors whose rectifying directions are opposite to each other and each of which connects the first wiring 945 and the second wiring 960. In other words, the protection circuit includes the transistor whose rectifying direction is from the first wiring 945 to the second wiring 960 and the transistor whose rectifying direction is from the second wiring 960 to the first wiring 945, between the first wiring 945 and the second wiring 960.

In the above protection circuit, when the second wiring 960 is positively or negatively charged due to static electricity or the like, current flows in a direction in which the charge is cancelled. For example, when the second wiring 960 is positively charged, current flows in a direction in which the positive charge is released to the first wiring 945. Owing to this operation, electrostatic breakdown or malfunctions of a circuit or an element connected to the charged second wiring 960 can be prevented. In the structure in which the charged second wiring 960 and another wiring intersect with an insulating layer interposed therebetween, this operation can further prevent dielectric breakdown of the insulating layer.

Note that the protection circuit is not limited to the above structure. For example, a structure in which a plurality of transistors whose rectifying direction is from the first wiring 945 to the second wiring 960 and a plurality of transistors whose rectifying direction is from the second wiring 960 to the first wiring 945 are connected may be employed. In addition, a protection circuit can be configured using an odd number of transistors.

Figure 26A:
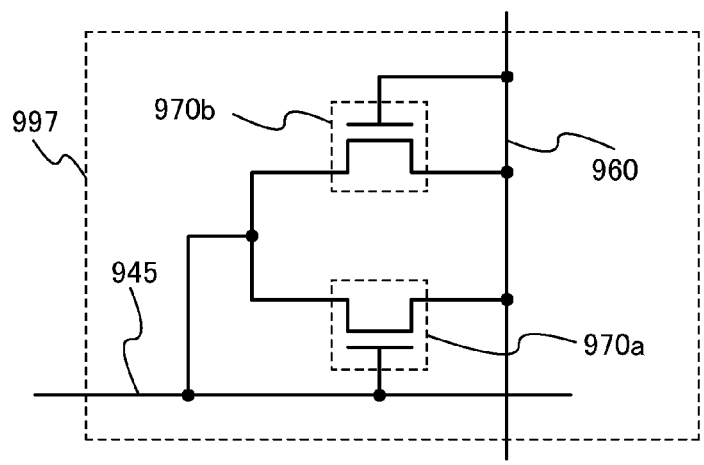
FIG. 26A is a circuit diagram illustrating a mode of a protection circuit and FIG. 26B is a top view thereof.

The protection circuit shown in FIG. 26A as an example can be applied to various uses. For example, the first wiring 945 is used as a common wiring of a display device, the second wiring 960 is used as one of a plurality of signal lines, and the protection circuit can be provided therebetween. A pixel transistor connected to the signal line which is provided with the protection circuit is protected from malfunctions, such as electrostatic breakdown due to charged wirings, a shift in threshold voltage, and the like.

Note that the protection circuit can be applied to not only other circuits in the liquid crystal display device but also the semiconductor devices described in the other embodiments.

Figure 26B:
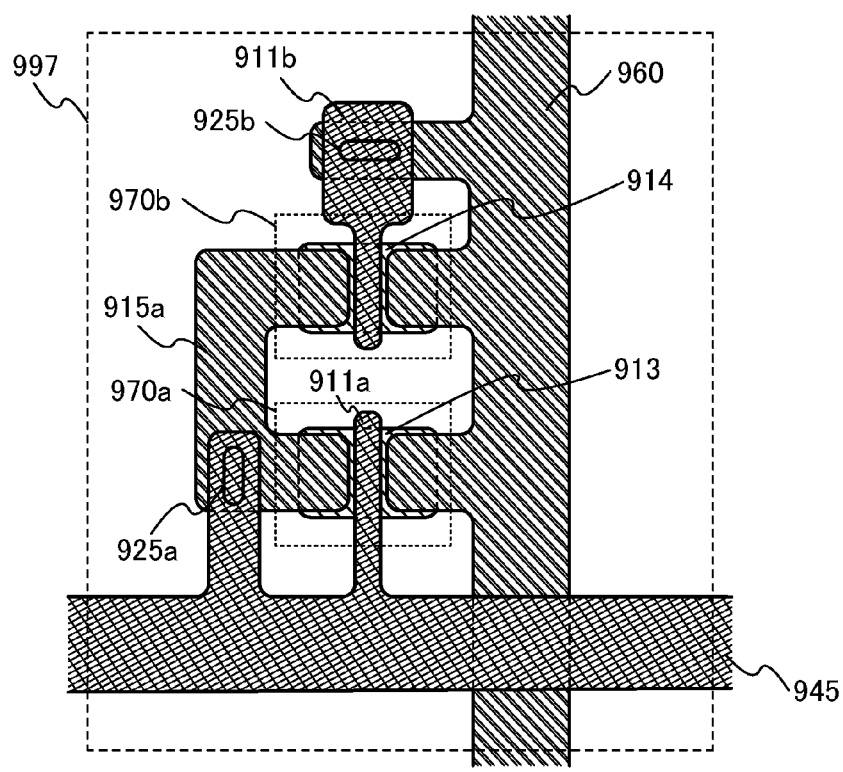

Next, a mode in which the protection circuit 997 is formed over a substrate will be described. An example of a top view of the protection circuit 997 is illustrated in FIG. 26B. Here, description will be made using the transistor described in Embodiment 1. Note that some of components of the transistor (e.g., a protective film, a gate insulating film, and an insulating film) are not shown for simplicity.

The transistor 970a includes a gate electrode 911a, and the gate electrode 911a is connected to the first wiring 945. A source electrode of the transistor 970a is connected to the second wiring 960 and a drain electrode thereof is connected to the first wiring 945 through a first electrode 915a. In addition, the transistor 970a includes a semiconductor film 913 which overlaps with the gate electrode 911a between the source electrode and the drain electrode.

The transistor 970b includes a gate electrode 911b. The gate electrode 911b is connected to the second wiring 960 through a contact hole 925b. A drain electrode of the transistor 970b is connected to the second wiring 960. A source electrode of the transistor 970b is connected to the first wiring 945 through the first electrode 915a and a contact hole 925a. In addition, the transistor 970b includes a semiconductor film 914 which overlaps with the gate electrode 911b between the source electrode and the drain electrode.

As described above, by applying any of the transistors exemplified in Embodiments 1 to 8 to a transistor in a protection circuit, a highly reliable liquid crystal display device can be provided. Note that the transistors exemplified in Embodiments 1 to 8 can be applied to not only semiconductor devices having the display functions described above but also semiconductor devices having a variety of functions, such as a semiconductor device having an image sensor function of reading information of an object.

In this embodiment, although a liquid crystal display device in which a liquid crystal element is used as a display element has been described as a mode of a display device; however, the present invention is not limited thereto. For example, a mode of the display device can be a light-emitting display device by using a light-emitting element as a display element. Further, a mode of the display device can be an electrophoretic display device by using an electrophoretic element as a display element.

This embodiment can be freely combined with any of the other embodiments.

This application is based on Japanese Patent Application serial no. 2011-004423 filed with Japan Patent Office on Jan. 12, 2011, the entire contents of which are hereby incorporated by reference.

What is claimed is:

1. A semiconductor device comprising:
    an oxide semiconductor layer,
    a gate insulating layer over the oxide semiconductor layer,
    a gate electrode over the oxide semiconductor layer with the gate insulating layer interposed therebetween,
    a first electrode over and in contact with the oxide semiconductor layer,
    an insulating layer over the oxide semiconductor layer, the gate electrode, and the first electrode, and
    a second electrode over and in contact with the first electrode,
    wherein, in a channel width direction, a width of the first electrode is smaller than a width of the oxide semiconductor layer, and a width of the second electrode is smaller than the width of the first electrode.

2. The semiconductor device according to claim 1, wherein an edge of the oxide semiconductor layer protrudes from an edge of the gate insulating layer.

3. The semiconductor device according to claim 1, wherein each edge of the gate insulating layer and the gate electrode is a tapered shape.

4. The semiconductor device according to claim 1, wherein the oxide semiconductor layer is a non-single-crystal layer including a c-axis-aligned crystalline region.

5. The semiconductor device according to claim 1, wherein the oxide semiconductor layer includes a first oxide semiconductor region overlapping with the gate electrode, a pair of second oxide semiconductor regions sandwiching the first oxide semiconductor region, and a pair of third oxide semiconductor regions which overlaps with the second electrode and sandwiches the pair of second oxide semiconductor regions.

6. The semiconductor device according to claim 5,
    wherein the first oxide semiconductor region is a channel region,
    wherein the pair of second oxide semiconductor regions is electric-field relaxation regions, and
    wherein the pair of third oxide semiconductor regions is a source and a drain region.

7. The semiconductor device according to claim 5, wherein the pair of second oxide semiconductor regions includes at least one element selected from nitrogen, phosphorus, and arsenic at a concentration higher than or equal to $5 \times 10^{18}$ atoms/cm$^3$ and lower than or equal to $1 \times 10^{22}$ atoms/cm$^3$.

8. The semiconductor device according to claim 5, wherein the pair of second oxide semiconductor regions includes at least one dopant selected from hydrogen, helium, neon, argon, krypton, and xenon at a concentration higher than or equal to $5 \times 10^{18}$ atoms/cm$^3$ and lower than or equal to $1 \times 10^{22}$ atoms/cm$^3$.

9. The semiconductor device according to claim 1, wherein the oxide semiconductor layer includes at least one element selected from In, Ga, Sn, and Zn.

10. The semiconductor device according to claim 1, further comprising a light-emitting element.

11. A semiconductor device comprising:
    an oxide semiconductor layer,
    a gate insulating layer over the oxide semiconductor layer,
    a gate electrode over the oxide semiconductor layer with the gate insulating layer interposed therebetween, a first electrode over and in contact with the oxide semiconductor layer,
an insulating layer over the oxide semiconductor layer, the gate electrode, and the first electrode, and
a second electrode over and in contact with the first electrode,
wherein a length of the gate insulating layer at a portion in contact with the oxide semiconductor layer is longer than a length of the gate insulating layer at a portion in contact with the gate electrode, and
wherein, in a channel width direction, a width of the first electrode is smaller than a width of the oxide semiconductor layer, and a width of the second electrode is smaller than the width of the first electrode.

12. The semiconductor device according to claim 11, wherein an edge of the oxide semiconductor layer protrudes from an edge of the gate insulating layer.

13. The semiconductor device according to claim 11, wherein each edge of the gate insulating layer and the gate electrode is a tapered shape.

14. The semiconductor device according to claim 11, wherein the oxide semiconductor layer is a non-single-crystal layer including a c-axis-aligned crystalline region.

15. The semiconductor device according to claim 11, wherein the oxide semiconductor layer includes a first oxide semiconductor region overlapping with the gate electrode, a pair of second oxide semiconductor regions sandwiching the first oxide semiconductor region, and a pair of third oxide semiconductor regions which overlaps with the second electrode and sandwiches the pair of second oxide semiconductor regions.

16. The semiconductor device according to claim 15, wherein the first oxide semiconductor region is a channel region,
wherein the pair of second oxide semiconductor regions is electric-field relaxation regions, and
wherein the pair of third oxide semiconductor regions is a source and a drain region.

17. The semiconductor device according to claim 15, wherein the pair of second oxide semiconductor regions includes at least one element selected from nitrogen, phosphorus, and arsenic at a concentration higher than or equal to $5 \times 10^{18}$ atoms/cm$^3$ and lower than or equal to $1 \times 10^{22}$ atoms/cm$^3$.

18. The semiconductor device according to claim 15, wherein the pair of second oxide semiconductor regions includes at least one dopant selected from hydrogen, helium, neon, argon, krypton, and xenon at a concentration higher than or equal to $5 \times 10^{18}$ atoms/cm$^3$ and lower than or equal to $1 \times 10^{22}$ atoms/cm$^3$.

19. The semiconductor device according to claim 11, wherein the oxide semiconductor layer includes at least one element selected from In, Ga, Sn, and Zn.

20. The semiconductor device according to claim 11, further comprising a light-emitting element.

* * * * *